US008471465B2

(12) United States Patent
Suzuki et al.

(10) Patent No.: US 8,471,465 B2
(45) Date of Patent: Jun. 25, 2013

(54) LIGHT-EMITTING ELEMENT, LIGHT-EMITTING DEVICE, AND ELECTRONIC DEVICE

(75) Inventors: Tsunenori Suzuki, Kanagawa (JP); Satoshi Seo, Kanagawa (JP); Ryoji Nomura, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/438,517

(22) Filed: Apr. 3, 2012

(65) Prior Publication Data

US 2012/0217489 A1    Aug. 30, 2012

Related U.S. Application Data

(63) Continuation of application No. 12/612,779, filed on Nov. 5, 2009, which is a continuation of application No. 11/821,522, filed on Jun. 22, 2007, now Pat. No. 7,615,925.

(30) Foreign Application Priority Data

| Jul. 4, 2006 | (JP) | 2006-184653 |
| Dec. 4, 2006 | (JP) | 2006-327610 |
| Mar. 20, 2007 | (JP) | 2007-073089 |

(51) Int. Cl.
*H01L 51/50* (2006.01)

(52) U.S. Cl.
USPC .......................... 313/506; 313/504

(58) Field of Classification Search
USPC ................... 313/498–512
See application file for complete search history.

(56) References Cited

U.S. PATENT DOCUMENTS

| 5,601,903 A | 2/1997 | Fujii et al. |
| 5,922,481 A | 7/1999 | Etzbach et al. |
| 6,090,434 A | 7/2000 | Sugiura et al. |
| 6,224,966 B1 | 5/2001 | Sakai et al. |
| 6,387,546 B1 | 5/2002 | Hamada et al. |

(Continued)

FOREIGN PATENT DOCUMENTS

| CN | 1168217 A | 2/1997 |
| CN | 1370034 A | 9/2002 |

(Continued)

OTHER PUBLICATIONS

Office Action re Chinese application No. 201110191678.9, dated May 4, 2012 (with English translation).

(Continued)

*Primary Examiner* — Anne Hines
(74) *Attorney, Agent, or Firm* — Husch Blackwell LLP

(57) ABSTRACT

The light-emitting element includes: a light-emitting layer and a layer for controlling the movement of carriers between a first electrode and a second electrode. The layer for controlling the movement of carriers contains a first organic compound and a second organic compound, and is provided between the light-emitting layer and the second electrode. The first organic compound has an electron transporting property, and the second organic compound has an electron trapping property. The weight percent of the first organic compound is higher than that of the second organic compound. The light-emitting layer emits light when a voltage is applied such that the potential of the first electrode is higher than that of the second electrode.

20 Claims, 47 Drawing Sheets

U.S. PATENT DOCUMENTS

| | | | |
|---|---|---|---|
| 6,447,934 | B1 | 9/2002 | Suzuki et al. |
| 6,504,300 | B2 | 1/2003 | Kawamura et al. |
| 6,670,052 | B2 | 12/2003 | Hirose et al. |
| 6,833,201 | B2 | 12/2004 | Czerw et al. |
| 7,196,360 | B2 | 3/2007 | Seo et al. |
| 7,456,425 | B2 | 11/2008 | Seo et al. |
| 7,474,049 | B2 | 1/2009 | Liu et al. |
| 7,615,925 | B2 * | 11/2009 | Suzuki et al. ............... 313/506 |
| 7,622,200 | B2 | 11/2009 | Ohsawa et al. |
| 7,875,879 | B2 * | 1/2011 | Suzuki et al. ............... 257/40 |
| 7,902,742 | B2 * | 3/2011 | Suzuki et al. ............... 313/504 |
| 8,080,934 | B2 | 12/2011 | Kido et al. |
| 2003/0189401 | A1 | 10/2003 | Kido et al. |
| 2004/0150328 | A1 | 8/2004 | Czerw et al. |
| 2004/0241491 | A1 | 12/2004 | Hatwar |
| 2005/0093433 | A1 | 5/2005 | Ko |
| 2005/0100760 | A1 | 5/2005 | Yokoyama |
| 2005/0194892 | A1 | 9/2005 | Lu |
| 2006/0011908 | A1 | 1/2006 | Ohsawa et al. |
| 2006/0029828 | A1 | 2/2006 | Kanno et al. |
| 2006/0043859 | A1 | 3/2006 | Fukuoka et al. |
| 2006/0051615 | A1 | 3/2006 | Kanno et al. |
| 2006/0158102 | A1 | 7/2006 | Kawamura et al. |
| 2006/0199460 | A1 | 9/2006 | Ko |
| 2006/0267487 | A1 | 11/2006 | Ozaki et al. |
| 2007/0172699 | A1 | 7/2007 | Nakashima et al. |
| 2008/0006821 | A1 | 1/2008 | Suzuki et al. |
| 2008/0007164 | A1 * | 1/2008 | Suzuki et al. ............... 313/504 |
| 2008/0122350 | A1 | 5/2008 | Sakata et al. |
| 2008/0142794 | A1 | 6/2008 | Shitagaki et al. |
| 2008/0231177 | A1 | 9/2008 | Nomura et al. |
| 2008/0284318 | A1 | 11/2008 | Deaton et al. |
| 2009/0072725 | A1 | 3/2009 | Suzuki et al. |
| 2009/0079326 | A1 | 3/2009 | Seo et al. |
| 2009/0079337 | A1 | 3/2009 | Seo et al. |
| 2009/0102368 | A1 | 4/2009 | Shitagaki et al. |
| 2009/0140643 | A1 | 6/2009 | Ohsawa et al. |
| 2009/0167168 | A1 | 7/2009 | Seo et al. |
| 2009/0200918 | A1 | 8/2009 | Seo et al. |
| 2009/0206331 | A1 | 8/2009 | Seo et al. |
| 2009/0283757 | A1 | 11/2009 | Seo et al. |
| 2010/0078631 | A1 | 4/2010 | Pieh |
| 2010/0213457 | A1 | 8/2010 | Shitagaki et al. |
| 2011/0133172 | A1 | 6/2011 | Suzuki et al. |

FOREIGN PATENT DOCUMENTS

| | | |
|---|---|---|
| CN | 1447629 A | 10/2003 |
| CN | 1700829 A | 11/2005 |
| EP | 0 866 645 A1 | 9/1998 |
| EP | 1 351 558 A1 | 10/2003 |
| EP | 1 565 041 A1 | 8/2005 |
| JP | 7-65958 | 3/1995 |
| JP | 2000-68057 | 3/2000 |
| JP | 2004-79413 | 3/2004 |
| JP | 2004-221045 | 8/2004 |
| JP | 2004-273163 | 9/2004 |
| JP | 2005-38763 | 2/2005 |
| JP | 2006-66890 | 3/2006 |
| JP | 2006-156888 | 6/2006 |
| WO | WO 2004/047499 A1 | 6/2004 |
| WO | WO 2006/059512 A1 | 6/2006 |
| WO | WO 2006/059736 A1 | 6/2006 |

OTHER PUBLICATIONS

Lee, M.-T. et al., "Highly Efficient, Deep-Blue Doped Organic Light-Emitting Devices," Advanced Materials, vol. 17, 2005, pp. 2493-2497.

Cina, S. et al, "P-135: Efficient Electron Injection from PEDOT-PSS into a Graded-n-Doped Electron Transporting Layer in an Inverted OLED Structure," SID 05 Digest: SID International Symposium Digest of Technical Papers, vol. 36, 2005, pp. 819-821.

Lee, M.-T. et al, "Improved Stability of Organic Electroluminescent Devices by Doping Styrylamines in Hole or Electron Transporting Layer," Applied Physics Letters, vol. 86, No. 10, 2005, pp. 103501-1-103501-3.

Ho, C.-L. et al., "A Multifunctional Iridium-Carbazolyl Orange Phosphor for High-Performance Two-Element WOLED Exploiting Exciton-Managed Fluorescence/Phosphorescence," Advanced Functional Materials, vol. 18, 2008, pp. 928-937.

Office Action re European Application No. EP 10010088.2, dated Aug. 2, 2012.

Tsutsui, T. et al., "High Quantum Efficiency in Organic Light-Emitting Devices with Iridium-Complex as a Triplet Emissive Center", Jpn. J. Appl. Phys., vol. 38, Part 2, No. 12B, Dec. 15, 1999, pp. L1502-L1504.

Goldsmith, C.R. et al., "C-H Bond Activation by a Ferric Methoxide Complex: Modeling the Rate-Determining Step in the Mechanism of Lipoxygenase", J. Am. Chem Soc., vol. 124, No. 1, 2002, pp. 83-96.

Onishi.T et al, High Molecular EL Materials—Development of Light-Emitting High Molecular Compounds, "A Method of Measuring an Energy Level," Kyoritsu Shuppan, Dec. 25, 2004, pp. 64-67 (with English translation, pp. 1-3).

Kajii, H. et al, "Study of Transient Electroluminescence Process Using Organic Light-Emitting Diode with Partial Doping Layer," Japanese Journal of Applied Physics, vol. 45, No. 4B, 2006, pp. 3721-3724.

Office Action re Chinese application No. 200710127178.2, dated Mar. 23, 2010 (with English translation).

* cited by examiner

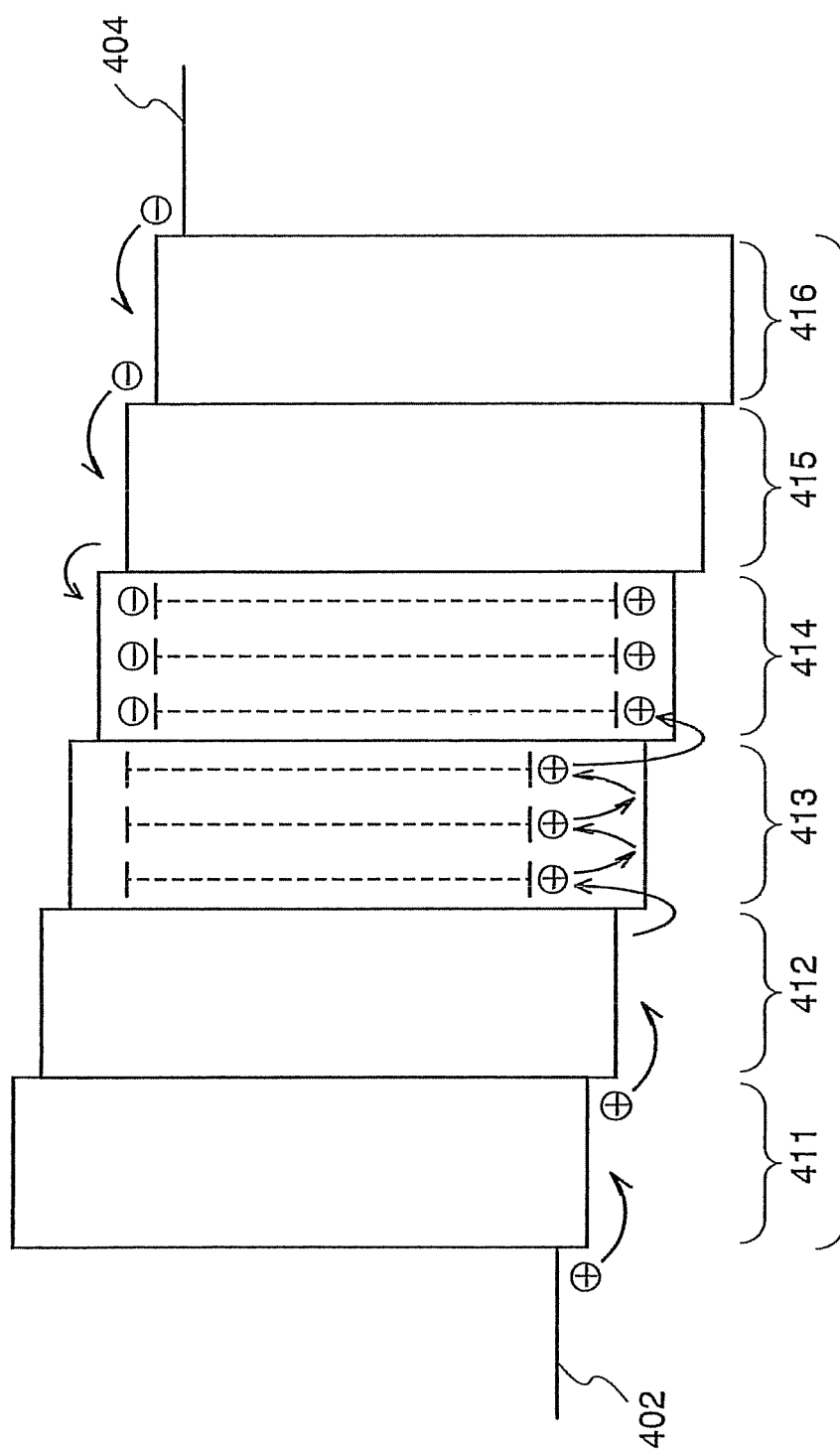

LIGHT-EMITTING ELEMENT, LIGHT-EMITTING DEVICE, AND ELECTRONIC DEVICE

This application claims priority under 35 USC 120 and is a continuation of copending application Ser. No. 12/612,779 filed on Nov. 5, 2009 which is a continuation of application Ser. No. 11/821,522 filed on Jun. 22, 2007 (now U.S. Pat. No. 7,615,925 issued Nov. 10, 2009).

BACKGROUND OF THE INVENTION

1. Field of the Invention

The present invention relates to current-excitation light-emitting elements, and also relates to light-emitting devices and electronic devices having such light-emitting elements.

2. Description of the Related Art

In recent years, a light-emitting element utilizing electroluminescence has actively been researched and developed. The basic structure of the light-emitting element is such that a light-emissive compound is sandwiched between a pair of electrodes. By applying a voltage to such an element, light emission can be obtained from the light-emissive compound.

Such a light-emitting element which is a self-luminous type has an advantage in that it has higher visibility of pixels than liquid crystal displays, and there is no need to use a backlight. Thus, such a light-emitting element is considered to be suitable for a flat panel display element. Besides, such a light-emitting element has advantages in that it can be formed to be thin and lightweight, and has quite fast response speed.

Furthermore, since such a light-emitting element can be formed in a film form, planar light emission can be easily obtained by forming a large-area element. This cannot be easily achieved with a point light source typified by an incandescent lamp or an LED, or with a line light source typified by a fluorescent lamp. Therefore, the light-emitting element has a high utility value as a plane light source that can be applied to lighting or the like.

The light-emitting elements using electroluminescence can be roughly classified into light-emitting elements whose light-emissive compound is an organic compound and light-emitting elements whose light-emissive compound is an inorganic compound. The invention relates to the former light-emitting elements whose light-emissive compound is an organic compound. In this case, when a voltage is applied to the light-emitting element, electrons and holes are injected from a pair of electrodes into a layer containing a light-emissive organic compound, whereby a current flows thereto. Then, the carriers (electrons and holes) are recombined and the light-emissive organic compound comes to an excited state. When the organic compound returns from the excited state to the ground state, light emission is obtained.

Because of such a mechanism, the light-emitting element is called a current-excitation light-emitting element. As the types of the excited states obtained by an organic compound, there are a singlet excited state and a triplet excited state. Light emission from the singlet excited state is referred to as fluorescence, and light emission from the triplet excited state is referred to as phosphorescence.

Such a light emitting element has many material-dependent problems for improvement of the element characteristics, and in order to overcome the problems, improvement in element structure, development of materials, and the like have been conducted. For example, in Reference 1 (Tetsuo TSUTSUI, and eight others, Japanese Journal of Applied Physics, Vol. 38, L1502-L1504 (1999)), the luminous efficiency of a light-emitting element using a phosphorescent material is improved by providing a hole blocking layer.

However, since the hole blocking layer disclosed in Reference 1 is not durable, the light-emitting element has a short lifetime. Therefore, improvement in lifetime of the light-emitting element is desired. In view of the foregoing, it is an object of the invention to provide a light-emitting element having a long lifetime. It is another object of the invention to provide a light-emitting device and an electronic device having a long lifetime.

SUMMARY OF THE INVENTION

As a result of diligent study, the inventors found that changes in carrier balance over time can be suppressed by providing a layer for controlling the movement of carriers, i.e., a layer for controlling the movement of electrons or holes. The inventors also found that a long-lifetime light-emitting element can be obtained by the provision of such a layer.

Thus, one aspect of a light-emitting element of the invention includes: a first electrode, a second electrode, a light-emitting layer, and a layer for controlling the movement of carriers. The light-emitting layer and the layer for controlling the movement of carriers are sandwiched between the first electrode and the second electrode, the layer for controlling the movement of carriers contains a first organic compound and a second organic compound, the layer for controlling the movement of carriers is provided between the light-emitting layer and the second electrode, the first organic compound is an organic compound having an electron transporting property, the second organic compound is an organic compound having an electron trapping property, the weight percent of the first organic compound is higher than the weight percent of the second organic compound in the layer for controlling the movement of carriers, and the light-emitting layer emits light when a voltage is applied such that the potential of the first electrode is higher than the potential of the second electrode.

In the above structure, the lowest unoccupied molecular orbital level of the second organic compound is preferably lower than the lowest unoccupied molecular orbital level of the first organic compound by 0.3 eV or more. Further, the light-emitting layer preferably has an electron transporting property. For example, it is preferable that the light-emitting layer contain a third organic compound and a fourth organic compound, the weight percent of the third organic compound be higher than the weight percent of the fourth organic compound, and the third organic compound have an electron transporting property. In addition, the first organic compound and the third organic compound are preferably different organic compounds. In the above structure, the first organic compound is preferably a metal complex. In addition, the second organic compound is preferably contained in the layer for controlling the movement of carriers in the range of 0.1 wt % to 5 wt % or in the range of 0.1 mol % to 5 mol %. In addition, in the above structure, the second organic compound is preferably coumarin derivatives.

One aspect of a light-emitting element of the invention includes: a first electrode, a second electrode, a light-emitting layer, and a layer for controlling the movement of carriers. The light-emitting layer and the layer for controlling the movement of carriers are sandwiched between the first electrode and the second electrode, the layer for controlling the movement of carriers contains a first organic compound and a second organic compound, the layer for controlling the movement of carriers is provided between the light-emitting layer and the first electrode, the first organic compound is an organic compound having a hole transporting property, the second organic compound is an organic compound having a hole trapping property, the weight percent of the first organic compound is higher than the weight percent of the second organic compound in the layer for controlling the movement of carriers, and the light-emitting layer emits light when a voltage is applied such that the potential of the first electrode is higher than the potential of the second electrode.

In the above structure, the highest unoccupied molecular orbital level of the second organic compound is preferably higher than the highest unoccupied molecular orbital level of the first organic compound by 0.3 eV or more. Further, the light-emitting layer preferably has a hole transporting property. For example, it is preferable that the light-emitting layer contain a third organic compound and a fourth organic compound, the weight percent of the third organic compound be higher than the weight percent of the fourth organic compound, and the third organic compound have a hole transporting property. In addition, the first organic compound and the third organic compound are preferably different organic compounds. The second compound is preferably contained in the layer for controlling the movement of carriers in the range of 0.1 wt % to 5 wt % or in the range of 0.1 mol % to 5 mol %. Accordingly, the amount of trapped carriers can be controlled appropriately. Further, in the above structure, the first organic compound is preferably an aromatic amine compound.

In the above structure, the thickness of the layer for controlling the movement of carriers is preferably in the range of 5 to 20 nm. That is, the thickness of the layer for controlling the movement of carriers is preferably in the range of 5 to 20 nm regardless of whether the first organic compound having a carrier transporting property has an electron transporting property or a hole transporting property or regardless of whether the compound having a carrier trapping property has an electron trapping property or a hole trapping property. In any case, the layer for controlling the movement of carriers is preferably provided to be in contact with the light-emitting layer.

In addition, the invention includes a light-emitting device which includes the above-described light-emitting element. The light-emitting device in this specification includes all of image display devices, light-emitting devices, and light sources (including lighting devices). In addition, the invention also includes a module in which a connector such as an FPC (Flexible Printed Circuit), TAB (Tape Automated Bonding) tape, or a TCP (Tape Carrier Package) is attached to a panel on which light-emitting elements are formed, a module in which a printed wiring board is connected to a tip of the TAB tape or TCP, and a module in which an IC (Integrated Circuit) is directly mounted on the light-emitting elements by a COG (Chip On Glass) method.

Further, the invention also includes an electronic device having a display portion which includes the light-emitting element of the invention. Therefore, an electronic device of the invention includes a display portion which includes the above-described light-emitting element and a controller for controlling the emission of the light-emitting element.

As described above, in the invention, a layer for controlling the movement of carriers is formed by combining a first organic compound having a carrier transporting property (i.e., an electron transporting property or a hole transporting property) and a second organic compound having a carrier trapping property (i.e., an electron trapping property or a hole trapping property). The carrier trapping property as referred to in this specification is not an absolute property, but is a relative property with respect to the carrier transporting property. That is, the carrier trapping property has a function of reducing the carrier transporting property of the first organic compound which is used in the layer for controlling the movement of carriers within a predetermined range.

For determination of the properties, when the first organic compound has an electron trapping property, the lowest unoccupied molecular orbital level may be used for reference, whereas when the first organic compound has a hole transporting property, the highest unoccupied molecular orbital level may be used for reference. For example, when the first organic compound has an electron transporting property, it is preferable that the lowest unoccupied molecular orbital level of the second organic compound which has an electron trapping property be lower than that of the first organic compound by 0.3 eV or more. Meanwhile, when the first organic compound has a hole transporting property, it is preferable that the highest unoccupied molecular orbital level of the second organic compound which has a hole trapping property be higher than that of the first organic compound by 0.3 eV or more.

The light-emitting element of the invention has a layer for controlling the movement of carriers, whereby changes in carrier balance over time can be suppressed. Therefore, a long-lifetime light-emitting element can be obtained. Further, when the light-emitting element of the invention is applied to a light-emitting device and an electronic device, it is possible to provide a light-emitting device and an electronic device having high luminous efficiency and reduced power consumption. In addition, a light-emitting device and electronic device having a long lifetime can be obtained.

BRIEF DESCRIPTION OF ME DRAWINGS

In the accompanying drawings:

FIG. 8 illustrates an example of a band diagram of the light-emitting element of the invention shown in FIG. 5A;

Figure 26:
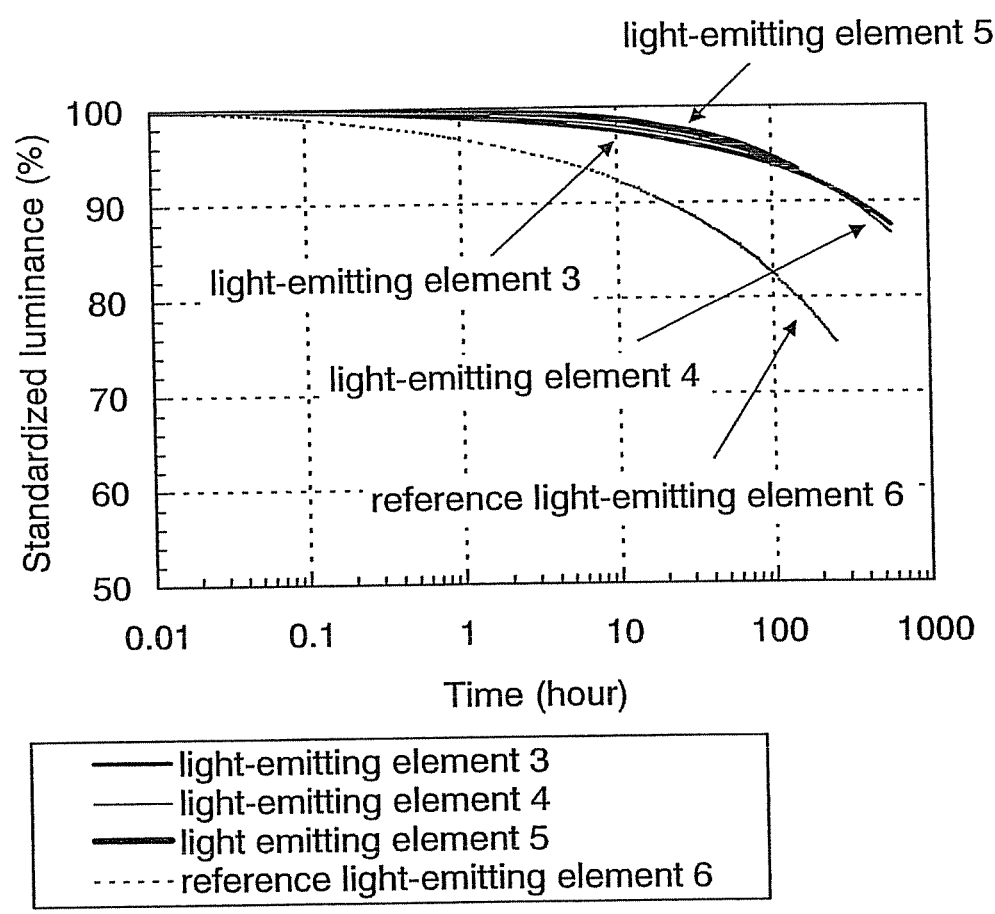
Figure 27:
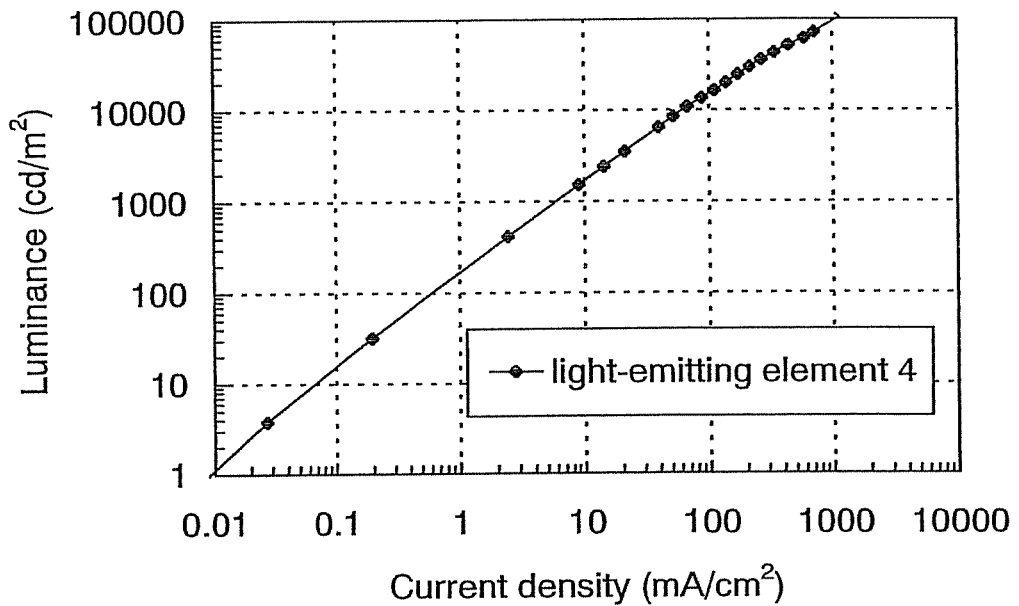
Figure 28:
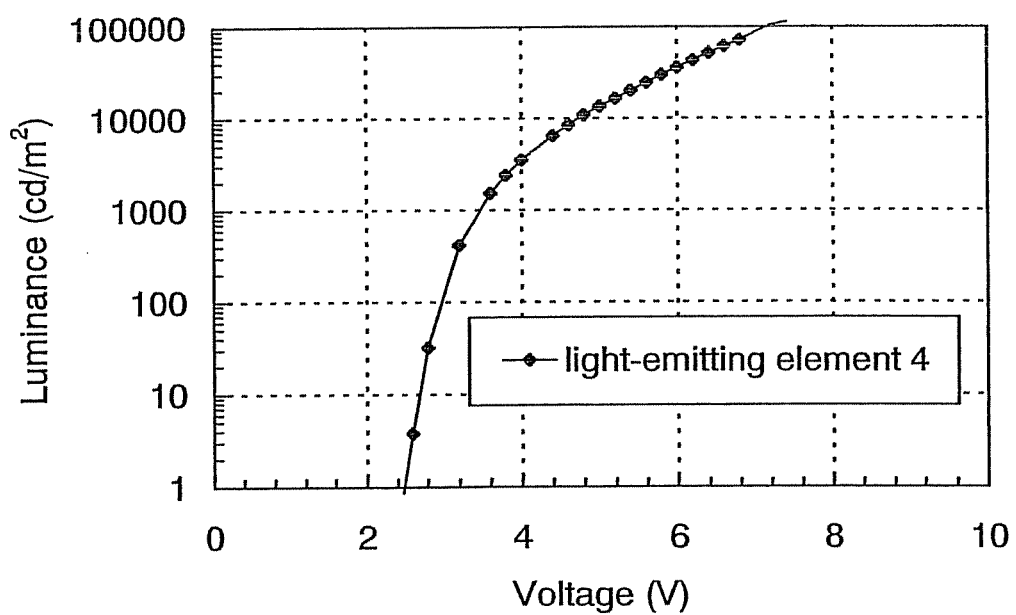
Figure 29:
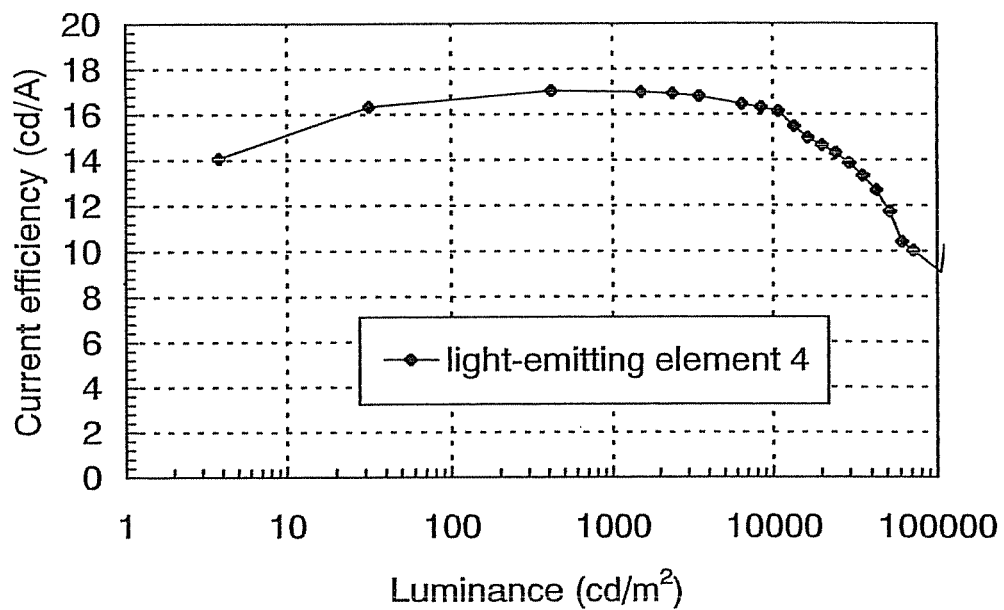
Figure 30:
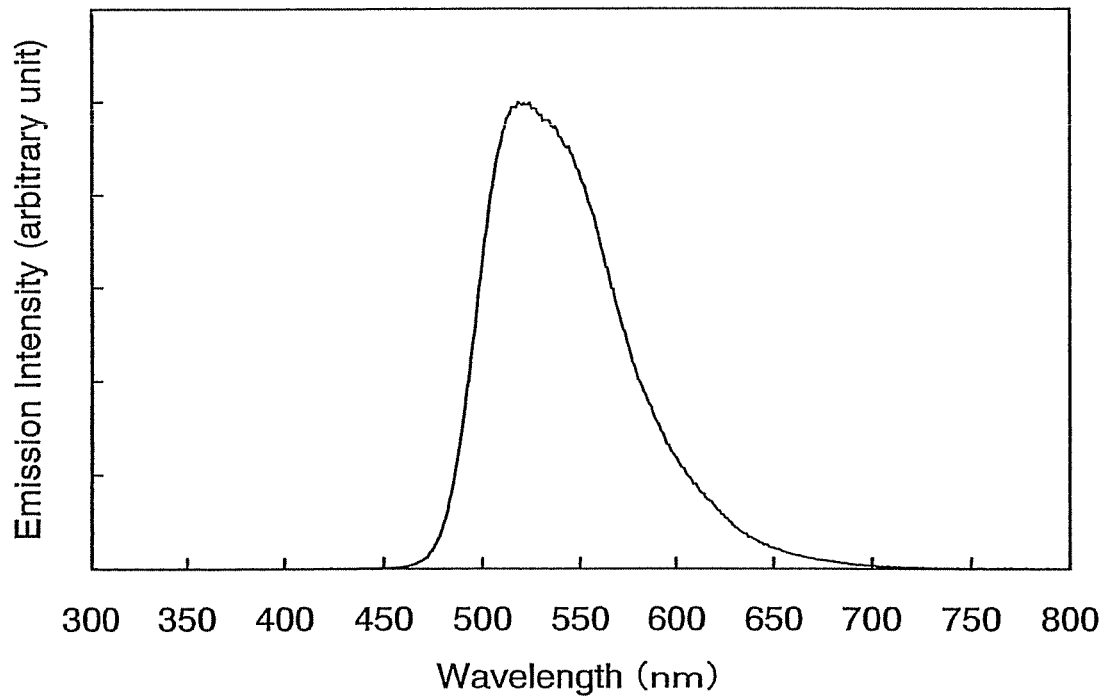
Figure 31:
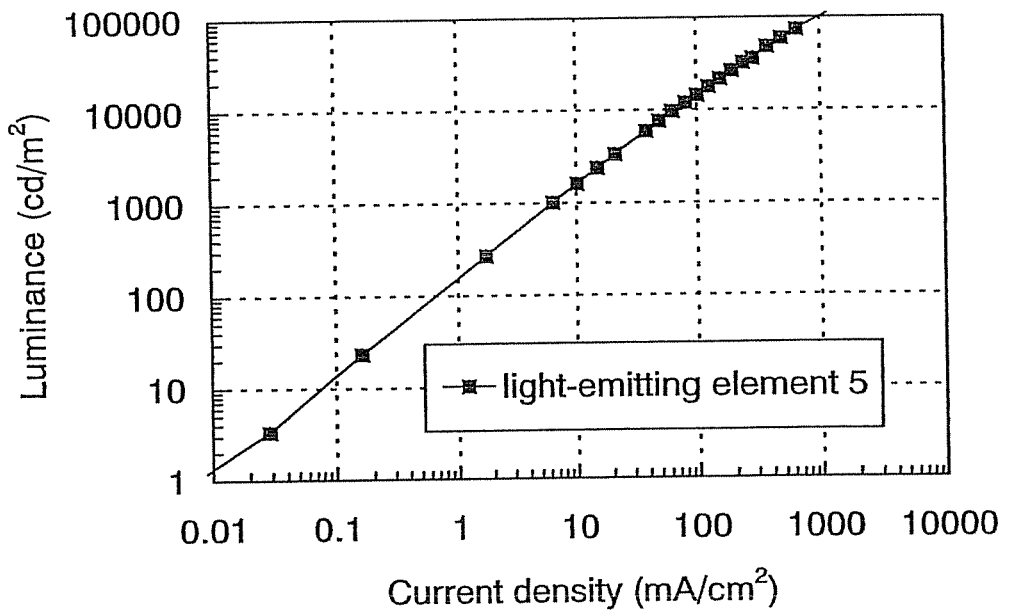
Figure 32:
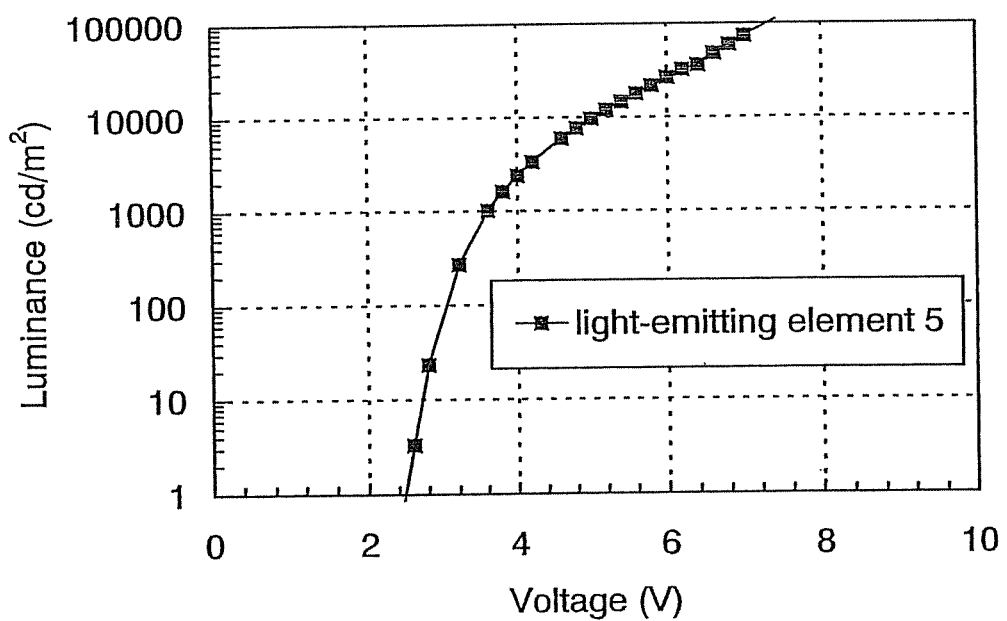
Figure 33:
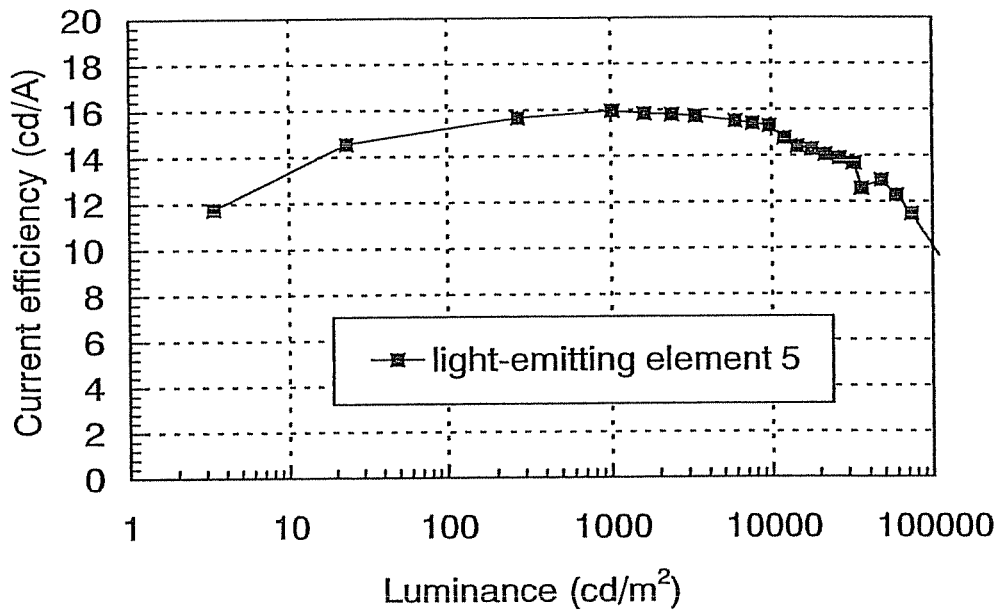
Figure 34:
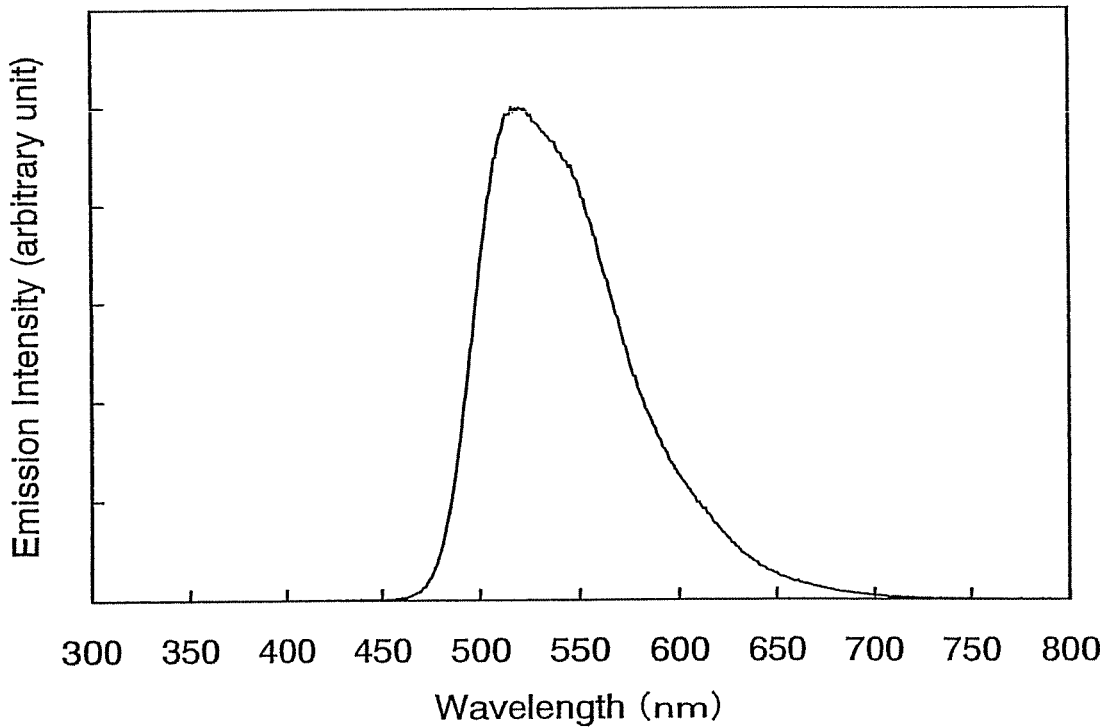
Figure 35:
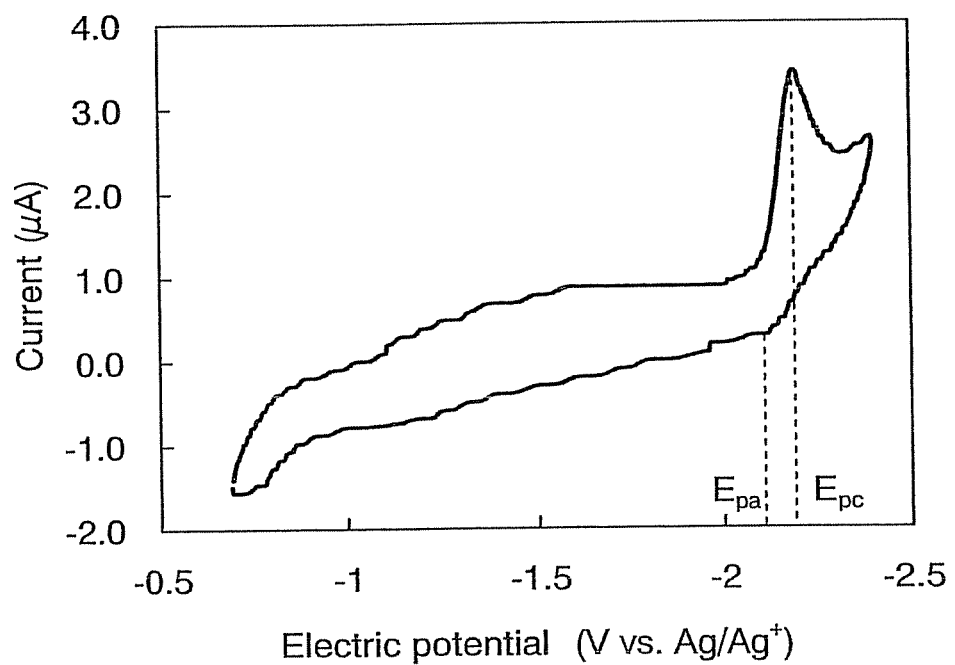
Figure 36:
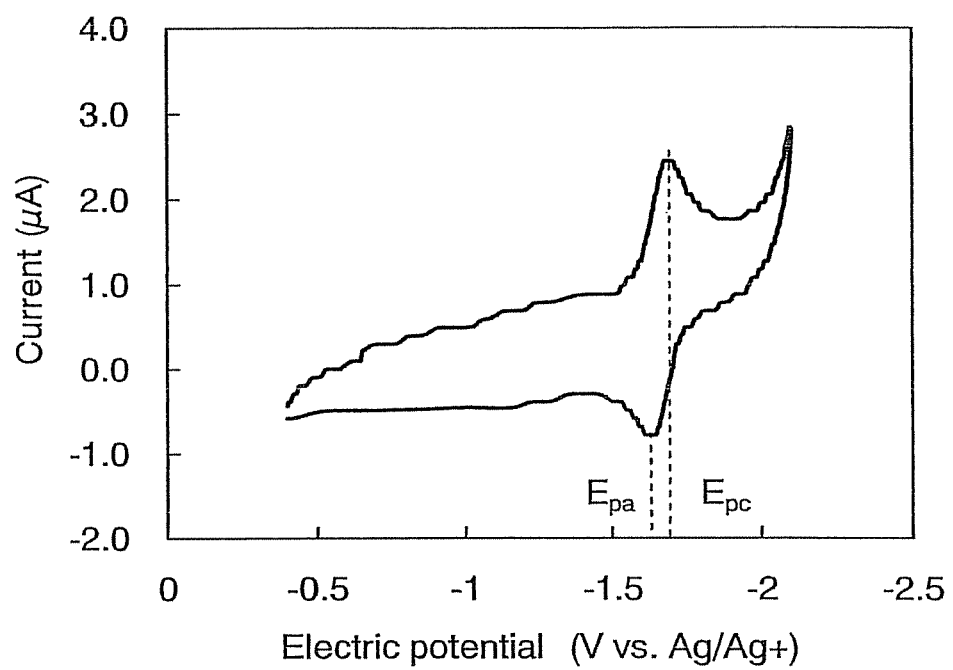
Figure 37:
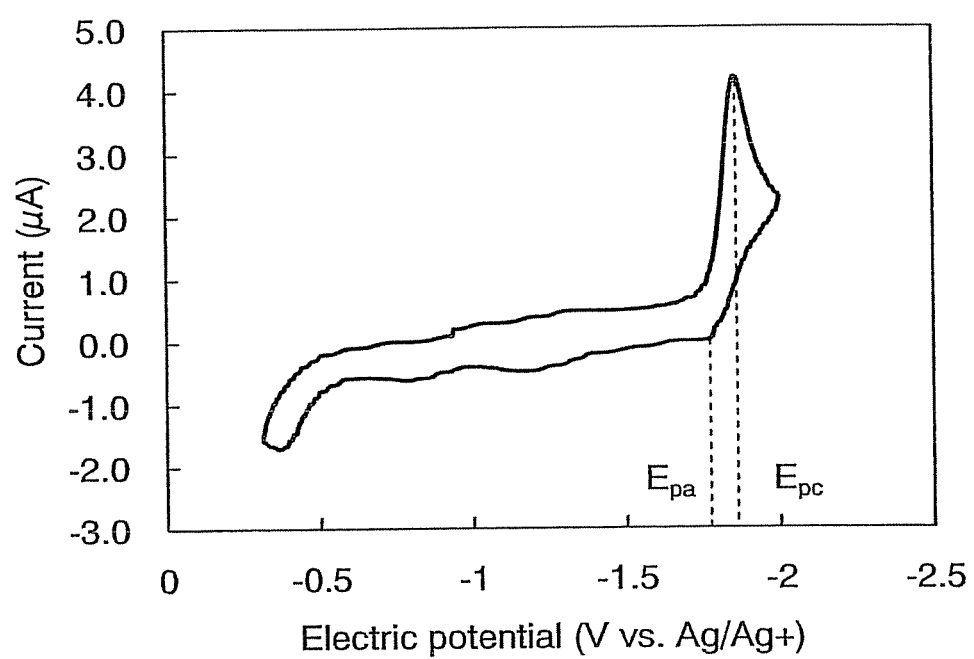
Figure 38:
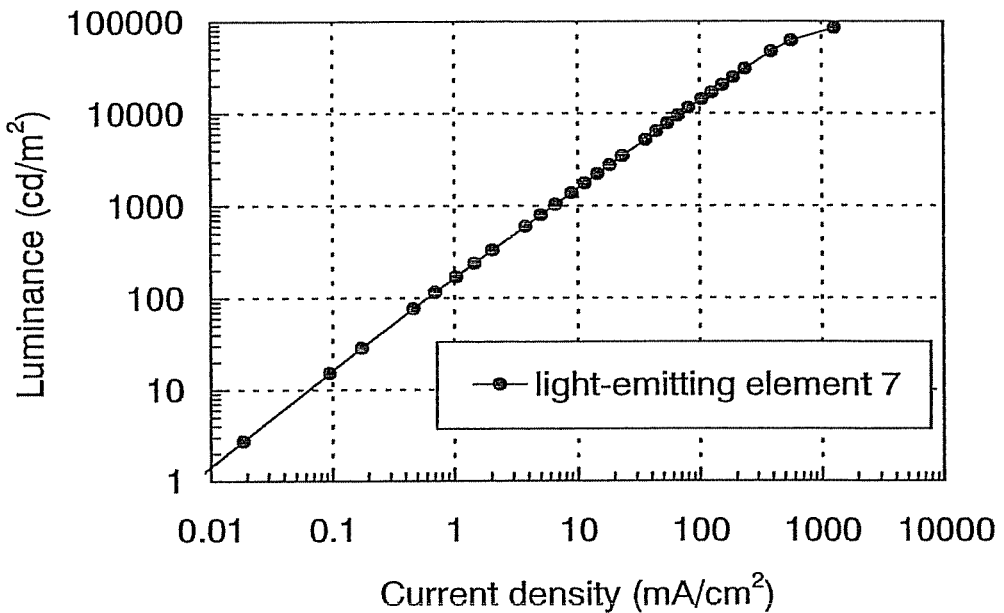
Figure 39:
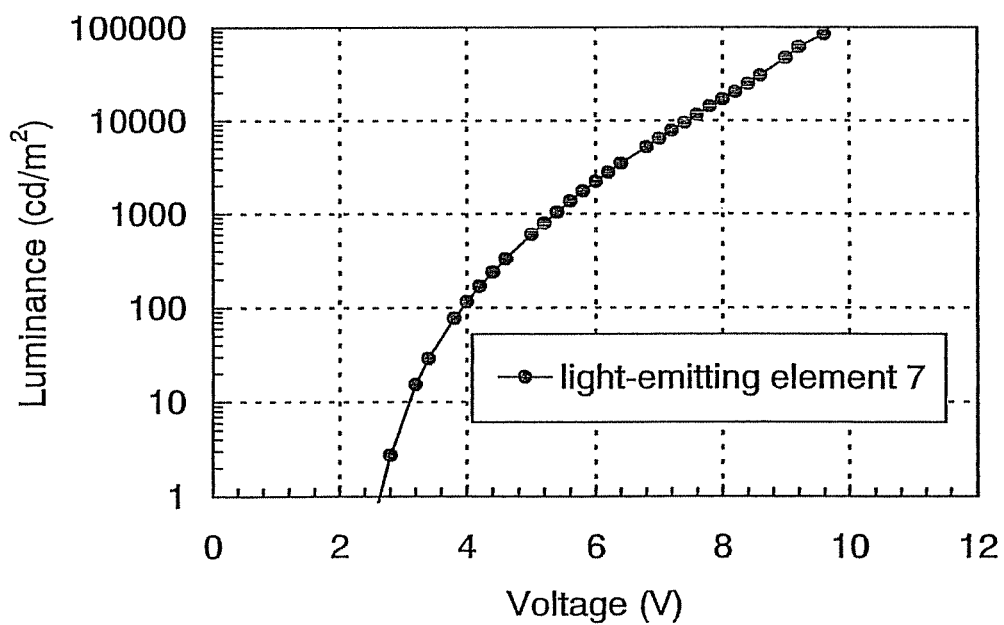
Figure 40:
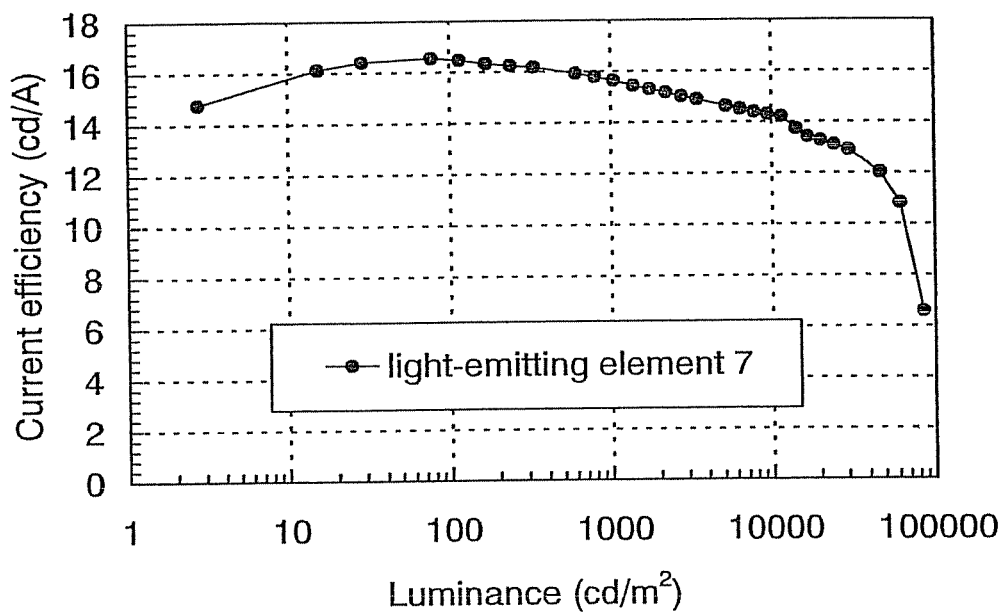
Figure 41:
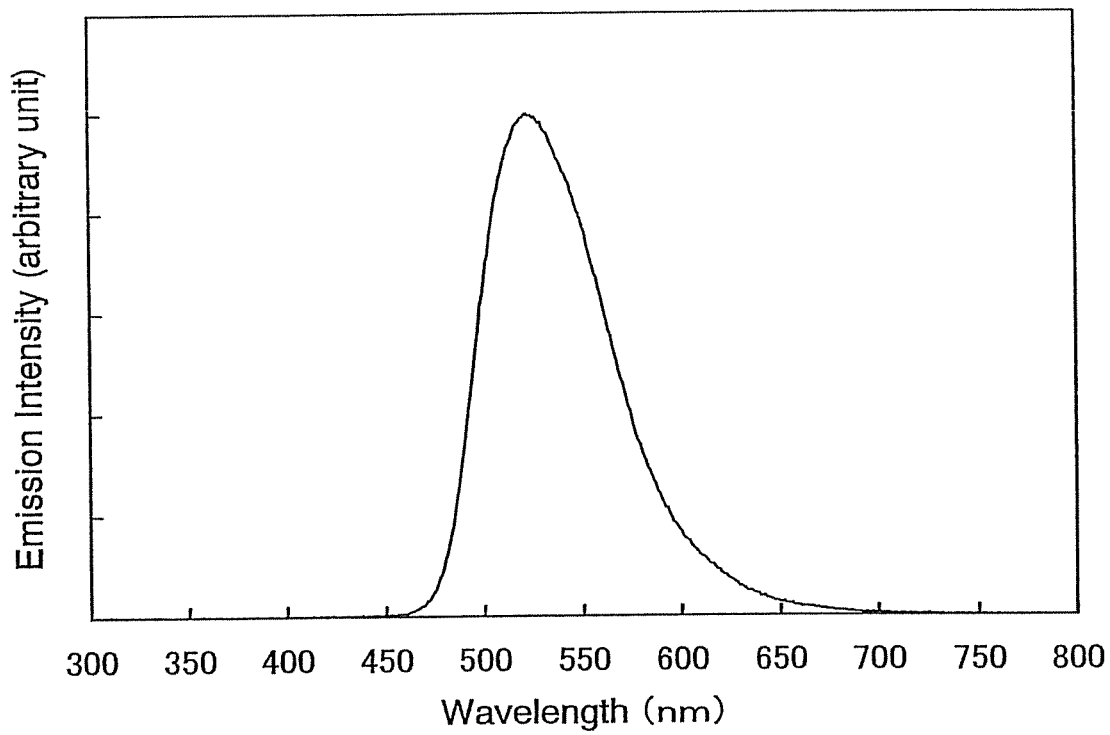
Figure 42:
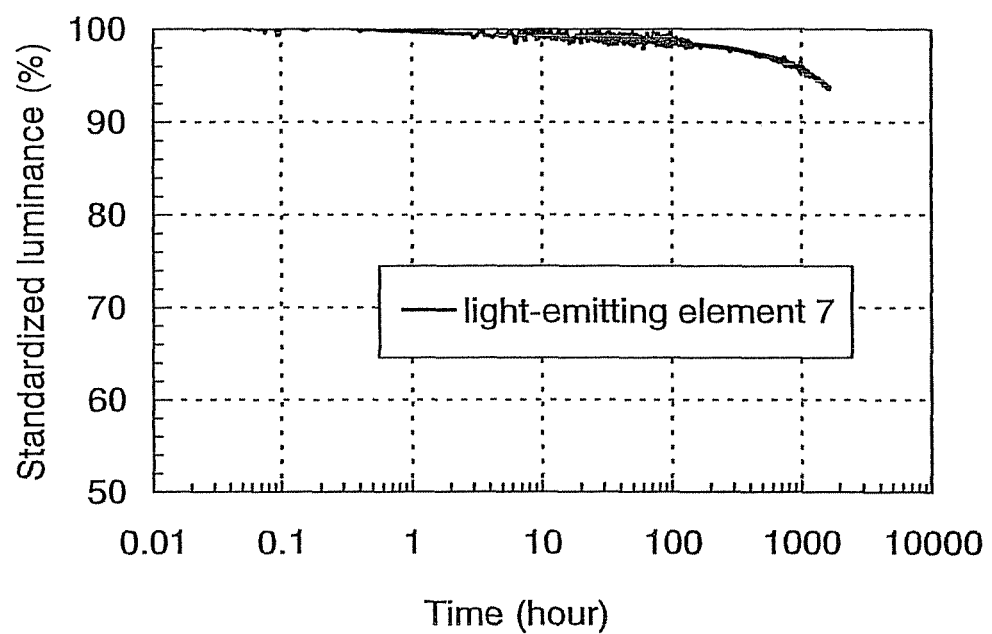
Figure 43:
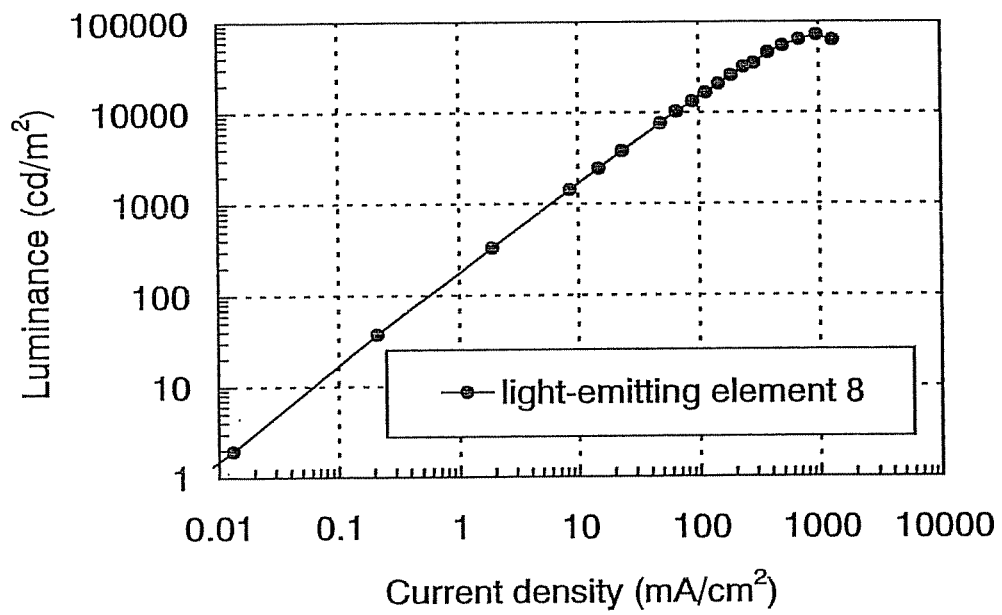
Figure 44:
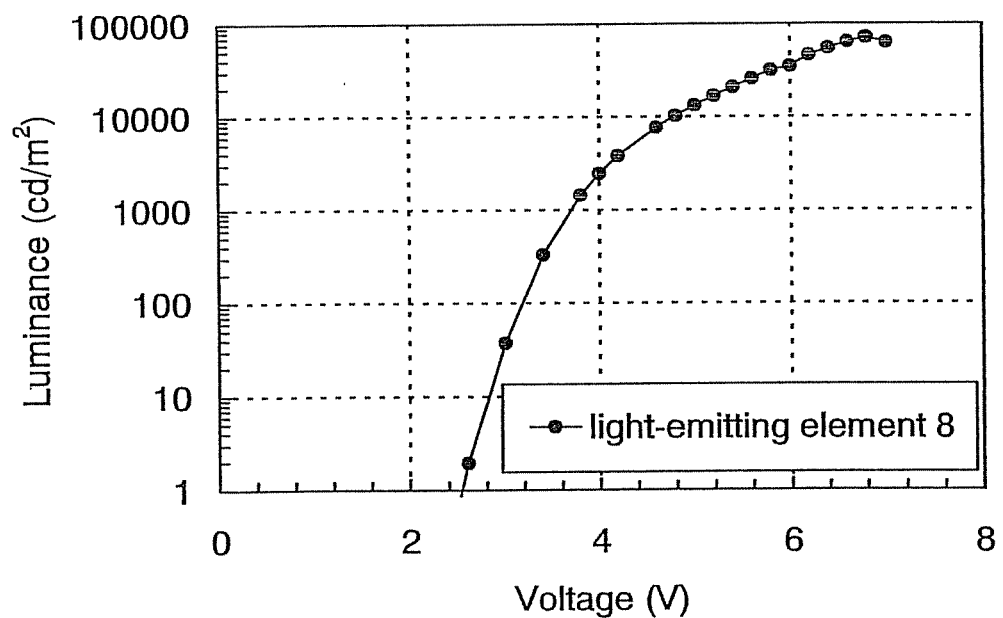
Figure 45:
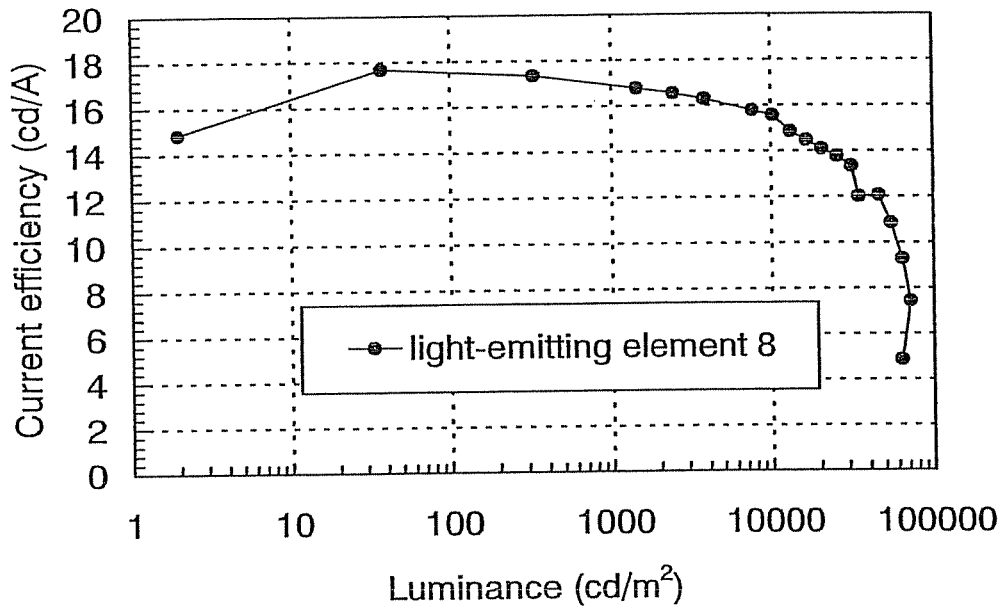
Figure 46:
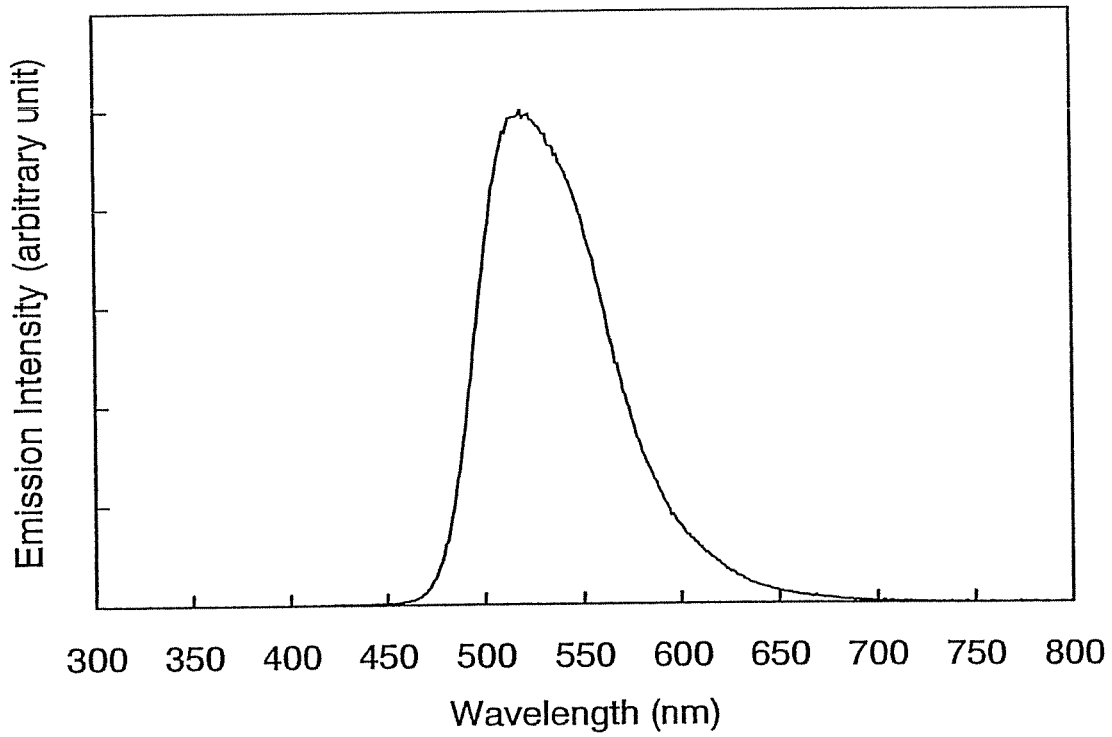
Figure 47:
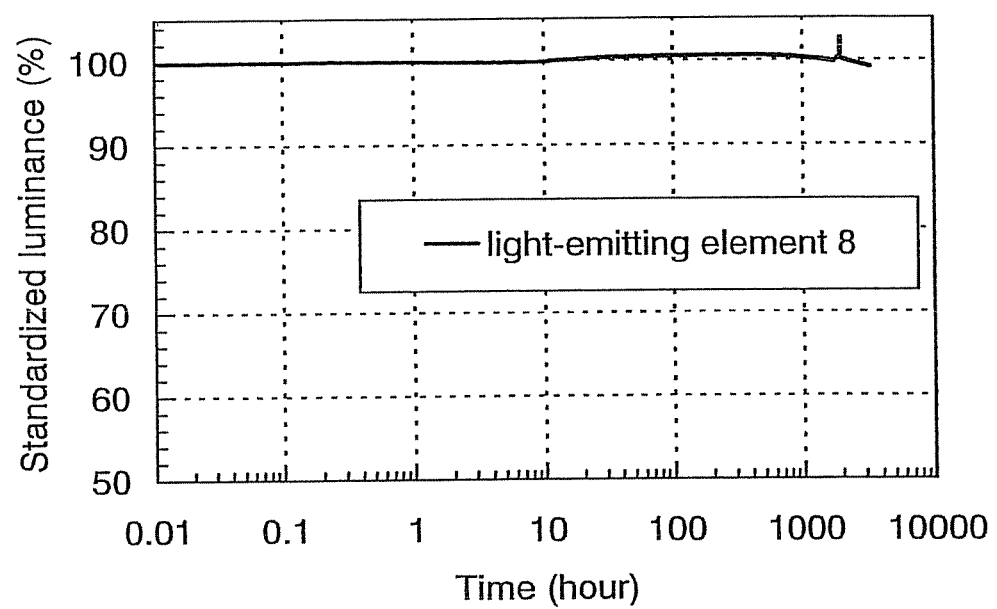
Figure 48:
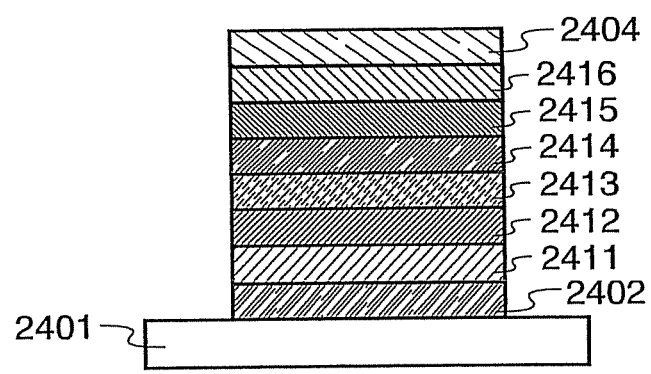
Figure 49:
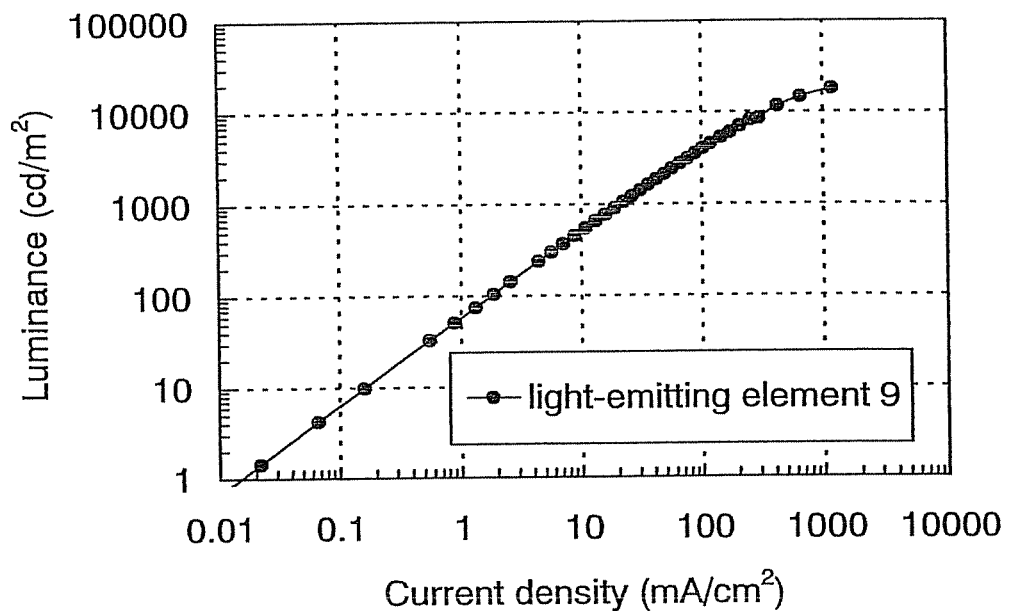
Figure 50:
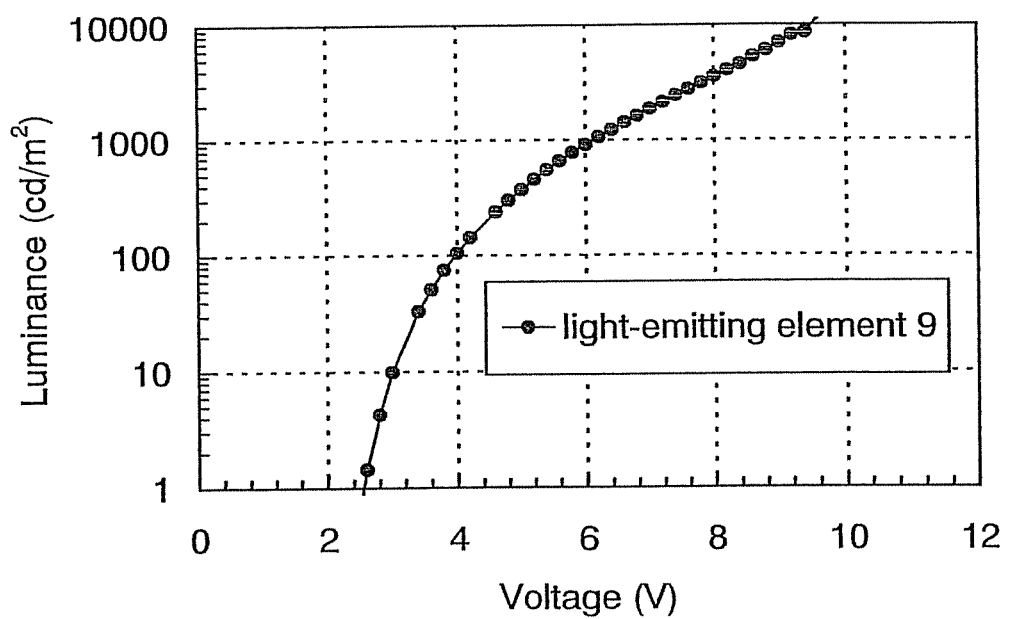
Figure 51:
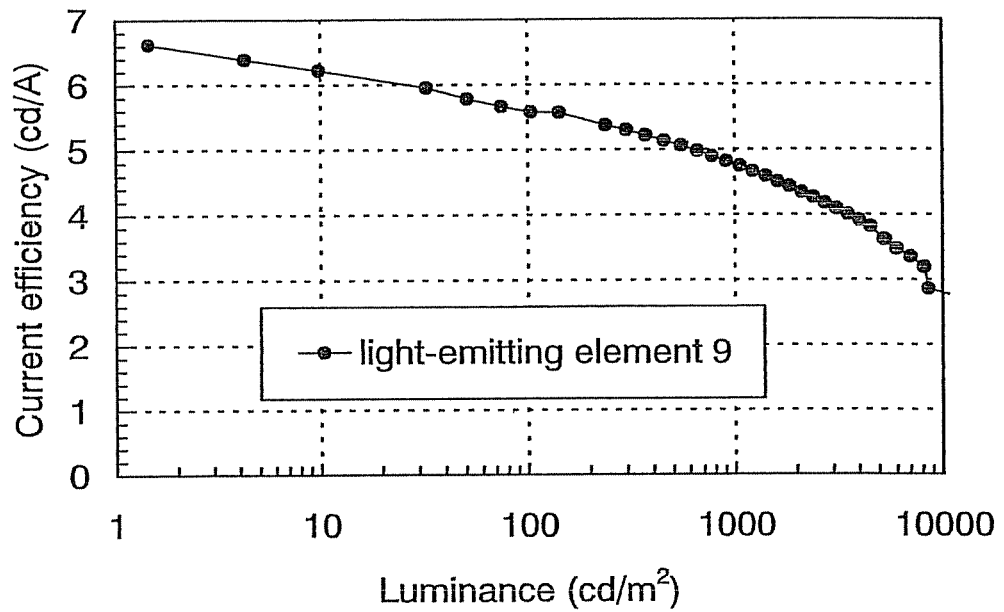
Figure 52:
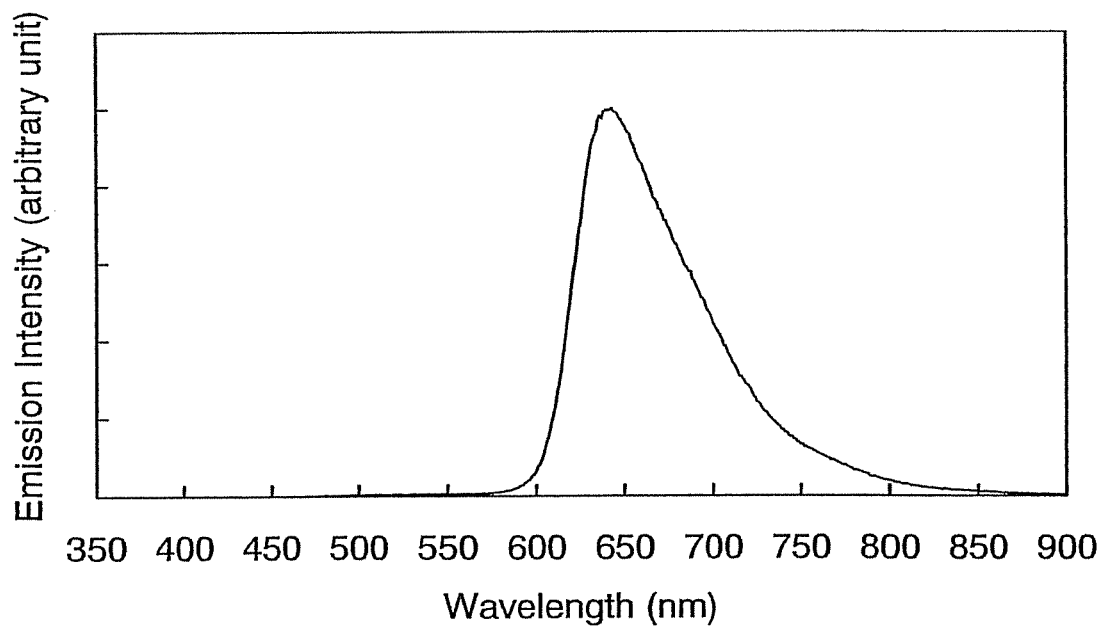
Figure 53:
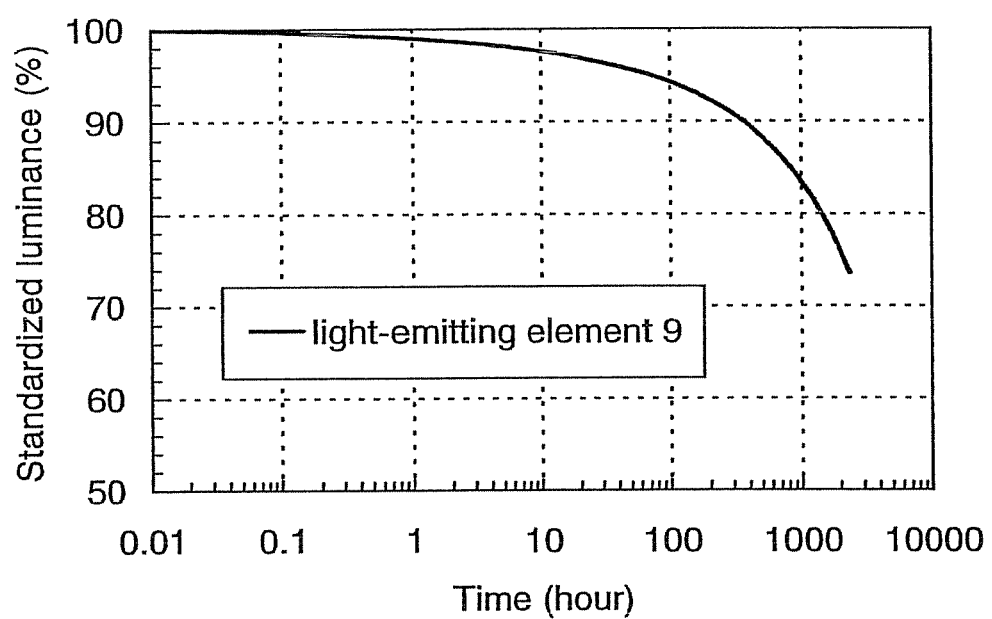
Figure 54:
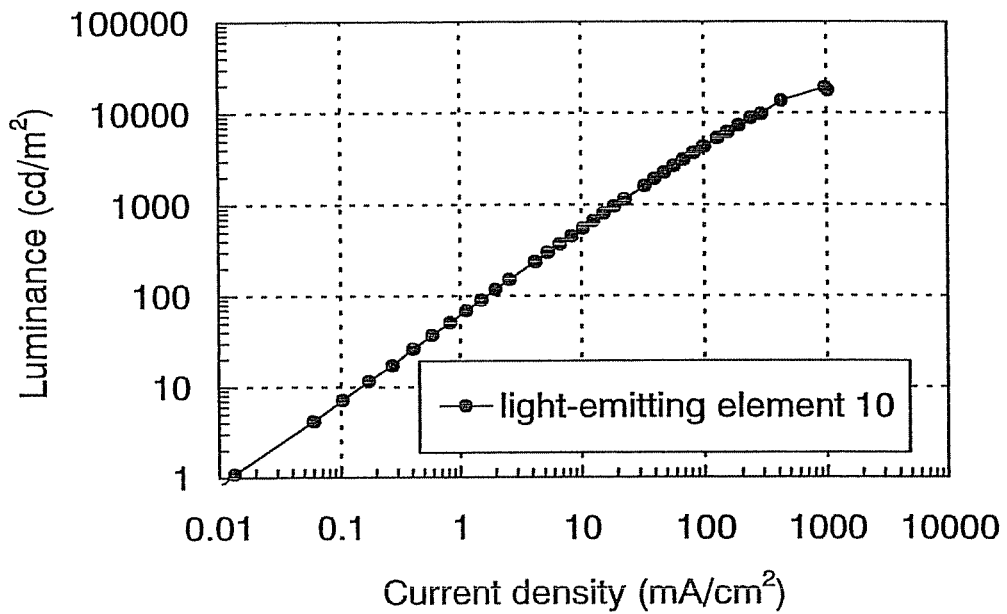
Figure 55:
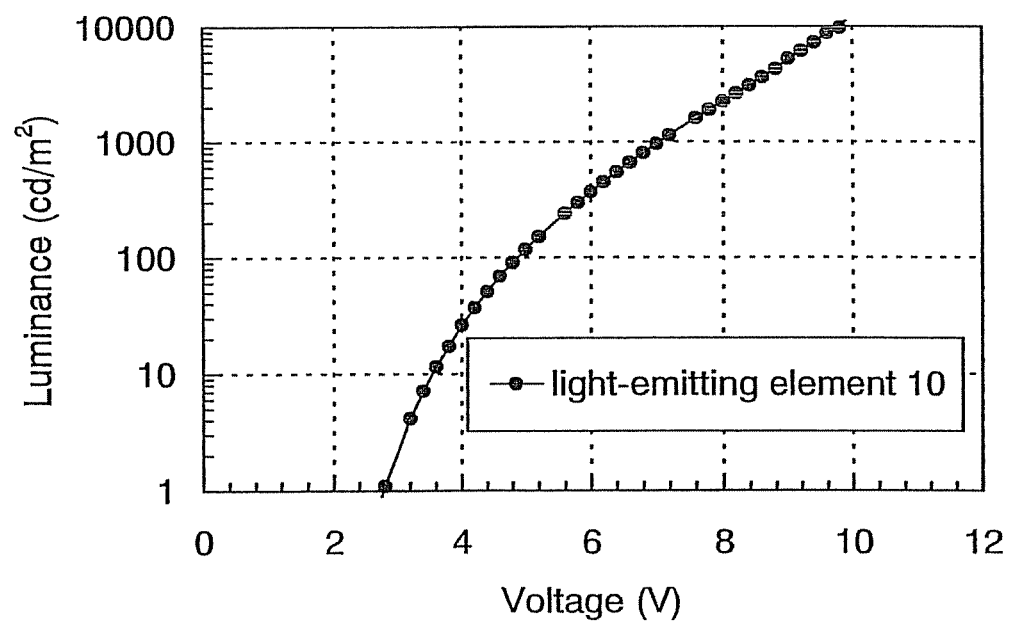
Figure 56:
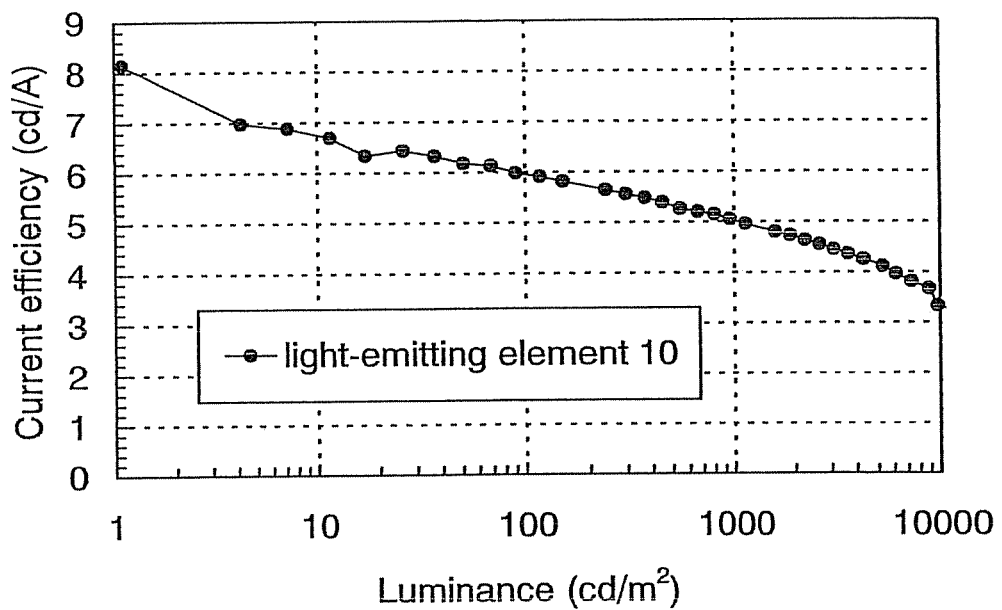
Figure 57:
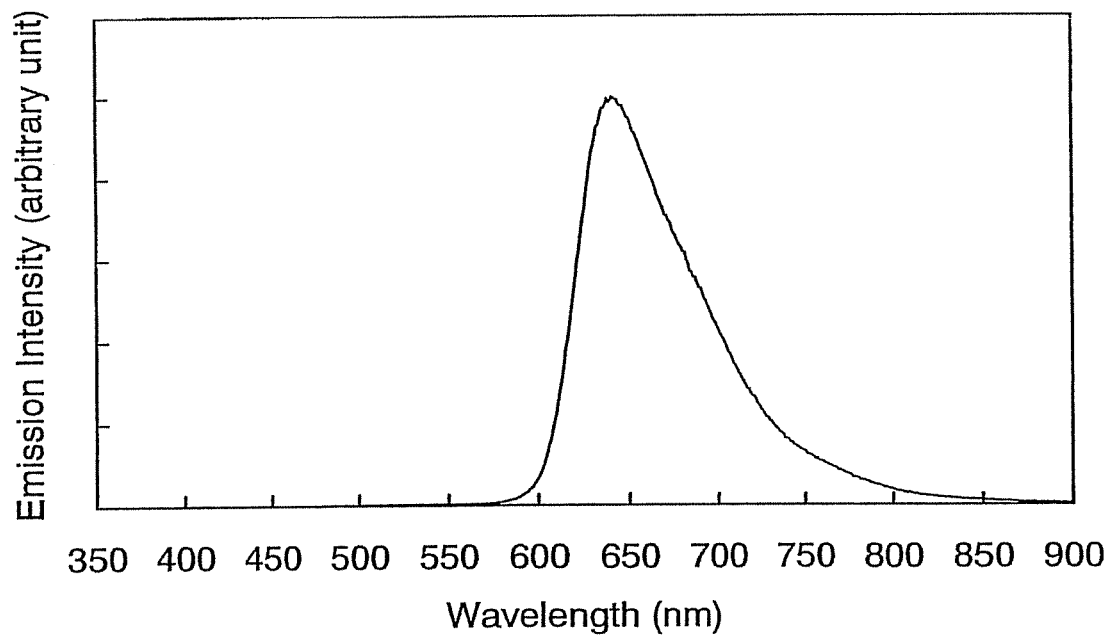
Figure 58:
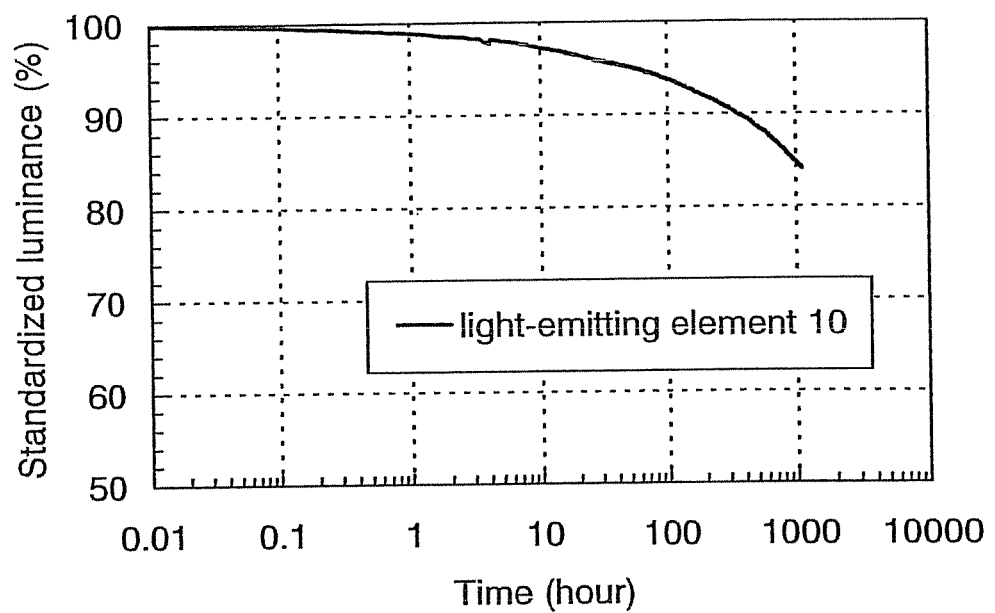
Figure 59:
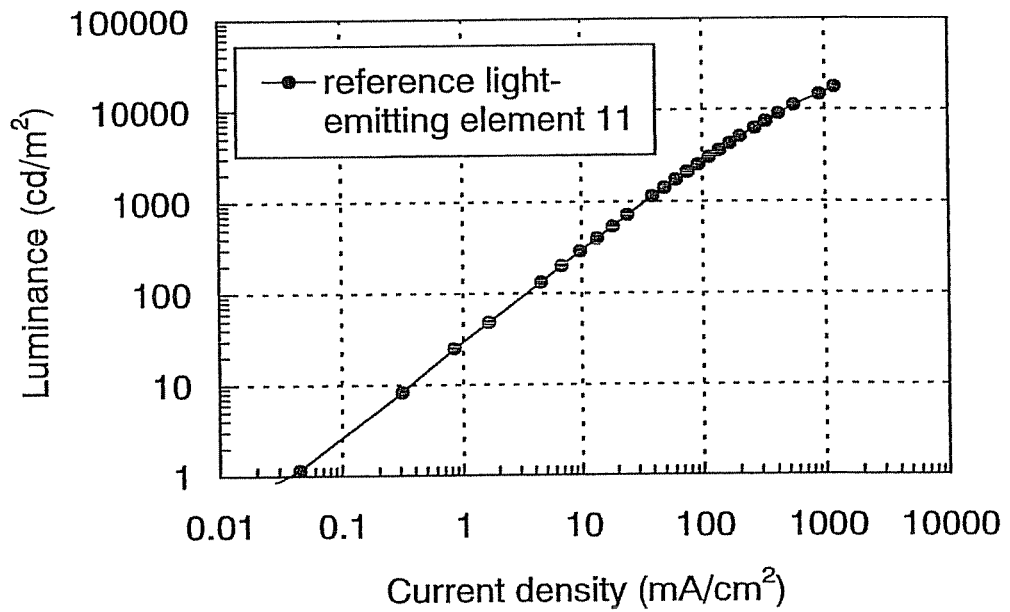
Figure 60:
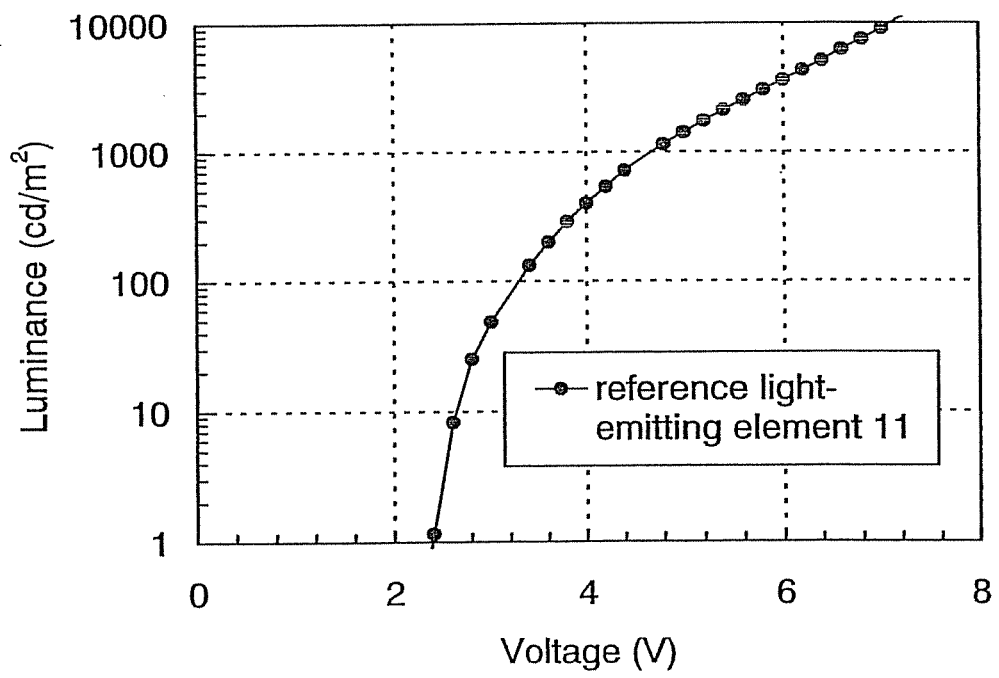
Figure 61:
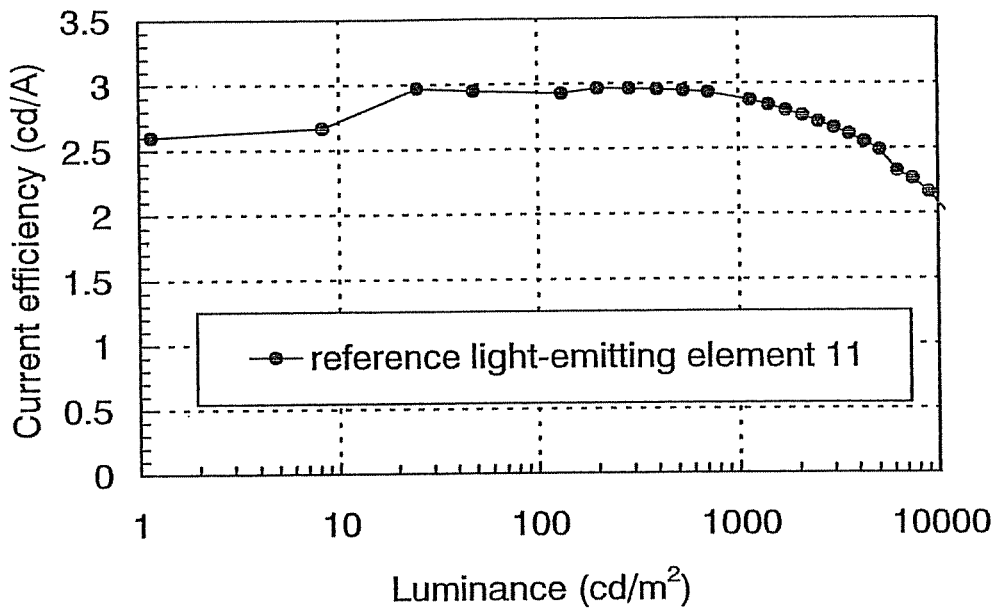
Figure 62:
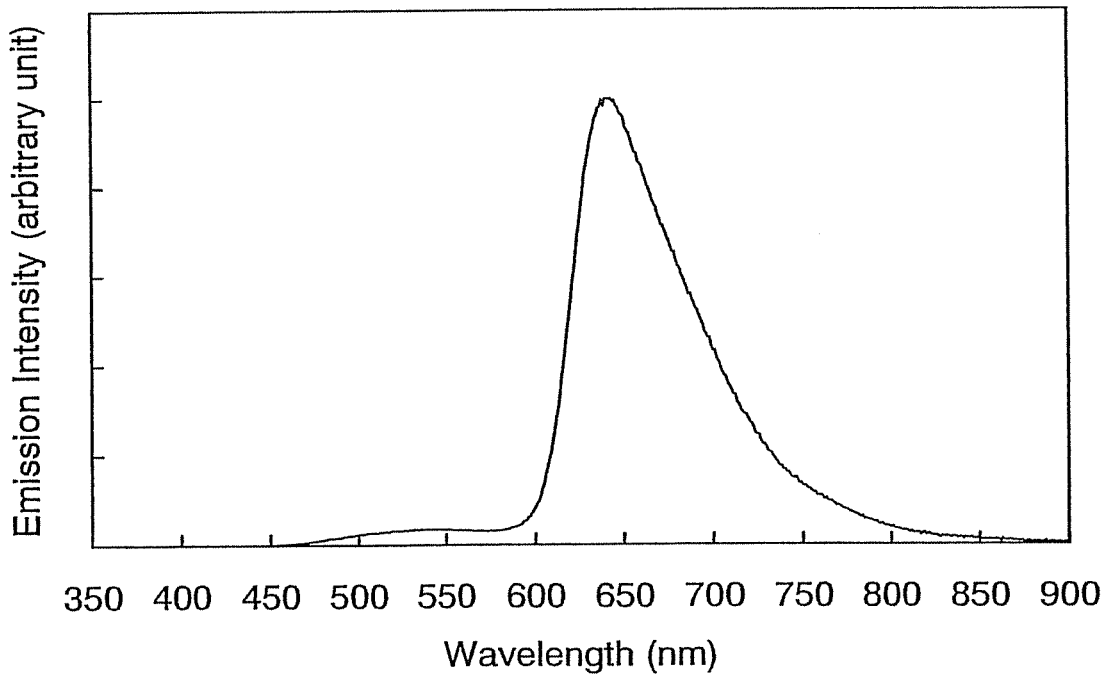
Figure 63:
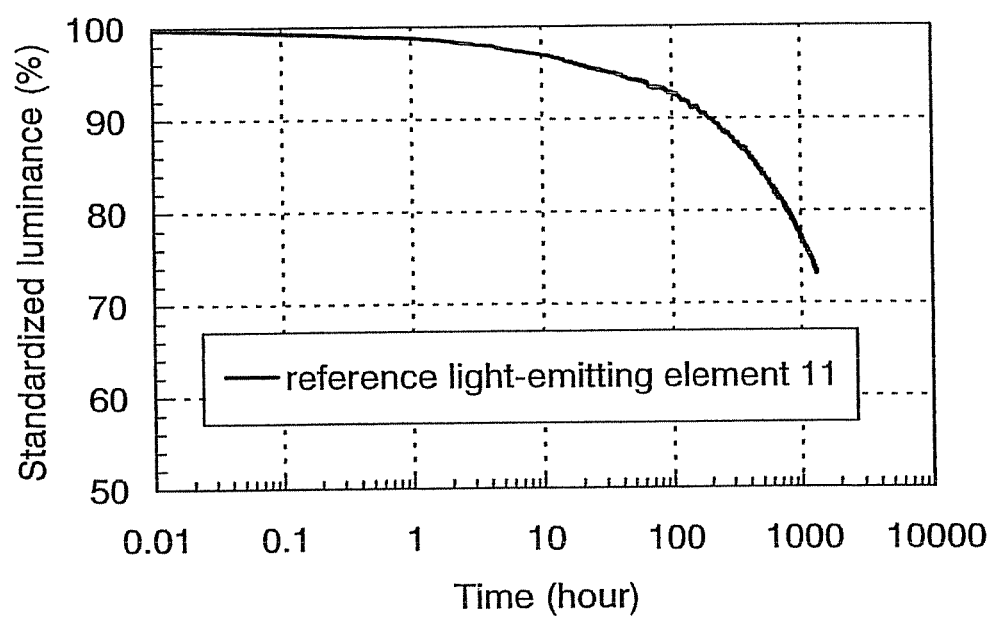
Figure 64:
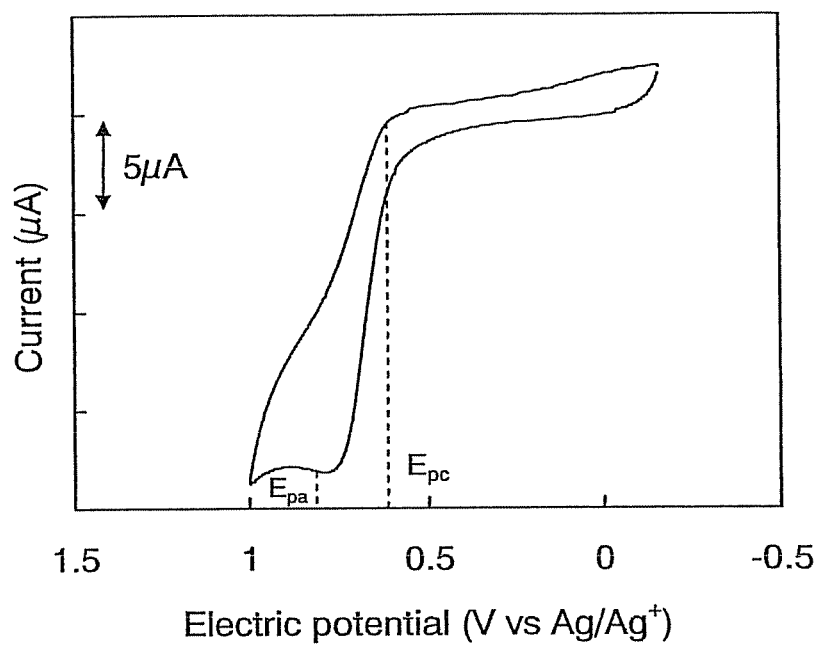

FIG. 26 shows the results of continuous lighting tests in which the light-emitting element 3, a light-emitting element 4, a light-emitting element 5, and a reference light-emitting element 6 were continuously lit by constant current driving;

FIG. 27 shows the current density vs. luminance characteristics of the light-emitting element 4;

FIG. 28 shows the voltage vs. luminance characteristics of the light-emitting element 4;

FIG. 29 shows the luminance vs. current efficiency characteristics of the light-emitting element 4;

FIG. 30 shows the emission spectrum of the light-emitting element 4;

FIG. 31 shows the current density vs. luminance characteristics of the light-emitting element 5;

FIG. 32 shows the voltage vs. luminance characteristics of the light-emitting element 5;

FIG. 33 shows the luminance vs. current efficiency characteristics of the light-emitting element 5;

FIG. 34 shows the emission spectrum of the light-emitting element 5;

FIG. 35 shows the reduction reaction characteristics of Alq;

FIG. 36 shows the reduction reaction characteristics of DPQd;

FIG. 37 shows the reduction reaction characteristics of Coumarin 6;

FIG. 38 shows the current density vs. luminance characteristics of a light-emitting element 7;

FIG. 39 shows the voltage vs. luminance characteristics of the light-emitting element 7;

FIG. 40 shows the luminance vs. current efficiency characteristics of the light-emitting element 7;

FIG. 41 shows the emission spectrum of the light-emitting element 7;

FIG. 42 shows the result of a continuous lighting test in which the light-emitting element 7 was continuously lit by constant current driving;

FIG. 43 shows the current density vs. luminance characteristics of a light-emitting element 8;

FIG. 44 shows the voltage vs. luminance characteristics of the light-emitting element 8;

FIG. 45 shows the luminance vs. current efficiency characteristics of the light-emitting element 8;

FIG. 46 shows the emission spectrum of the light-emitting element 8;

FIG. 47 shows the result of a continuous lighting test in which the light-emitting element 8 was continuously lit by constant current driving;

FIG. 48 illustrates a light-emitting element of an embodiment;

FIG. 49 shows the current density vs. luminance characteristics of a light-emitting element 9;

FIG. 50 shows the voltage vs. luminance characteristics of the light-emitting element 9;

FIG. 51 shows the luminance vs. current efficiency characteristics of the light-emitting element 9;

FIG. 52 shows the emission spectrum of the light-emitting element 9;

FIG. 53 shows the result of a continuous lighting test in which the light-emitting element 9 was continuously lit by constant current driving;

FIG. 54 shows the current density vs. luminance characteristics of a light-emitting element 10;

FIG. 55 shows the voltage vs. luminance characteristics of the light-emitting element 10;

FIG. 56 shows the luminance vs. current efficiency characteristics of the light-emitting element 10;

FIG. 57 shows the emission spectrum of the light-emitting element 10;

FIG. 58 shows the result of a continuous lighting test in which the light-emitting element 10 was continuously lit by constant current driving;

FIG. 59 shows the current density vs. luminance characteristics of a light-emitting element 11;

FIG. 60 shows the voltage vs. luminance characteristics of the light-emitting element 11;

FIG. 61 shows the luminance vs. current efficiency characteristics of the light-emitting element 11;

FIG. 62 shows the emission spectrum of the light-emitting element 11;

FIG. 63 shows the result of a continuous lighting test in which the light-emitting element 11 was continuously lit by constant current driving;

FIG. 64 shows the reduction reaction characteristics of BPAPQ; and

Figure 65:
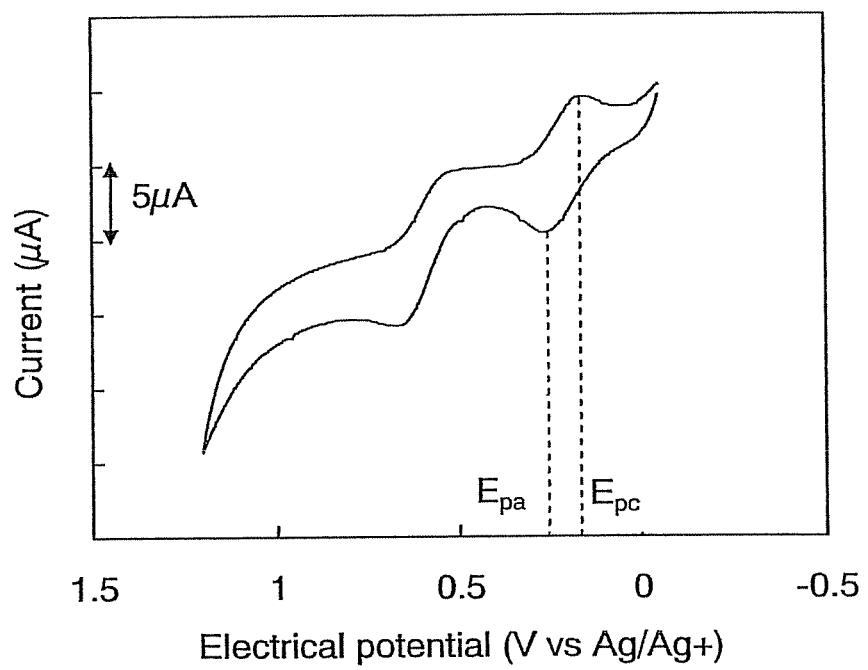

FIG. 65 shows the reduction reaction characteristics of DNTPD.

DETAILED DESCRIPTION OF THE INVENTION

Embodiment modes of the invention which include the best mode for carrying out the invention will be described in detail below with reference to the accompanying drawings. Note that the invention is not limited to the following description, and it will be easily understood by those skilled in the art that various changes and modifications can be made without departing from the spirit and scope of the invention. Therefore, the invention should not be construed as being limited to the description in the following embodiment modes.

First, luminance decay factors of light-emitting elements will be described. Light-emitting elements are generally and often driven with a constant current. In that case, luminance decay means a decrease in current efficiency. The current efficiency means the proportion of output light relative to a current flow. Therefore, the current efficiency is greatly influenced by how many of carriers that are flowing in the light-emitting element can be recombined in a light-emitting layer (carrier balance) or bow many of carriers that have been recombined in the light-emitting layer (i.e., exciton) can contribute to light-emission (quantum yield).

Therefore, it is considered that changes in carrier balance over time or a decrease in quantum yield over time is the major factor of the luminance decay. In view of the foregoing, the invention has been made by focusing on the changes in carrier balance over time. Thus, development of a light-emitting element in which changes in carrier balance over time can be suppressed could be obtained.

Embodiment Mode 1

One example of a light-emitting element of the invention will be described with reference to FIG. 1A. This embodiment mode illustrates a light-emitting element which includes a layer for controlling the movement of electrons as a layer for controlling the movement of carriers. That is, in the invention, changes in carrier balance over time are suppressed by using the layer for controlling the movement of carriers, so that the carriers are recombined at a position away from electrodes, whereby the lifetime of the light-emitting element is prolonged.

The light-emitting element of the invention has a plurality of layers between a pair of electrodes. The plurality of layers is stacked by combining layers made of a compound with a high carrier injection property and a compound with a high carrier transporting property so that a light-emitting region is formed at a position away from the electrodes, i.e., so that carriers are recombined at a position away from the electrodes.

In this embodiment mode, a light-emitting element includes a first electrode 202, a second electrode 204, and an EL layer 203 provided between the first electrode 202 and the second electrode 204. Note that in this embodiment mode, description will be made on the assumption that the first electrode 202 functions as an anode and the second electrode 204 functions as a cathode. That is, light emission is obtained when a voltage is applied to the first electrode 202 and the second electrode 204 so that the potential of the first electrode 202 is higher than the potential of the second electrode 204.

The substrate 201 is used as, a support of the light-emitting element. The substrate 201 can be made of glass, plastic, or the like, for example. Note that the substrate 201 of the light-emitting element of the invention may remain in a light-emitting device or an electronic device which is a product utilizing the light-emitting element. Alternatively, the substrate 201 may be used merely as a support in the process of forming the light-emitting element. In that case, the substrate 201 does not remain in a finished product.

The first electrode 202 is preferably formed using a material with a high work function (i.e., 4.0 eV or higher) such as metals, alloys, electrically conductive compounds, or a mixture of them. Specifically, indium tin oxide (ITO), ITO containing silicon or silicon oxide, indium zinc oxide (IZO), indium oxide containing tungsten oxide and zinc oxide (IWZO), and the like can be given.

Such conductive metal oxide films are generally formed by sputtering, but may also be formed by an ink-jet method, a spin coating method, or the like by application of a sol-gel method or the like. For example, indium zinc oxide (IZO) can be deposited by a sputtering method using a target in which 1 to 20 wt % of zinc oxide is added to indium oxide. In addition, indium oxide containing tungsten oxide and zinc oxide (IWZO) can be deposited by a sputtering method using a target in which 0.5 to 5 wt % of tungsten oxide and 0.1 to 1 wt % of zinc oxide are added to indium oxide. Further, gold (Au), platinum (Pt), nickel (Ni), tungsten (W), chromium (Cr), molybdenum (Mo), iron (Fe), cobalt (Co), copper (Cu), palladium (Pd), titanium (Ti), nitride of metal materials (e.g., titanium nitride), and the like can be used.

When a layer containing a composite material which will be described later is used as a layer having a contact with the first electrode, the first electrode can be formed using various metals, alloys, electrically conductive compound, a mixture of them, or the like regardless of their work functions. For example, aluminum (Al), silver (Ag), an aluminum alloy (AlSi), or the like can be used. Note that in this specification, the term "composite" means the state that charges can be transferred between materials by not only simple mixture of two materials but also by mixture of a plurality of materials.

Besides, an element belonging to Group 1 or 2 of the periodic table which has a low work function, i.e., alkali metals such a lithium (Li) and cesium (Cs) and alkaline earth metals such as magnesium (Mg), calcium (Ca), and strontium (Sr); alloys of them (e.g., MgAg and AlLi); rare earth metals such as europium (Eu) and ytterbium (Yb); alloys of them; and the like can also be used. A film made of an alkali metal, an alkaline earth metal, or an alloy of them can be formed by a vacuum deposition method. Further, a film made of an alloy of an alkali metal or an alkaline earth metal can be formed by a sputtering method. It is also possible to deposit a silver paste or the like by an ink-jet method or the like.

The EL layer 203 includes a first layer 211, a second layer 212, a third layer 213, a fourth layer 214, a fifth layer 215, and a sixth layer 216. In the EL layer 203, the third layer 213 is a light-emitting layer and the fourth layer 214 is a layer for controlling the movement of carriers. Note that it is acceptable as long as the EL layer 203 includes a layer for controlling the movement of carriers and a light-emitting layer shown in this embodiment mode. Thus, the structure of the other stacked layers is not specifically limited. For example, the EL layer 203 can be formed by appropriate combination of a hole injection layer, a hole transporting layer, a light-emitting layer, a layer for controlling the movement of carriers, an electron transporting layer, an electron injection layer, and the like.

The first layer 211 is a layer containing a compound with a high hole injection property. As a compound with a high hole injection property, molybdenum oxide, vanadium oxide, ruthenium oxide, tungsten oxide, manganese oxide, and the like can be used. Besides, phthalocyanine compounds such as phthalocyanine (abbreviation: $H_2PC$), copper(II) phthalocyanine (abbreviation: CuPc), and vanadyl(IV) phthalocyanine (VOPc) can also be given as low molecular organic compounds.

Further, the following low molecular organic compounds can be used: aromatic amine compounds such as 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

Alternatively, the first layer 211 can be formed using a composite material in which a compound with an acceptor property is mixed into a compound with a high hole transporting property. Note that when a composite material in which a compound with an acceptor property is mixed into a compound with a high hole transporting property is used, a material for forming the electrode can be selected regardless of its work function. That is, not only a material with a high work function, but also a material with a low work function can be used for the first electrode 202. Such a composite material can be formed by co-depositing a compound with a high hole transporting property and a compound with an acceptor property.

As an organic compound used for the composite material, various compounds such as aromatic amine compounds, carbazole derivatives, aromatic hydrocarbons, and high molecular compounds (e.g., oligomer, dendrimer, or polymer) can be used. The organic compound used for the composite material is preferably an organic compound having a high hole transporting property. Specifically, a compound having a hole mobility of $10^{-6}$ cm$^2$/Vs or higher is preferably used. However, other compounds may also be used as long as the hole transporting properties thereof are higher than the electron transporting properties thereof. Specific organic compounds that can be used for the composite material are described below.

For example, the following organic compounds can be used for the composite material: aromatic amine compounds such as MTDATA, TDATA, DPAB, DNTPD, DPA3B, PCzPCA1, PCzPCA2, PCzPCN1, 4,4'-bis[N-(1-naphthyl)-N-phenylamino]biphenyl (abbreviation: NPB or α-NPD), and N,N'-bis(3-methylphenyl)-N,N'-dipheny-[1',1'-biphenyl]-4,4'-diamine (abbreviation: TPD); and carbazole derivatives such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), and 1,4-bis[4-(N-carbazolyl)phenyl-2,3,5,6-tetraphenylbenzene.

Alternatively, the following aromatic hydrocarbon compounds can also be used: 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butyl-anthracene, 9,10-bis [2-(1-naphthyl)phenyl]anthracene, 2,3,6,7-tetramethyl-9,10-di(2-naphthyl)anthracene, and the like.

Further, the following aromatic hydrocarbon compounds can also be used: 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

As a compound with an acceptor property, organic compounds such as 7,7,8,8-tetracyano-2,3,5,6-tetrafluoroquinodimethane (abbreviation: F$_4$-TCNQ) and chloranil, and transition metal oxide can be given. In addition, oxide of metals belonging to Groups 4 to 8 in the periodic table can also be given. Specifically, it is preferable to use vanadium oxide, niobium oxide, tantalum oxide, chromium oxide, molybdenum oxide, tungsten oxide, manganese oxide, and rhenium oxide which have high electron accepting properties. Above all, molybdenum oxide is particularly preferable because it is stable even in atmospheric air, has a low hygroscopic property, and is easy to handle.

For the first layer 211, high molecular compounds (e.g., oligomer, dendrimer, or polymer) can be used. For example, the following high molecular compounds can be used: poly (N-vinylcarbazole) (abbreviation: PVK), poly(4-vinyl triphenylamine) (abbreviation: PVTPA), poly[N-(4-{N'-[4-(4-diphenylamino)phenyl]phenyl-N-phenylamino}phenyl) methacrylamide] (abbreviation: PTPDMA), and poly[N,N'-bis(4-butylphenyl)-N,N'-bis(phenyl)benzidine (abbreviation: Poly-TPD). Further, high molecular compounds mixed with acid such as poly (3,4-ethylenedioxythiophene)/poly(styrenesulfonate) (PEDOT/PSS) and polyaniline/poly(styrenesulfonate) (PAni/PSS) can also be used. Note that it is also possible to form the first layer 211 using a composite material which is formed from the above-described high molecular compound such as PVK, PVTAP, PTPDMA, or Poly-TPD and the above-described compound having an acceptor property.

The second layer 212 is a layer containing a compound with a high hole transporting property. As a compound with a high hole transporting property, the following low molecular organic compounds can be used: aromatic amine compounds such as NPB (or α-NPD), TPD, 4,4'-bis[N-(9,9-dimethylfluoren-2-yl)-N-phenylamino]biphenyl (abbreviation: DFLDPBi), and 4,4'-bis[N-(spiro-9,9'-bifluoren-2-yl)-N-phenylamino]biphenyl (abbreviation: BSPB). The compounds described here are mainly compounds having a hole mobility of $10^{-6}$ cm$^2$/Vs or higher.

Further, other compounds may also be used for the second layer 212 as long as the hole transporting properties thereof are higher than the electron transporting properties thereof. Note that the layer containing a compound with a high hole transporting property is not limited to a single layer but may have a stacked structure of two or more layers made of the above-described compounds. Further, the second layer 212 may also be formed with high molecular compounds such as PVK, PVTPA, PTPDMA, and Poly-TPD.

The third layer 213 is a layer containing a highly light-emissive compound, which corresponds to the light-emitting layer of the invention. The third layer 213 can be formed using various materials such as low molecular organic compounds. Specifically, as a light-emitting material which exhibits bluish light, the following can be used: N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), and the like.

As a light-emitting material which exhibits greenish light emission, the following can be used: N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), and the like.

As a light-emitting material which exhibits yellowish light emission, rubrene, 5,12-bis(1,1'-biphenyl-4-yl)-6,11-diphenyltetracene (abbreviation: BPT), and the like can be used. Further, as a light-emitting material which exhibits reddish light emission, N,N,N',N'-tetrakis(4-methylphenyl)tetracene-5,11-diamine (abbreviation: p-mPhTD); 7,13-diphenyl-N,N,N',N'-tetrakis(4-methylphenyl)acenaphtho[1,2-a]

fluoranthene-3,10-diamine (abbreviation: p-mPhAFD), and the like can be used. Alternatively, a phosphorescent material such as bis[2-(2'-benzo[4,5-a]thienyl)pyridinato-N,$C^{3'}$]iridium(III) acetylacetonate (abbreviation: Ir(btp)$_2$(acac)) can also be used.

Note that in this embodiment mode, the layer for controlling the movement of carriers is provided between the light-emitting layer and the second electrode functioning as the cathode. Therefore, the light-emitting layer preferably has an electron transporting property. Conventionally, when a light-emitting layer has an electron transporting property, an electron blocking layer has been provided between the light-emitting layer and an anode in order to prevent electrons from penetrating the light-emitting layer. However, when the electron blocking layer has deteriorated over time, a recombination region expands to the inside of the electron blocking layer (or inside of the hold transporting layer), which could result in a significant decrease in current efficiency (i.e., luminance decay). Meanwhile, in the invention, the movement of electrons is controlled before the electrons reach the light-emitting layer (between the light-emitting layer and the cathode). Therefore, even when the balance of electrons (e.g., mobility or the amount of electrons relative to that of holes) is somewhat lost, the proportion of recombination in the light-emitting layer hardly changes, which is advantageous in that luminance does not easily decay.

Note that the light-emitting layer may also have a structure in which the above-described highly light-emissive compound is dispersed in another compound. Various compounds can be used for the material in which the light-emissive compound is dispersed. In particular, it is preferable to use a compound whose lowest unoccupied molecular orbital (LUMO) level is higher than that of the light-emissive compound and whose highest occupied molecular orbital (HOMO) level is lower than that of the light-emissive compound.

Note that in this embodiment mode, the light-emitting layer preferably has an electron transporting property because the layer for controlling the movement of carriers is provided between the light-emitting layer and the second electrode functioning as the cathode. That is, the electron transporting property of the light-emitting layer is preferably higher than the hole transporting property thereof. Therefore, the above-described material in which the highly light-emissive compound is dispersed is preferably an organic compound having an electron transporting property.

Specifically, the following metal complexes can be used: tris(8-quinolinolato)aluminum(III) (abbreviation: Alq), tris(4-methyl-8-quinolinolato)aluminum(III) (abbreviation: Almq$_3$), bis(10-hydroxybenzo[h]-quinolinato)beryllium(II) (abbreviation: BeBq$_2$), bis(2-methyl-8-quinolinolato)(4-phenylphenolato)aluminum(III) (BAlq), bis(8-quinolinolato)zinc(II) (abbreviation: Znq), bis[2-(2-benzoxazolyl)phenolato]zinc(II) (Abbreviation: ZnPBO), and bis[2-(2-benzothiazolyl)phenolato]zinc(II) (abbreviation: Zn(BTZ)$_2$).

Further, the following heterocyclic compounds can also be used: 2-(4-biphenylyl)-5-(4-tert-butylphenyl)-1,3,4-oxadiazole (abbreviation: PBD), 1,3-bis[5-(4-tert-buthylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)-tris(1-phenyl-1H-benzimidazole) (abbreviation: TPBI), bathophenanthroline (abbreviation: BPhen), and bathocuproin (abbreviation: BCP).

Alternatively, the following condensed aromatic compounds can also be used: 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilben-3,3'-diyl)diphenanthrene (abbreviation: DPNS), 9,9'-(stilben-4,4'-diyl)diphenanthrene (abbreviation: DPNS2), and 3,3',3''-(benzene-1,3,5-triyl)tripyrene (abbreviation: DPB3).

As a material in which the light-emissive compound is dispersed, a plurality of kinds of materials can be used. For example, a compound for controlling the crystallization of rubrene or the like can be further added in order to control the crystallization. In addition, NPB, Alq, or the like can be further added in order to efficiently transfer energy to the light-emissive compound. When a structure in which a highly light-emissive compound is dispersed in another compound is employed, the crystallization of the third layer 213 can be suppressed. Further, concentration quenching which results from the high concentration of the light-emissive compound can also be suppressed.

Further, high molecular compounds can be used for the third layer 213 that is the light-emitting layer. Specifically, as a light-emitting material which exhibits bluish light emission, the following can be used: poly(9,9-dioctylfluorene-2,7-diyl) (abbreviation: POF), poly[(9,9-dioctylfluorene-2,7-diyl-co-(2,5-dimethoxybenzene-1,4-diyl)] (abbreviation: RF-DMOP), poly{(9,9-dioctylfluorene-2,7-diyl)-co-[N,N'-di-(p-butylphenyl)-1,4-diaminobenzene]} (abbreviation: TAB-PFH), and the like.

As a light-emitting material which exhibits greenish light emission, the following can be used: poly(p-phenylenevinylene) (abbreviation: PPV), poly[(9,9-dihexylfluorene-2,7-diyl)-alt-co-(benzo[2,1,3]thiadiazol-4,7-diyl)](abbreviation: PFBT), poly[(9,9-dioctylfluorene-2,7-divinylenefluorenylene)-alt-co-(2-methoxy-5-(2-ethylhex yloxy)-1,4-phenylene)], and the like.

As a light-emitting material which exhibits orangish to reddish light emission, the following can be used: poly[2-methoxy-5-(2'-ethylhexoxy)-1,4-phenylenevinylene](abbreviation: MEH-PPV), poly(3-butylthiophene-2,5-diyl), poly{[9,9-dihexyl-2,7-bis(1-cyanovinylene)fluorenylene]-alt-co-[2,5-bis(N,N'-diphenylamino)-1,4-phenylene]}, poly{[2-methoxy-5-(2-ethylhexyloxy)-1,4-bis(1-cyanovinylenephenylene)]-alt-co-[2,5-bis(N,N'-diphenylamino)-1,4-phenylene]} (abbreviation: CN-PPV-DPD), and the like.

The fourth layer 214 is a layer for controlling the movement of carriers, and contains at least two kinds of compounds. The most important feature of the invention is that the layer for controlling the movement of carriers is provided, and also the layer includes a first organic compound which is an organic compound having a carrier transporting property and a second organic compound having a carrier trapping property. The organic compound having a carrier transporting property is categorized as a compound having an electron transporting property or a compound having a hole transporting property. Similarly, the organic compound having a carrier transporting property is categorized as a compound having an electron trapping property or a compound having a hole trapping property.

The fourth layer 214 in this embodiment mode contains a higher weight percent of the first organic compound than the weight percent of the second organic compound. This embodiment mode will describe the case where the layer for controlling the movement of carriers is provided at a position closer to the second electrode functioning as the cathode than the layer having a light-emitting function (i.e., the light-emitting layer) is. That is, a case where the layer for controlling the movement of carriers is provided between the third layer 213 having the light-emitting function and the second electrode 204 will be described.

When the layer for controlling the movement of carriers is provided at a position closer to the second electrode functioning as the cathode than the light-emitting layer is, the first organic compound is preferably an organic compound having an electron transporting property. That is, the first organic compound is preferably a compound whose electron transporting property is higher than the hole transporting property. In addition, the second organic compound is preferably an organic compound having a function of trapping electrons. That is, the second organic compound is preferably an organic compound whose lowest unoccupied molecular orbital (LUMO) level is lower than that of the first organic compound by 0.3 eV or more. When the layer for controlling the movement of carriers includes the second organic compound, the electron transporting speed of the layer as a whole can be lower as compared with the case where the layer is made of only the first organic compound. That is, adding the second organic compound makes it possible to control the movement of carriers. Further, controlling the concentration of the second organic compound makes it possible to control the movement speed of carriers. The concentration of the second organic compound is preferably in the range of 0.1 wt % to 5 wt % or in the rage of 0.1 mol % to 5 mol %.

It is preferable that the emission colors of the light-emitting layer and the second organic compound be similar colors. For example, when the organic compound contained in the light-emitting layer is an organic compound which exhibits bluish light emission such as YGA2S or YGAPA, the second organic compound is preferably a compound which exhibits light emission in the range of blue to bluish green such as acridone, Coumarin 102, Coumarin 6H, Coumarin 480D, or Coumarin 30. In this manner, even if the second organic compound unintendedly emits light, the color purity of the emitted light can be in a good condition.

In addition, when the organic compound contained in the light-emitting layer is an organic compound which exhibits greenish light emission such as 2PCAPA, 2PCABPhA, 2DPAPA, 2DPABPhA, 2YGABPhA, or DPhAPhA, the second organic compound is preferably a compound which exhibits light emission in the range of bluish green to yellowish green such as N,N'-dimethylquinacridone (abbreviation: DMQd), N,N'-diphenylquinacridone (abbreviation: DPQd), 9,18-dihydro-benzo[h]benzo[7,8]quino[2,3-b]acridine-7,16-dione (abbreviation: DMNQd-1), 9,18-dihydro-9,18-dimethyl-benzo[h]benzo[7,8]quino[2,3-b]acridine-7,16-dione (abbreviation: DMNQd-2), Coumarin 30, Coumarin 6, Coumarin 545T, or Coumarin 153.

Further, when the organic compound contained in the light-emitting layer is an organic compound which exhibits yellowish light emission such as rubrene or BPT, the second organic compound is preferably a compound which exhibits light emission in the range of yellowish green to golden yellow such as DMQd or (2-{2-[4-(9H-carbazol-9-yl)phenyl]ethenyl}-6-[2-(4-dimethylaminophenyl)ethenyl]-4H-pyran-4-ylidene)propanedinitrile (abbreviation: DCMCz).

Further, when the organic compound contained in the light-emitting layer is an organic compound which exhibits reddish light emission such as p-mPhTD or p-mPhAFD, the second organic compound is preferably a compound which exhibits light emission in the range of orange to red such as 2-{2-[4-(dimethylamino)phenyl]ethenyl}-6-methyl-4H-pyran-4-ylidene)propanedinitrile (abbreviation: DCM1), {2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), {2-(1,1-dimethylethyl)-6-[2-(2,3,6,7-tetrahydro-1,1,7,7-tetramethyl-1H,5H-benzo[ij]quinolizin-9-yl)ethenyl]-4H-pyran-4-ylidene}propanedinitrile (abbreviation: DCJTB), or Nile red.

Further, when the light-emitting material contained in the light-emitting layer is a phosphorescent material, the second organic compound is also preferably a phosphorescent material. For example, when the light-emitting material is the above-described Ir(btp)$_2$(acac) which exhibits red light emission, the second organic compound may be a red phosphorescent material such as (acetylacetonato)bis[2,3-bis(4-fluorophenyl)quinoxalinato]iridium(II) (abbreviation: Ir(Fdpq)$_2$(acac)). Note that the above-described compounds are compounds having particularly low LUMO levels among compounds that are used for light-emitting elements. Thus, when such compounds are added to the first organic compound which will be described later, an excellent trapping property can be obtained.

Note that among the above compounds exemplarily illustrated for the second organic compound, quinacridone derivatives such as DMQd, DPQd, DMNQd-1, and DMNQd-2 are chemically stable and thus preferable. That is, when quinacridone derivatives are used, the lifetime of the light-emitting element can be particularly prolonged. In addition, since quinacridone derivatives exhibit greenish light emission, the element structure of the light-emitting element of the invention is particularly effective for a light-emitting element of a greenish color. A green color requires the highest level of luminance in forming a full-color display, and there are cases where the deterioration speed of a green light-emitting element is faster than those of other light-emitting elements. However, such a problem can be ameliorated by applying the invention.

In addition, the first organic compound contained in the fourth layer 214 is an organic compound having an electron transporting property. That is, the first organic compound is a compound whose electron transporting property is higher than the hole transporting property. Specifically, the following can be used: metal complexes such as Alq, Almq$_3$, BeBq$_2$, BAlq, Znq, BAlq, ZnPBO, and ZnBTZ; heterocyclic compounds such as PBD, OXD-7, TAZ, TPBI, BPhen, and BCP; and condensed aromatic compounds such as CzPA, DPCzPA, DPPA, DNA, t-BuDNA, BANT, DPNS, DPNS2, and TPB3.

Further, the following high molecular compounds can also be used: poly[(9,9-dihexylfluorene-2,7-diyl)-co-(pyridin-3,5-diyl)](abbreviation: PF-Py) and poly[(9,9-dioctyllfluorene-2,7-diyl)-co-(2,2'-pyridin-6,6'-diyl)](abbreviation: PF-BPy). Above all, metal complexes that are stable against electrons are preferably used.

In addition, as mentioned earlier, the LUMO level of the second organic compound is preferably lower than that of the first organic compound by 0.3 eV or more. Therefore, it is acceptable as long as the first organic compound is appropriately selected so as to satisfy the above condition according to the kind of compound used for the second organic compound. For example, when DPQ or Coumarin 6 is used for the second organic compound as will be later described in embodiments, the above condition can be satisfied by using Alq for the first organic compound.

Note that it is preferable that the emission colors of the highly light-emissive compound contained in the third layer 213 and the second organic compound contained in the fourth layer 214 be similar colors. Therefore, it is preferable that a difference in peak values between the emission spectrum of the highly light-emissive compound and the emission spectrum of the second organic compound be within the range of 30 nm. When the difference in peak values is within the range of 30 nm, the emission colors of the highly light-emissive compound and the second organic compound can be similar colors. Therefore, even when the second organic compound emits light due to changes in voltage or the like, changes in emission color can be suppressed.

Note that the second organic compound does not necessarily have to emit light. For example, when the highly light-emissive compound has higher luminous efficiency than the second organic compound, it is preferable to control the concentration of the second organic compound in the fourth layer 214 so that only the light emission of the highly light-emissive compound can be substantially obtained (by setting the concentration of the second organic compound to be slightly lower than that of the highly light-emissive compound so that the light emission of the second organic compound can be suppressed). In that case, the emission colors of the highly light-emissive compound and the second organic compound are similar colors (i.e., they have about the same level of energy gap). Therefore, there is little possibility that energy will transfer from the highly light-emissive compound toward the second organic compound, and thus high luminous efficiency can be obtained.

Note that the second organic compound is preferably coumarin derivatives such as Coumarin 102, Coumarin 6H, Coumarin 480D, Coumarin 30, Coumarin 6, Coumarin 545T, and Coumarin 153. Coumarin derivatives have low electron trapping properties. Therefore, the concentration of the second organic compound added into the first organic compound may be relatively high. That is, the concentration of the second organic compound can easily be controlled, and thus a layer for controlling the movement of carriers which has desired properties can easily be obtained. Further, since coumarin derivatives have high luminous efficiency, decrease in luminous efficiency of the entire light-emitting element can be suppressed even when the second organic compound emits light.

Figure 1A:
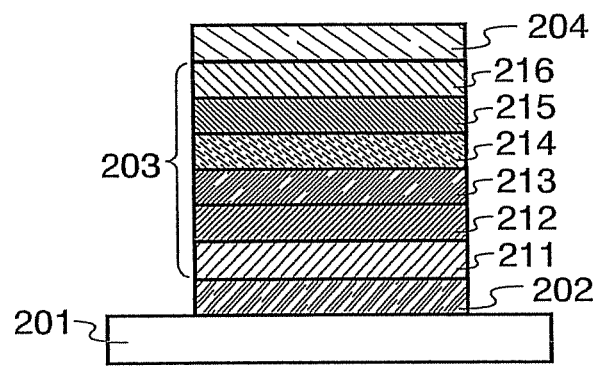
FIGS. 1A and 1B illustrate light-emitting elements of the invention shown in Embodiment Mode 1.
Figure 4:
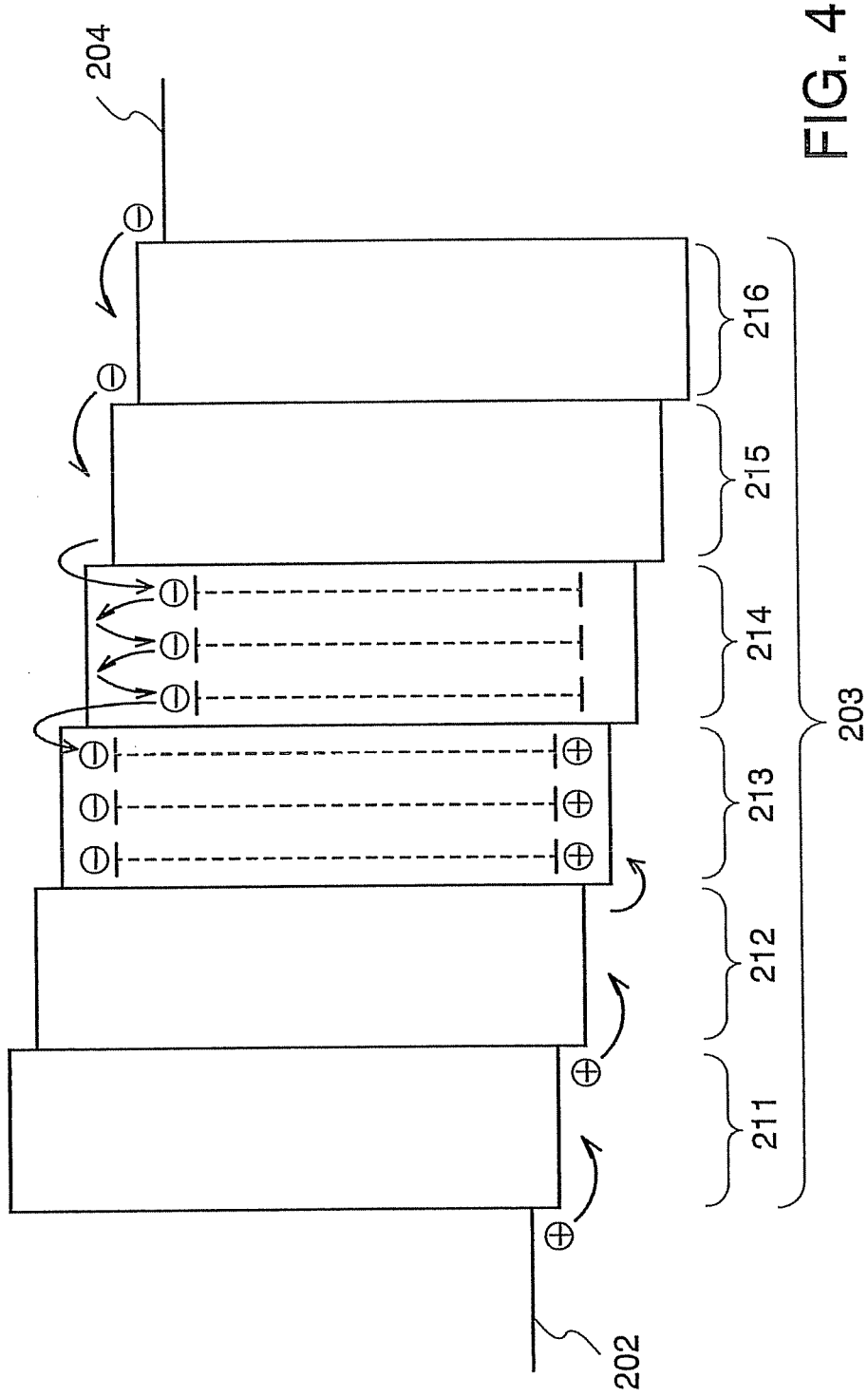
FIG. 4 illustrates an example of a band diagram of the light-emitting element of the invention shown in FIG. 1A.

FIG. 4 exemplarily illustrates a band diagram of the light-emitting element of the invention shown in FIG. 1A. In FIG. 4, holes injected from the first electrode 202 pass through the first layer 211 containing a compound with a high hole injection property and further through the second layer 212 containing a compound with a high hole transporting property. Then, the holes are injected to the third layer 213 containing a highly light-emissive compound. On the other hand, electrons injected form the second electrode 204 pass through the sixth layer 216 containing a compound with a high electron injection property and further through the fifth layer 215 containing a compound with a high electron transporting property. Then, the electrons are injected to the fourth layer 214 that is the layer for controlling the movement of carriers. The movement speed of the electrons injected to the layer for controlling the movement of carriers is retarded by the second organic compound having an electron trapping property. The electrons whose movement speed has been retarded are injected to the third layer 213 containing a highly light-emissive compound, and then recombined with holes. Thus, light emission is obtained.

When the third layer 213 has an electron transporting property, for example, the movement speed of the holes that are injected form the second layer 212 to the third layer 213 is retarded. In addition, the movement speed of the electrons that are injected from the fourth layer 214 to the third layer 213 is even slow in the third layer 213 because it has already been retarded in the fourth layer 214. Therefore, holes of a slow movement speed and electrons of a slow movement speed are recombined in the third layer 213, whereby the recombination probability is increased and luminous efficiency is improved.

In the case of a conventional light-emitting element which does not include the fourth layer 214, the movement speed of electrons is not retarded but the electrons are directly injected to the third layer 213. Thus, the electrons reach the vicinity of the interface between the second layer 212 and the third layer 213. Therefore, a light-emitting region is formed in the vicinity of the interface between the second layer 212 and the third layer 213. In that case, there is a possibility that the electrons may reach and deteriorate the second layer 212. Further, when the amount of electrons that have reached the second layer 212 is increased over time, the recombination probability in the light-emitting layer is decreased over time, which leads to a shorter lifetime of the element (luminance decay over time).

In the light-emitting element of the invention, electrons injected from the second electrode 204 pass through the sixth layer 216 containing a compound with a high electron injection property and further through the fifth layer 215 containing a compound with a high electron transporting property. Then, the electrons are injected to the fourth layer 214 that is the layer for controlling the movement of carriers. Here, the fourth layer 214 has a structure in which the second organic compound having a function of trapping electrons is added to the first organic compound having an electron transporting property. Therefore, the movement speed of the electrons that are injected to the fourth layer 214 is retarded and the electron injection to the third layer 213 is controlled.

As a result, a light-emitting region, which has conventionally been formed in the vicinity of the interface between the second layer 212 containing a compound with a high hole transporting property and the third layer 213, is formed around a region from the third layer 213 to the vicinity of the interface between the third layer 213 and the fourth layer 214. Therefore, there is low possibility that electrons may reach and deteriorate the second layer 212 which contains a compound with a high hole transporting property. Similarly, as for holes, there is also low possibility that holes may reach and deteriorate the fifth layer 215 which contains a compound with a high electron transporting property because the fourth layer 214 contains the first organic compound having an electron transporting property.

Further, it is, an important point of the invention that not merely a compound with low electron mobility is applied to the fourth layer 214 but an organic compound having an a function of trapping electrons, i.e., an organic compound having a carrier trapping property is added to an organic compound having an electron transporting property, i.e., an organic compound having a carrier transporting property. With such a structure, it becomes possible not only to control the electron injection to the third layer 213 but also to suppress changes in the controlled amount of electron injection over time. Therefore, the light-emitting element of the invention can prevent a phenomenon that carrier balance is lost over time, which could otherwise lower the recombination probability. Thus, the lifetime of the element can be improved (luminance decay over time can be suppressed).

In the light-emitting element of the invention, the light-emitting region is not formed at the interface between the light-emitting layer and the hole transporting layer or the interface between the light-emitting layer and the electron transporting layer. Therefore, there is no adverse effect of deterioration which would otherwise be caused if the light-emitting region is positioned close to the hole transporting layer or the electron transporting layer. Further, changes in carrier balance over time (in particular, changes in amount of electron injection over time) can be suppressed. Therefore, a long-lifetime light-emitting element which does not easily deteriorate can be obtained.

In addition, it is preferable that the emission colors of the second organic compound contained in the fourth layer 214 and the highly light-emissive compound contained in the third layer 213 be similar colors. Specifically, it is preferable that a difference in peak values between the emission spectrum of the second organic compound and the highly light-emissive compound be within the range of 30 nm. When the difference in peak values is within the range of 30 nm, the emission colors of the second organic compound and the highly light-emissive compound can be similar colors. Therefore, even when the second organic compound emits light due to changes in voltage or the like, changes in emission color can be suppressed. Note that the second organic compound does not necessarily have to emit light.

In addition, the thickness of the fourth layer 214 is preferably in the range of 5 to 20 nm. When the fourth layer 214 is too thick, the movement speed of the carriers becomes too slow, which could result in high driving voltage. When the fourth layer 214 is too thin, on the other hand, it is impossible to implement the function of controlling the movement of carriers. Therefore, the thickness of the fourth layer 214 is preferably in the range of 5 to 20 nm.

The fifth layer 215 is a layer containing a compound with a high electron transporting property. For example, as a low molecular organic compound, metal complexes such as Alq, Almq$_3$, BeBq$_2$, BAlq, ZnPBO, and ZnBTZ can be used. Further, besides the metal complexes, heterocyclic compounds such as PBD, OXD-7, TAZ, TPBI, BPhen, and BCP can also be used. The compounds described here are mainly compounds having an electron mobility of $10^{-6}$ cm$^2$/Vs or higher. Further, compounds other than the above-described compounds may also be used for the electron transporting layer as long as the electron transporting properties thereof are higher than the hole transporting properties thereof. Furthermore, the electron transporting layer is not limited to a single layer but may have a stacked structure of two or more layers made of the above-described compounds.

Further, the fifth layer 215 can also be formed using a high molecular compound. For example, the following can be used: poly[(9,9-dihexylfluorene-2,7-diyl)-co-(pyridin-3,5-diyl)](abbreviation: PF-Py), poly[(9,9-dioctyllfluorene-2,7-diyl)-co-(2,2'-pyridin-6,6'-diyl)](abbreviation: PF-BPy), and the like.

The sixth layer 216 is a layer containing a compound with a high electron injection property. As a compound with a high electron injection property, alkali metals, alkaline earth metals, or compounds of them can be used such as lithium fluoride (LiF), cesium fluoride (CsF), and calcium fluoride (CaF$_2$). For example, it is possible to use a layer made of a compound with an electron transporting property in which an alkali earth metal, an alkaline earth metal, or a compound of them is mixed, such as a mixture of Alq and magnesium (Mg). Note that when the layer made of a compound with an electron transporting property in which an alkali earth metal, an alkaline earth metal, or a compound of them is mixed is used, electrons can be efficiently injected from the second electrode 204, which is preferable.

The second electrode 204 is preferably formed using a compound with a low work function (i.e., 3.8 eV or lower) such as metals, alloys, electrically conductive compounds, or a mixture of them. Specific examples of such a cathode material include an element belonging to Group 1 or 2 of the periodic table, i.e., alkali metals such a lithium (Li) and cesium (Cs) and alkaline earth metals such as magnesium (Mg), calcium (Ca), and strontium (Sr); alloys of them (e.g., MgAg and AlLi); rare earth metals such as europium (Eu) and ytterbium (Yb); alloys of them; and the like. A film made of an alkali metal, an alkaline earth metal, or an alloy of them can be formed by a vacuum deposition method. Further, a film made of an alloy of an alkali metal or an alkaline earth metal can be formed by a sputtering method. It is also possible to deposit a silver paste or the like by an ink-jet method or the like.

When the sixth layer 216 which is a layer having a function of promoting electron injection is provided between the second electrode 204 and the fifth layer 215, the second electrode 204 can be formed using various conductive materials such as Al, Ag, ITO, and ITO containing silicon or silicon oxide, regardless of their work functions. Further, such conductive materials can be deposited by a sputtering method, an ink-jet method, a spin coating method, or the like.

As a method forming the EL layer, various methods can be used regardless of a dry process or a wet process. For example, a vacuum deposition method, an ink-jet method, a spin coating method, or the like can be used. Further, different deposition methods may be used for different electrodes or different layers. For example, among the above-described materials, a high molecular compound may be selected to form the EL layer by a wet process. Alternatively, a low molecular organic compound may be selected to form the EL layer by a wet process. Further, it is also possible to form the EL layer by selecting a low molecular organic compound and using a dry process such as a vacuum deposition method. Similarly, the electrodes can be formed by a wet process such as a sol-gel process or by a wet process with a paste of a metal material. Alternatively, the electrodes can be formed by a dry process such as a sputtering method or a vapor deposition method.

A specific method for forming the light-emitting element will be described below. In the case where the light-emitting element of the invention is applied to a display device and its light-emitting layer is selectively deposited according to each color, the light-emitting layer is preferably formed by a wet process. When the light-emitting layer is formed by an ink-jet method, selective deposition of the light-emitting layer for each color can be easily performed even when a large substrate is used.

For example, the structure shown in FIG. 1A can be obtained by the steps of: forming the first electrode by a sputtering method which is a dry process, forming the first layer by an ink-jet method or a spin coating method which is a wet process, forming the second layer by a vacuum deposition method which is a dry process, forming the third layer by an ink-jet method which is a wet process, forming the fourth layer by a co-deposition method which is a dry process, forming the fifth layer and the sixth layer by a vacuum deposition method which is a dry process, and forming the second electrode by an ink-jet method or a spin coating method which is a wet process.

Alternatively, the structure shown in FIG. 1A may be obtained by the steps of: forming the first electrode by a ink-jet method which is a wet process, forming the first layer by a vacuum deposition method which is a dry process, forming the second layer by an ink-jet method or a spin coating method which is a wet process, forming the third layer by an ink-jet method which is a wet process, forming the fourth layer by an ink-jet method or a spin coating method which is a wet process, forming the fifth layer and the sixth layer by an ink-jet method or a spin coating method which is a wet process, and forming the second electrode by an ink-jet method or a spin coating method which is a wet process. Note that the deposition methods are not limited to the above methods, and a wet process and a dry process may be combined as appropriate.

For example, the structure shown in FIG. 1A can be obtained by the steps of: forming the first electrode by a sputtering method which is a dry process, forming the first layer and the second layer by an ink-jet method or a spin coating method which is a wet process, forming the third layer which is a light-emitting layer by an ink-jet method which is a wet process, forming the fourth layer by a co-deposition method which is a dry process, forming the fifth layer and the sixth layer by a vacuum deposition method which is a dry process, and forming the second electrode by a vacuum deposition method which is a dry process.

That is, it is possible to form the first layer to the third layer by wet processes on the substrate having the first electrode which is formed in advance in a desired shape, and form the fourth layer to the second electrode thereon by dry processes. By this method, the first layer to the third layer can be formed at atmospheric pressure and the third layer can be selectively deposited according to each color with ease. In addition, the fourth layer to the second electrode can be consecutively formed in vacuum. Therefore, the process can be simplified and productivity can be improved.

The process will be exemplarily described below. First, PEDOT/PSS is deposited as the first layer on the first electrode. Since PEDOT/PSS is soluble in water, it can be deposited as an aqueous solution by a spin coating method, an ink-jet method, or the like. The second layer is not provided but the third layer is provided as the light-emitting layer on the first layer. The light-emitting layer can be formed by an ink-jet method, using a solution in which a light-emissive compound is dissolved in a solvent (e.g., toluene, dodecylbenzene, or a mixed solvent of dodecylbenzene and tetralin) in which the first layer (PEDOT/PSS) that is already formed will not be dissolved. Next, the fourth layer is formed on the third layer. When the fourth layer is formed by a wet process, the fourth layer should be formed using a solvent in which the first layer and the third layer that are already formed will not be dissolved. In that case, the selection range of solvents is limited. Therefore, using a dry process is easier to form the fourth layer. Thus, by consecutively forming the fourth layer to the second electrode in vacuum by a vacuum deposition method which is a dry process, the process can be simplified.

Figure 2A:
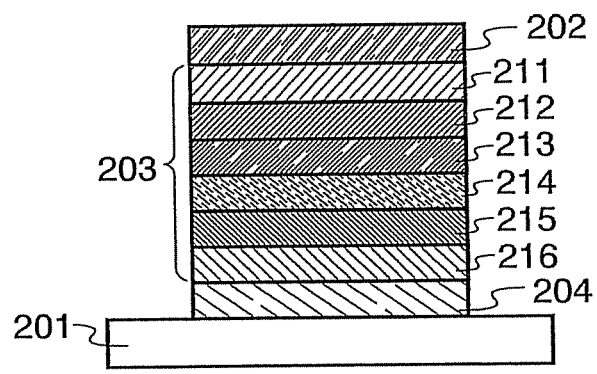
FIGS. 2A and 2B illustrate light-emitting elements of the invention having different structures from those in FIGS. 1A and 1B of Embodiment Mode 1.
Figure 2B:
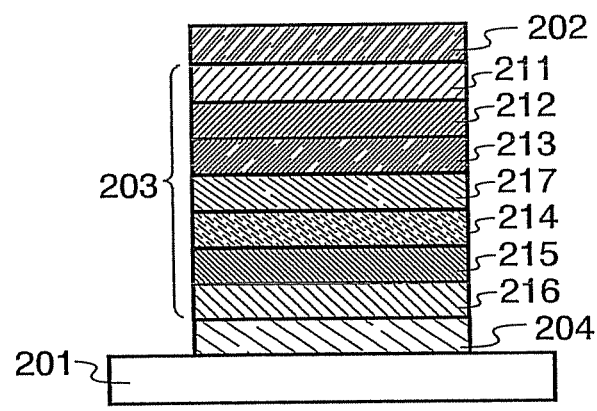

Meanwhile, a structure shown in FIG. 2A can be formed in the reverse order of the above-described steps: forming the second electrode by a sputtering method or a vacuum deposition method which is a dry process, forming the sixth layer and the fifth layer by a vacuum deposition method which is a dry process, forming the fourth layer by a co-deposition method which is a dry process, forming the third layer by an ink-jet method which is a wet process, forming the second layer and the first layer by an ink-jet method or a spin coating method which is a wet process, and forming the first electrode by an ink-jet method or a spin coating method which is a wet process. By this method, the second electrode to the fourth layer can be consecutively formed in vacuum by dry processes, and the third layer to the first electrode can be formed at atmospheric pressure. Therefore, the process can be simplified and productivity can be improved.

In the light-emitting element of the invention having the above structure, a current flows due to a potential difference generated between the first electrode 202 and the second electrode 204, whereby holes and electrons are recombined in the EL layer 203 and light emission is obtained. Light emission is extracted outside through one or both of the first electrode 202 and the second electrode 204. Therefore, one or both of the first electrode 202 and the second electrode 204 is a light-transmissive electrode.

Figure 3A:
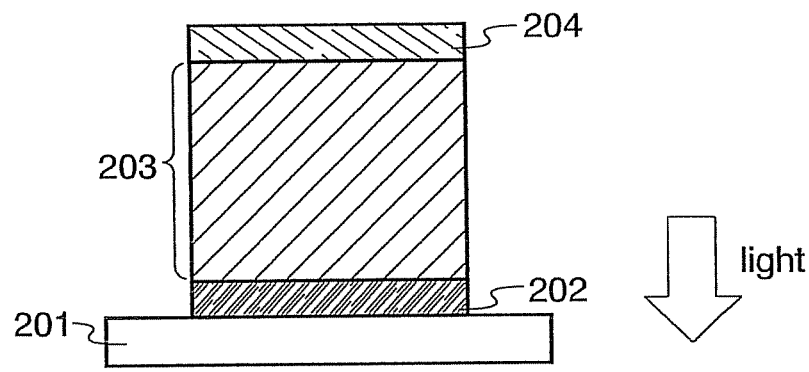
FIGS. 3A to 3C illustrate examples of the light emission of the light-emitting element of the invention shown in Embodiment Mode 1.
Figure 3B:
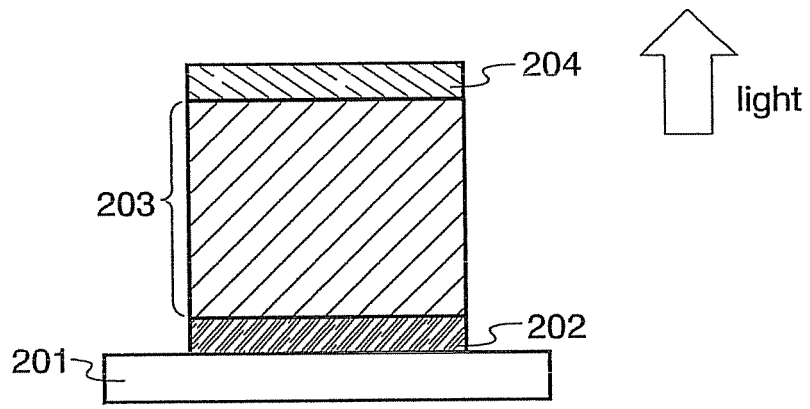
Figure 3C:
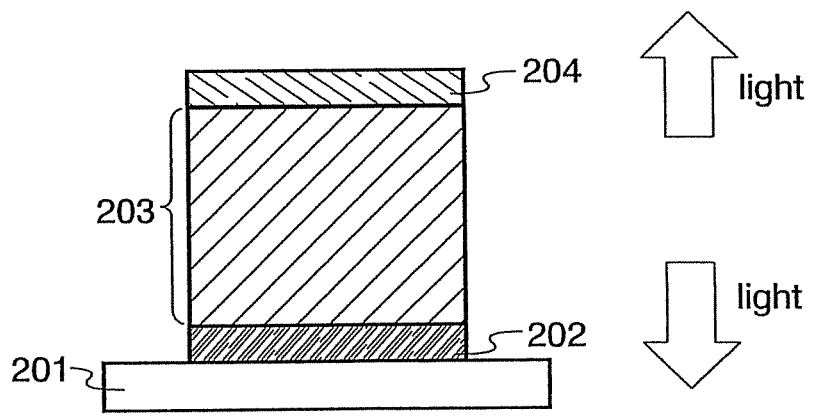

When only the first electrode 202 is a light-transmissive electrode, light emission is extracted from the substrate side through the first electrode 202 as shown in FIG. 3A. Meanwhile, when only the second electrode 204 is a light-transmissive electrode, light emission is extracted from a side opposite to the substrate side through the second electrode 204 as shown in FIG. 3B. When both of the first electrode 202 and the second electrode 204 are light-transmissive electrodes, light emission is extracted from both the substrate side and the side opposite to the substrate side through the first electrode 202 and the second electrode 204 as shown in FIG. 3C.

Note that the structure of the layers provided between the first electrode 202 and the second electrode 204 is not limited to the above structure. Any structure other than the above structure can be employed as long as a light-emitting region for recombination of holes and electrons is positioned away from the first electrode 202 and the second electrode 204, and also a layer for controlling the movement of carriers is provided so as to prevent quenching which would otherwise be caused by the proximity of the light-emitting region to metal.

That is, the stacked structure of the layers is not particularly limited. It is acceptable as long as layers made of a compound with a high electron transporting property, a compound with a high hole transporting property, a compound with a high electron injection property, a compound with a high hole injection property, and a compound with a bipolar property (a compound having both high electron and hole transporting properties) are appropriately combined with the layer for controlling the movement of carriers and the light-emitting layer that are shown in this embodiment mode.

Figure 1B:
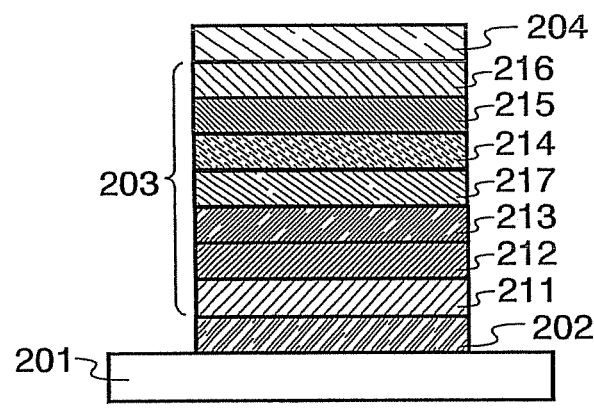

Note that the layer for controlling the movement of carriers shown in this embodiment mode is a layer for controlling the movement of electrons. Therefore, it is preferably provided at a position closer to the electrode functioning as the cathode than the light-emitting layer is. For example, as shown in FIG. 1B, a seventh layer 217 containing a compound with a high electron transporting property may be provided between the third layer 213 having the light-emitting function and the fourth layer 214 that is the layer for controlling the movement of carriers.

More preferably, the layer for controlling the movement of carriers is desirably provided to be in contact with the light-emitting layer. When the layer for controlling the movement of carriers is provided to be in contact with the light-emitting layer, electron injection to the light-emitting layer can be directly controlled. Therefore, changes in carrier balance over time in the light-emitting layer can be controlled more efficiently, whereby the lifetime of the element can be more effectively prolonged. In addition, since the seventh layer 217 containing a compound with a high electron transporting property is not required, the process can be simplified.

Note that when the layer for controlling the movement of carriers is provided to be in contact with the light-emitting layer, it is preferable that the first organic compound contained in the layer for controlling the movement of carriers be different from an organic compound which is contained in large quantities in the light-emitting layer. In particular, when the light-emitting layer contains a compound (a third organic compound) in which a highly light-emissive compound is dispersed and a highly light-emissive compound (a fourth organic compound), it is desirable that the third organic compound and the first organic compound be different organic compounds. With such a structure, the movement of carriers (in this embodiment mode, electrons) which travel from the layer for controlling the movement of carriers toward the light-emitting layer can be controlled even between the first organic compound and the third organic compound. Thus, the advantageous effect of providing the layer for controlling the movement of carriers can be further increased.

In addition, the light-emitting element shown in FIG. 2A has a structure in which the second electrode 204 functioning as the cathode, the EL layer 203, and the first electrode 202 functioning as the anode are sequentially stacked over the substrate 201. The EL layer 203 includes the first layer 211, the second layer 212, the third layer 213, the fourth layer 214, the fifth layer 215, and the sixth layer 216. The fourth layer 214 is provided at a position closer to the second electrode functioning as the cathode than the third layer 213 is.

In this embodiment mode, the light-emitting element is formed over a substrate made of glass, plastic, or the like. When a plurality of such light-emitting elements is formed over one substrate, a passive matrix light-emitting device can be formed. In addition, it is also possible to form, for example, thin film transistors (TFTs) over a substrate made of glass, plastic, or the like and form light-emitting elements on electrodes that are electrically connected to the TFTs. Accordingly, an active matrix light-emitting device in which drive of the light-emitting elements is controlled with the TFTs can be formed.

Note that the structure of the TFTs is not particularly limited. Either staggered TFTs or inversely staggered TFTs may be employed. In addition, a driver circuit formed on the TFT substrate may be constructed from both n-channel and p-channel TFTs or from one of n-channel and p-channel TFTs. Further, the crystallinity of a semiconductor film used for forming the TFTs is not specifically limited. Either an amorphous semiconductor film or a crystalline semiconductor film may be used.

A light-emitting element of the invention includes a layer for controlling the movement of carriers. The layer for controlling the movement of carriers contains at least two kinds of compounds. Therefore, by controlling the compatibility of compounds, the mixture ratio thereof, the thickness of the layer, and the like, carrier balance can be precisely controlled. Further, since the carrier balance can be controlled by controlling the compatibility of compounds, the mixture ratio thereof, the thickness of the layer, and the like, carrier balance can be more easily controlled than in a conventional light-emitting element. That is, the movement of carriers can be controlled not by changing the physical properties of the material but by controlling the mixture ratio, the thickness of the layer, and the like.

When the carrier balance is improved by using the layer for controlling the movement of carriers, the luminous efficiency of the light-emitting element can be improved. Further, using the layer for controlling the movement of the carriers makes it possible to prevent excessive electrons from being injected and also prevent electrons from penetrating the light-emitting layer to reach the hole transporting layer or the hole injection layer. When electrons have reached the hole transporting layer or the hole injection layer, the recombination probability in the light-emitting layer decreases (i.e., carrier balance is lost), which could result in the decrease in luminous efficiency over time. That is, the lifetime of the light-emitting element becomes shorter.

However, by using the layer for controlling the movement of carriers as shown in this embodiment mode, it becomes possible to prevent excessive electrons from being injected and also prevent electrons from penetrating the light-emitting layer to reach the hole transporting layer or the hole injection layer. Therefore, a decrease in luminous efficiency over time can be suppressed. That is, a long-lifetime light-emitting element can be obtained. To be more specific, between the two or more kinds of compounds contained in the layer for controlling the movement of carriers, the second organic compound which has a lower weight percent than the weight percent of the first organic compound is used for controlling the movement of carriers. Therefore, the movement of carriers can be controlled with a component having the lowest weight percent of all of the components contained in the layer for controlling the movement of carriers. Thus, a long-lifetime light-emitting element which does not easily deteriorate over time can be obtained.

That is, carrier balance changes less easily than the case where the carrier balance is controlled with a single compound. For example, when the movement of carriers is controlled by a layer made of a single compound, the balance of the whole layer is changed by a partial change in morphology or by partial crystallization. Therefore, such a light-emitting element will easily deteriorate over time. However, as shown in this embodiment mode, when the movement of carriers is controlled with a component having the lowest weight percent of all the components contained in the layer for controlling the movement of carriers, it is possible to reduce the effects of morphological change, crystallization, aggregation, or the like, whereby deterioration over time can be suppressed. Therefore, a long-lifetime light-emitting element whose luminous efficiency will not easily decrease over time can be obtained.

As shown in this embodiment mode, a structure in which the layer for controlling the movement of carriers is provided between the light-emitting layer and the second electrode functioning as the cathode is particularly effective for a light-emitting element having excessive electrons. For example, the structure shown in this embodiment mode is particularly effective for the case where the light-emitting layer has an electron transporting property and the proportion of electrons injected from the second electrode which penetrate the light-emitting layer possibly increases over time. Note that this embodiment mode can be combined with other embodiment modes as appropriate.

Embodiment Mode 2

Figure 5A:
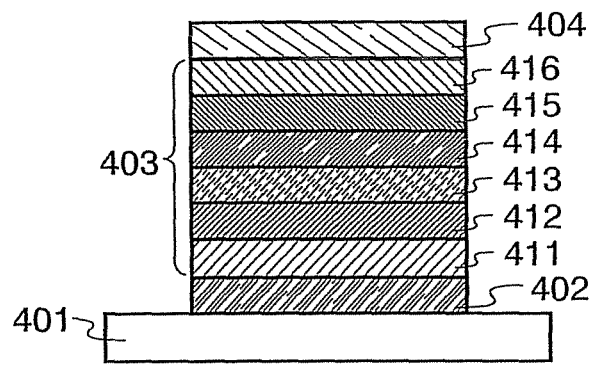
FIGS. 5A and 5B illustrate light-emitting elements of the invention shown in Embodiment Mode 2.

This embodiment mode will describe one example of a light-emitting element of the invention which differs from that shown in Embodiment Mode 1, with reference to FIG. 5A. This embodiment mode illustrates a light-emitting element which includes a layer for controlling the movement of holes as a layer for controlling the movement of carriers. The light-emitting element of the invention has a plurality of layers between a pair of electrodes. The plurality of layers is stacked by combining layers made of a compound with a high carrier injection property and a compound with a high carrier transporting property so that a light-emitting region is formed at a position away from the electrodes, i.e., so that carriers are recombined at a position away from the electrodes.

In this embodiment mode, a light-emitting element includes a first electrode 402, a second electrode 404, and an EL layer 403 provided between the first electrode 402 and the second electrode 404. Note that in this embodiment mode, description will be made on the assumption that the first electrode 402 functions as an anode and the second electrode 404 functions as a cathode. That is, light emission is obtained when a voltage is applied to the first electrode 402 and the second electrode 404 so that the potential of the first electrode 402 is higher than the potential of the second electrode 404.

The substrate 401 can be similar to that described in Embodiment Mode 1. The first electrode 402 is preferably formed using a material with a high work function (i.e., 4.0 eV or higher) such as metals, alloys, electrically conductive compounds, or a mixture of them. Thus, a material similar to that described in Embodiment Mode 1 can be used.

The EL layer 403 includes a first layer 411, a second layer 412, a third layer 413, a fourth layer 414, a fifth layer 415, and a sixth layer 416. Note that it is acceptable as long as the EL layer 403 includes a layer for controlling the movement of carriers and a light-emitting layer that are shown in this embodiment mode. Thus, the structure of the other stacked layers is not specifically limited. For example, the EL layer 403 can be formed by appropriate combination of a hole injection layer, a hole transporting layer, a light-emitting layer, a layer for controlling the movement of carriers, an electron transporting layer, an electron injection layer, and the like.

The first layer 411 is a layer containing a compound with a high hole injection property, and a material similar to that described in Embodiment Mode 1 can be used. The second layer 412 is a layer containing a compound with a high hole transporting property, and a material similar to that described in Embodiment Mode 1 can be used.

The third layer 413 is a layer for controlling the movement of carriers. The third layer 413 contains at least two kinds of compounds. In the third layer 413, the weight percent of the first organic compound is higher than that of the second organic compound. This embodiment mode will describe the case where the layer for controlling the movement of carriers is provided at a position closer to the first electrode functioning as the anode than the light-emitting layer is. That is, the case where the layer for controlling the movement of carriers is provided between the fourth layer 414 having the light-emitting function and the first electrode 402 will be described.

When the layer for controlling the movement of carriers is provided at a position closer to the first electrode functioning as the anode than the light-emitting layer is, the first organic compound is preferably an organic compound having a hole transporting property. That is, the first organic compound is preferably a compound whose hole transporting property is higher than the electron transporting property. In addition, the second organic compound is preferably an organic compound having a function of trapping holes. That is, the second organic compound is preferably an organic compound whose highest occupied molecular orbital (HOMO) level is higher than that of the first organic compound by 0.3 eV or more. When the layer for controlling the movement of carriers includes the second organic compound, the electron transporting speed of the layer as a whole can be lower as compared with the case where the layer is made of only the first organic compound. That is, adding the second organic compound makes it possible to control the movement of carriers. Further, controlling the concentration of the second organic compound makes it possible to control the movement speed of carriers. The concentration of the second organic compound is preferably in the range of 0.1 wt % to 5 wt % or in the rage of 0.1 mol % to 5 mol %.

Examples of the second organic compound include CuPC, DNTPD, DPAB, bis[2-phenylpyridinato-N,$C^{2'}$]iridium(III) acetylacetonate (abbreviation: (abbreviation: Ir(ppy)$_2$acac), (acetylacetonato)bis[10-(2-pyridyl)phenoxazinato]iridium (III) (abbreviation: Ir(ppx)$_2$(acac)), tris(2-phenylpyridinato-N,$C^{2'}$)iridium(III) (abbreviation: Ir(ppy)$_3$), bis[2-(2'-benzo[4,5-a]thienyl)pyridinato-N,$C^{3'}$]iridium(III) acetylacetonate (abbreviation: Ir(btp)$_2$(acac)), N,N''-(2-tert-butylanthracene-9,10-diyldi-4,1-phenylene)bis[N,N',N'-triphenyl-1,4-phenylenediamine](abbreviation: DPABPA), and the like.

The above-described compounds are compounds having particularly high HOMO levels among compounds that are used for light-emitting elements. Thus, when such compounds are added to the first organic compound which will be described later, an excellent hole trapping property can be obtained. The second organic compound may emit light. In that case, it is preferable that the emission colors of the light-emitting layer and the second organic compound be similar colors in order to keep the color purity of the light-emitting element.

In addition, the first organic compound contained in the third layer 413 is an organic compound having a hole transporting property. That is, the first organic compound is a compound whose hole transporting property is higher than the electron transporting property. Specifically, condensed aromatic hydrocarbons such as 9,10-diphenylanthracene (abbreviation: DPAnth) and 6,12-dimethoxy-5,11-diphenylchrysene can be used.

Alternatively, the following aromatic amine compounds can be used: N,N-dipheyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}9H-carbazol-3-amine (abbreviation: PCAPBA), N-(9,10-diphenyl-2-anthryl)-N,9-diphenyl-9H-carbazol-3-amine (abbreviation: 2PCAPA), NPB (or α-NPD), TPD, DFLDPBi, BSPB, and 2,3-bis{4-[N-(4-biphenylyl)-N-phenylamino]phenyl}quinoxaline (abbreviation: BPAPQ). Further, high molecular compounds such as s PVK, PVTPA, PTPDMA, and Poly-TPD can also be used.

Above all, aromatic amine compounds that are stable against holes are preferably used. In addition, as mentioned earlier, in Embodiment Mode 2, the second organic compound should be a compound having a hole trapping property. Therefore, the HOMO level of the second organic compound is preferably higher than that of the first organic compound by 0.3 eV or more. Therefore, it is acceptable as long as the first organic compound is appropriately selected so as to satisfy the above condition according to the kind of compound used for the second organic compound.

Note that it is preferable that the emission colors of the highly light-emissive compound contained in the fourth layer 414 and the second organic compound contained in the third layer 413 be similar colors. Therefore, it is preferable that a difference in peak values between the emission spectrum of the highly light-emissive compound and the emission spectrum of the second organic compound be within the range of 30 nm. When the difference in peak values is within the range of 30 nm, the emission colors of the highly light-emissive compound and the second organic compound can be similar colors. Therefore, even when the second organic compound unintendedly emits light due to changes in voltage or the like, changes in emission color can be suppressed.

When the highly light-emissive compound has higher luminous efficiency than the second organic compound, it is preferable to control the concentration of the second organic compound in the third layer 413 so that only the light emission of the highly light-emissive compound can be substantially obtained (by setting the concentration of the second organic compound to be slightly lower than that of the highly light-emissive compound so that the light emission of the second organic compound can be suppressed). In that case, the emission colors of the highly light-emissive compound and the second organic compound are similar colors (i.e., they have about the same level of energy gap). Therefore, there is little possibility that energy will transfer from the highly light-emissive compound toward the second organic compound, and thus high luminous efficiency can be obtained.

FIG. 8 exemplarily illustrates a band diagram of the light-emitting element of the invention shown in FIG. 5A. In FIG. 8, electrons injected from the second electrode 404 pass through the sixth layer 416 containing a compound with a high electron injection property and further through the fifth layer 415 containing a compound with a high electron transporting property. Then, the electrons are injected to the fourth layer 414 containing a highly light-emissive compound. On the other hand, holes injected form the first electrode 402 pass through the first layer 411 containing a compound with a high hole injection property and further through the second layer 412 containing a compound with a high hole transporting property. Then, the holes are injected to the third layer 413 that is the layer for controlling the movement of carriers. The movement speed of the holes injected to the layer for controlling the movement of carriers is retarded by the second organic compound having a hole trapping property. The holes whose movement speed has been retarded are injected to the fourth layer 414 containing a highly light-emissive compound, and then recombined with holes. Thus, light emission is obtained.

When the fourth layer 414 has a hole transporting property, for example, the movement speed of the electrons that are injected form the fifth layer 145 to the fourth layer 414 is retarded. In addition, the movement speed of the holes that are injected from the third layer 413 to the fourth layer 414 is even slow in the fourth layer 414 because it has already been retarded in the third layer 413. Therefore, holes of a slow movement speed and electrons of a slow movement speed are recombined in the fourth layer 414, whereby the recombination probability is increased and luminous efficiency is improved.

In the case of a conventional light-emitting element which does not include the third layer 413, the movement speed of holes is not retarded but the holes are directly injected to the fourth layer 414. Thus, the holes reach the vicinity of the interface between the fourth layer 414 and the fifth layer 415. In that case, there is a possibility that the holes may reach and deteriorate the fifth layer 415. Further, when the amount of holes that have reached the fifth layer 415 is increased over time, the recombination probability in the light-emitting layer is decreased over time, which leads to a shorter lifetime of the element (luminance decay over time).

In the light-emitting element of the invention, holes injected from the first electrode 402 pass through the first layer 411 containing a compound with a high hole injection property and further through the second layer 412 containing a compound with a high hole transporting property. Then, the holes are injected to the third layer 413 that is the layer for controlling the movement of carriers. Here, the third layer 413 has a structure in which the second organic compound having a function of trapping holes is added to the first organic compound having a hole transporting property. Therefore, the movement speed of the holes that are injected to the third layer 413 is retarded and the hole injection to the fourth layer 414 is controlled.

As a result, a light-emitting region, which has conventionally been formed in the vicinity of the interface between the fifth layer 415 containing a compound with a high electron transporting property and the fourth layer 414, is formed around a region from the fourth layer 414 to the vicinity of the interface between the fourth layer 414 and the third layer 413. Therefore, there is low possibility that holes may reach and deteriorate the fifth layer 415 which contains a compound with a high electron transporting property. Similarly, as for electrons, there is also low possibility that electrons may reach and deteriorate the second layer 412 which contains a compound with a high hole transporting property because the third layer 413 contains the first organic compound having a hole transporting property.

Further, it is an important point of the invention that not merely a compound with low hole mobility is applied to the third layer 413 but an organic compound having an a function of trapping holes is added to an organic compound having a hole transporting property. With such a structure, it becomes possible not only to control the hole injection to the fourth layer 414 but also to suppress changes in the controlled amount of hole injection over time. Therefore, the light-emitting element of the invention can prevent a phenomenon that carrier balance is lost over time, which could otherwise lower the recombination probability. Thus, the lifetime of the element can be improved (luminance decay over time can be suppressed).

In the light-emitting element of the invention, the light-emitting region is not formed at the interface between the light-emitting layer and the hole transporting layer or the interface between the light-emitting layer and the electron transporting layer. Therefore, there is no adverse effect of deterioration which would otherwise be caused if the light-emitting region is positioned close to the hole transporting layer or the electron transporting layer. Further, changes in carrier balance over time (in particular, changes in amount of electron injection over time) can be suppressed. Therefore, a long-lifetime light-emitting element which does not easily deteriorate can be obtained.

In addition, it is preferable that the emission colors of the second organic compound contained in the third layer 413 and the highly light-emissive compound contained in the fourth layer 414 be similar colors. Specifically, it is preferable that a difference in peak values between the emission spectrum of the second organic compound and the highly light-emissive compound be within the range of 30 nm. When the difference in peak values is within the range of 30 nm, the emission colors of the second organic compound and the highly light-emissive compound can be similar colors. Therefore, even when the second organic compound unintendedly emits light due to changes in voltage or the like, changes in emission color can be suppressed.

In addition, the thickness of the third layer 413 that is the layer for controlling the movement of carriers is preferably in the range of 5 to 20 nm. When the third layer 413 is too thick, the movement speed of carriers becomes too slow, which could result in high driving voltage. When the third layer 413 is too thin, on the other hand, it is impossible to implement the function of controlling the movement of carriers. Therefore, the thickness of the third layer 413 is preferably in the range of 5 to 20 nm. The fourth layer 414 is a layer containing a highly light-emissive compound, and a compound similar to that described in Embodiment Mode 1 can be used. Further, a phosphorescent material such as (acetylacetonato)bis[2,3-bis (4-fluorophenyl)quinoxalinato]iridium(I) (abbreviation: Ir(Fdpq)$_2$(acac)) can also be used.

When a phosphorescent material is used as the highly light-emissive compound, the second organic compound contained in the third layer 413 is also preferably a phosphorescent material such as Ir(ppy)$_2$(acac), Ir(ppx)$_2$(acac), Ir(ppy)$_3$, or Ir(btp)$_2$(acac). For example, when Ir(Fdpq)$_2$(acac) which exhibits red light emission is used for the highly light-emissive compound, it is preferable to use Ir(btp)$_2$(acac) which exhibits light emission of a similar red color for the second organic compound contained in the third layer 413. Further, the light-emitting layer may also have a structure in which a highly light-emissive compound is dispersed in another compound as described in Embodiment Mode 1.

Note that in this embodiment mode, the layer for controlling the movement of carriers is provided between the light-emitting layer and the first electrode functioning as the anode. Therefore, the light-emitting layer preferably has a hole transporting property. That is, the hole transporting property of the light-emitting layer is preferably higher than the electron transporting property thereof. Conventionally, when a light-emitting layer has a hole transporting property, a hole blocking layer has been provided between the light-emitting layer and a cathode in order to prevent holes from penetrating the light-emitting layer. However, when the hole blocking layer has deteriorated over time, a recombination region expands to the inside of the hoe blocking layer (or inside of the electron transporting layer), which could result in a significant decrease in current efficiency (i.e., luminance decay). Meanwhile, in the invention, the movement of holes is controlled before the holes reach the light-emitting layer (between the light-emitting layer and the anode). Therefore, even when the balance of holes (e.g., mobility or the amount of holes relative to that of electrons) is somewhat lost, the proportion of recombination in the light-emitting layer hardly changes, which is advantageous in that luminance does not easily decay.

Therefore, it is preferable to use an organic compound with a hole transporting property as the material in which the highly light-emissive compound is dispersed that is described in Embodiment Mode 1. Specifically, the following can be used: condensed aromatic hydrocarbons such as DPAnth and 6,12-dimethoxy-5,11-diphenylchrysene, or aromatic amine compounds such as CzA1PAA, DPhPA, PCAPA, PCAPBa, 2PCAPA, NPB (or α-NPD), TPD, DFLDPBi, and BSPB.

The fifth layer 415 is a layer containing a compound with a high electron transporting property, and a compound similar to that described in Embodiment Mode 1 can be used. The sixth layer 416 is a layer containing a compound with a high electron injection property, and a compound similar to that described in Embodiment Mode 1 can be used.

As a method forming the EL layer, various methods can be used regardless of a dry process or a wet process. For example, a vacuum deposition method, an ink-jet method, a spin coating method, or the like can be used. Further, different deposition methods may be used for different electrodes or different layers. For example, among the above-described materials, a high molecular compound may be selected to form the EL layer by a wet process. Alternatively, a low molecular organic compound may be selected to form the EL layer by a wet process. Further, it is also possible to form the EL layer by selecting a low molecular organic compound and using a dry process such as a vacuum deposition method. Similarly, the electrodes can be formed by a wet process such as a sol-gel process or by a wet process with a paste of a metal material. Alternatively, the electrodes can be formed by a dry process such as a sputtering method or a vapor deposition method.

A specific method for forming the light-emitting element will be described below. In the case where the light-emitting element of the invention is applied to a display device and its light-emitting layer is selectively deposited according to each color, the light-emitting layer is preferably formed by a wet process. When the light-emitting layer is formed by an ink-jet method, selective deposition of the light-emitting layer for each color can be easily performed even when a large substrate is used.

For example, the structure shown in FIG. 5A can be obtained by the steps of: forming the first electrode by a sputtering method which is a dry process, forming the first layer by an ink-jet method or a spin coating method which is a wet process, forming the second layer by a vacuum deposition method which is a dry process, forming the third layer by an ink-jet method which is a wet process, forming the fourth layer by a co-deposition method which is a dry process, forming the fifth layer and the sixth layer by a vacuum deposition method which is a dry process, and forming the second electrode by an ink-jet method or a spin coating method which is a wet process.

Alternatively, the structure shown in FIG. 5A may be obtained by the steps of: forming the first electrode by a ink-jet method which is a wet process, forming the first layer by a vacuum deposition method which is a dry process, forming the second layer by an ink-jet method or a spin coating method which is a wet process, forming the third layer by an ink-jet method which is a wet process, forming the fourth layer by an ink-jet method or a spin coating method which is a wet process, forming the fifth layer and the sixth layer by an ink-jet method or a spin coating method which is a wet process, and forming the second electrode by an ink-jet method or a spin coating method which is a wet process. Note that the deposition methods are not limited to the above methods, and a wet process and a dry process may be combined as appropriate.

To be more specific, the structure shown in FIG. 5A can be obtained by the steps of: forming the first electrode by a sputtering method which is a dry process, forming the first layer and the second layer by a vacuum deposition method which is a dry process, forming the third layer by a co-deposition method which is a dry process, forming the fourth layer which is a light-emitting layer by an ink-jet method which is a wet process, forming the fifth layer by an ink-jet method or a spin coating method which is a wet process, not forming the sixth layer, and forming the second electrode by an ink-jet method or a spin coating method which is a wet process.

That is, the first electrode to the third layer can be formed by dry processes, while the fourth layer to the second electrode can be formed by wet processes. By this method, the first electrode to the third layer can be consecutively formed in vacuum, and the fourth layer to the second electrode can be formed at atmospheric pressure. In addition, selective deposition of the fourth layer for each color can be easily performed. Therefore, the process can be simplified and productivity can be improved.

Figure 6A:
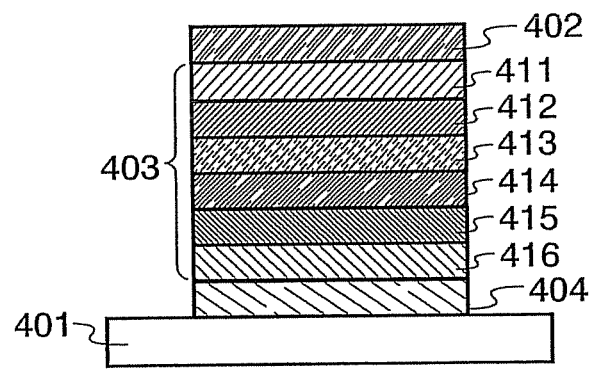
FIGS. 6A and 6B illustrate light-emitting elements of the invention having different structures from those in FIGS. 5A and 5B of Embodiment Mode 2.
Figure 6B:
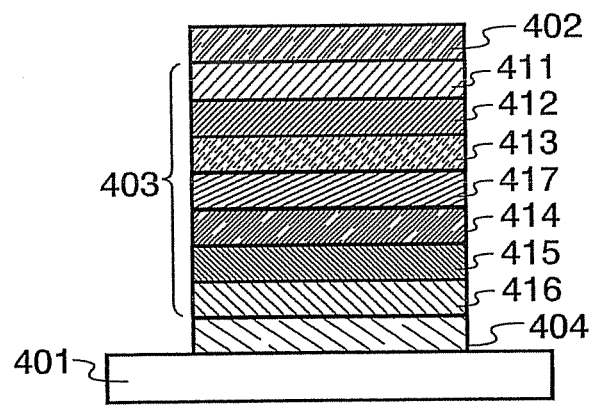

Meanwhile, a structure shown in FIG. 6A can be formed in the reverse order of the above-described steps: forming the second electrode by an ink-jet method or a spin coating method which is a wet process, forming the sixth layer and the fifth layer by an ink-jet method or a spin coating method which is a wet process, forming the fourth layer by an ink-jet method which is a wet process, forming the third layer by a co-deposition method which is a dry process, forming the second layer and the first layer by a vacuum deposition method which is a dry process, and forming the first electrode by a vacuum deposition method which is a dry process. By this method, the second electrode to the fourth layer can be formed at atmospheric pressure, and the third layer to the first electrode can be consecutively formed in vacuum by dry processes. Therefore, the process can be simplified and productivity can be improved.

In the light-emitting element of the invention having the above structure, a current flows due to a potential difference generated between the first electrode 402 and the second electrode 404, whereby holes and electrons are recombined in the EL layer 403 and light emission is obtained. Light emission is extracted outside through one or both of the first electrode 402 and the second electrode 404. Therefore, one or both of the first electrode 402 and the second electrode 404 is a light-transmissive electrode.

Figure 7A:
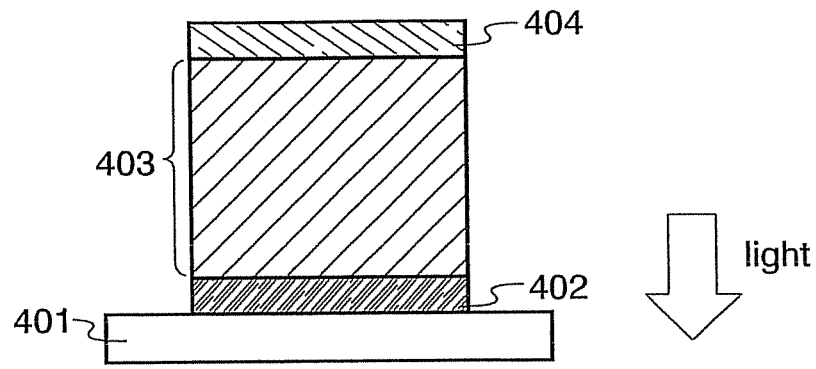
FIGS. 7A to 7C illustrate examples of the light emission of the light-emitting element of the invention shown in Embodiment Mode 2.
Figure 7B:
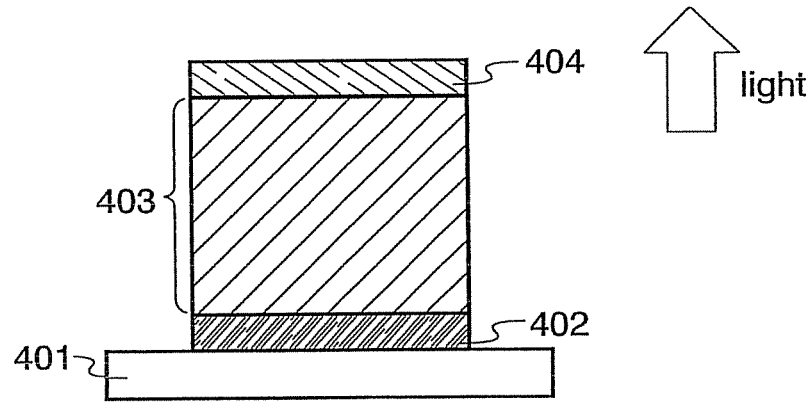
Figure 7C:
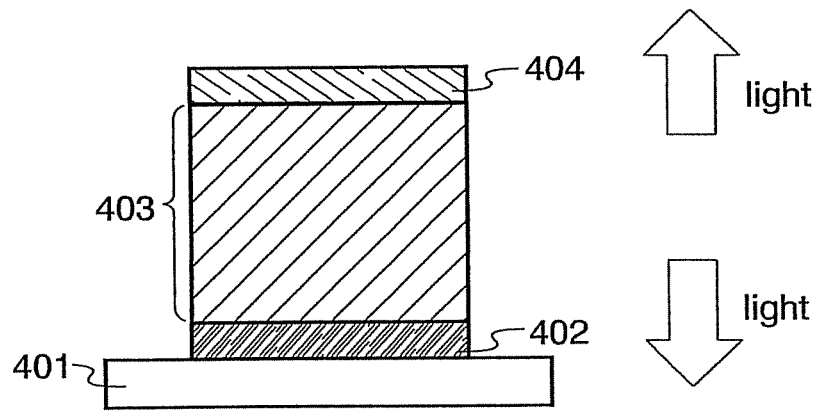

When only the first electrode 402 is a light-transmissive electrode, light emission is extracted from the substrate side through the first electrode 402 as shown in FIG. 7A. Meanwhile, when only the second electrode 404 is a light-transmissive electrode, light emission is extracted from a side opposite to the substrate side through the second electrode 404 as shown in FIG. 7B. When both of the first electrode 402 and the second electrode 404 are light-transmissive electrodes, light emission is extracted from both the substrate side and the side opposite to the substrate side through the first electrode 402 and the second electrode 404 as shown in FIG. 7C.

Note that the structure of the layers provided between the first electrode 402 and the second electrode 404 is not limited to the above structure. That is, in the invention and in this embodiment mode, any structure other than the above structure may be employed as long as a light-emitting region for recombination of holes and electrons is positioned away from the first electrode 402 and the second electrode 404, and also a layer for controlling the movement of carriers is provided so as to prevent quenching which would otherwise be caused by the proximity of the light-emitting region to metal.

That is, the stacked structure of the layers is not particularly limited. It is acceptable as long as layers made of a compound with a high electron transporting property, a compound with a high hole transporting property, a compound with a high electron injection property, a compound with a high hole injection property, and a compound with a bipolar property (a compound having both high electron and hole transporting properties) are appropriately combined with the layer for controlling the movement of carriers and the light-emitting layer that are shown in this embodiment mode.

Figure 5B:
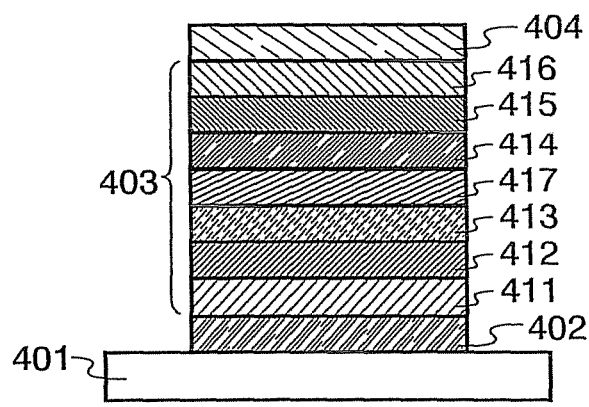

Note that the layer for controlling the movement of carriers shown in this embodiment mode is a layer for controlling the movement of holes. Therefore, it is preferably provided at a position closer to the electrode functioning as the anode than the light-emitting layer is. For example, as shown in FIG. 5B, a seventh layer 417 containing a compound with a high hole transporting property may be provided between the fourth layer 414 having the light-emitting function and the third layer 413 that is the layer for controlling the movement of carriers.

More preferably, the layer for controlling the movement of carriers is desirably provided to be in contact with the light-emitting layer. When the layer for controlling the movement of carriers is provided to be in contact with the light-emitting layer, hole injection to the light-emitting layer can be directly controlled. Therefore, changes in carrier balance over time in the light-emitting layer can be controlled more efficiently, whereby the lifetime of the element can be more effectively prolonged. In addition, since the seventh layer containing a compound with a high hole transporting property is not required, the process can be simplified.

Note that when the layer for controlling the movement of carriers is provided to be in contact with the light-emitting layer, it is preferable that the first organic compound contained in the layer for controlling the movement of carriers be different from an organic compound which is contained in large quantities in the light-emitting layer. In particular, when the light-emitting layer contains a compound (a third organic compound) in which a highly light-emissive compound is dispersed and a highly light-emissive compound (a fourth organic compound), it is desirable that the third organic compound and the first organic compound be different organic compounds. With such a structure, the movement of carriers (in this embodiment mode, holes) can be controlled even between the first organic compound and the third organic compound. Thus, the advantageous effect of providing the layer for controlling the movement of carriers can be further increased.

In addition, the light-emitting element shown in FIG. 6A has a structure in which the second electrode 404 functioning as the cathode, the EL layer 203, and the first electrode 402 functioning as the anode are sequentially stacked over the substrate 401. The EL layer 403 includes the first layer 411, the second layer 412, the third layer 413, the fourth layer 414, the fifth layer 415, and the sixth layer 416. The third layer 413 is provided at a position closer to the first electrode functioning as the anode than the fourth layer 414 is.

The light-emitting element of the invention includes a layer for controlling the movement of carriers. The layer for controlling the movement of carriers contains at least two kinds of compounds. Therefore, by controlling the compatibility of compounds, the mixture ratio thereof, the thickness of the layer, and the like, carrier balance can be precisely controlled. Further, since the carrier balance can be controlled by controlling the compatibility of compounds, the mixture ratio thereof, the thickness of the layer, and the like, carrier balance can be more easily controlled than in a conventional light-emitting element. That is, the movement of carriers can be controlled not by changing the physical properties of the material but by controlling the mixture ratio, the thickness of the layer, and the like.

When the carrier balance is improved by using the layer for controlling the movement of carriers, the luminous efficiency of the light-emitting element can be improved. Further, using the layer for controlling the movement of the carriers makes it possible to prevent excessive holes from being injected and also prevent holes from penetrating the light-emitting layer to reach the electron transporting layer or the electron injection layer. When holes have reached the electron transporting layer or the electron injection layer, the recombination probability in the light-emitting layer decreases (i.e., carrier balance is lost), which could result in the decrease in luminous efficiency over time. That is, the lifetime of the light-emitting element becomes shorter.

However, by using the layer for controlling the movement of carriers as shown in this embodiment mode, it becomes possible to prevent excessive holes from being injected and also prevent holes from penetrating the light-emitting layer to reach the electron transporting layer or the hole injection layer. Therefore, a decrease in luminous efficiency over time can be suppressed. That is, a long-lifetime light-emitting element can be obtained.

To be more specific, between the two or more kinds of compounds contained in the layer for controlling the movement of carriers, the second organic compound which has a lower weight percent than the weight percent of the first organic compound is used for controlling the movement of carriers. Therefore, the movement of carriers can be controlled with a component having the lowest weight percent of all of the components contained in the layer for controlling the movement of carriers. Thus, a long-lifetime light-emitting element which does not easily deteriorate over time can be obtained.

For example, when the movement of carriers is controlled by a layer made of a single compound, the balance of the whole layer is changed by a partial change in morphology or by partial crystallization. Therefore, such a light-emitting element will easily deteriorate over time. However, as shown in this embodiment mode, when the movement of carriers is controlled with a component having the lowest weight percent of all the components contained in the layer for controlling the movement of carriers, it is possible to reduce the effects of morphological change, crystallization, aggregation, or the like, whereby deterioration over time can be suppressed. Therefore, a long-lifetime light-emitting element whose luminous efficiency will not easily decrease over time can be obtained.

As shown in this embodiment mode, a structure in which the layer for controlling the movement of carriers is provided between the light-emitting layer and the first electrode functioning as the anode is particularly effective for a light-emitting element having excessive holes. For example, the structure shown in this embodiment mode is particularly effective for the case where the light-emitting layer has a hole transporting property and the proportion of holes injected from the first electrode which penetrate the light-emitting layer possibly increases over time.

Note that this embodiment mode can be combined with other embodiment modes as appropriate. For example, a layer for controlling the movement of holes may be provided between the light-emitting layer and the first electrode functioning as the anode, and also a layer for controlling the movement of electrons may be provided between the light-emitting layer and the second electrode functioning as the cathode. That is, when such a structure is employed, it becomes possible to provide layers for controlling the movement of carriers on opposite sides of the light-emitting layer, which is more preferable in that carriers can be recombined on opposite sides of the light-emitting layers at positions away from the electrodes. As a result, the movement of carriers is controlled on opposite sides of the light-emitting layer, whereby the effects of morphological change, crystallization, aggregation, or the like can be further reduced, and deterioration over time can be suppressed. Therefore, a long-lifetime light-emitting element whose luminous efficiency will not easily decrease over time can be obtained.

Embodiment Mode 3

Figure 9:
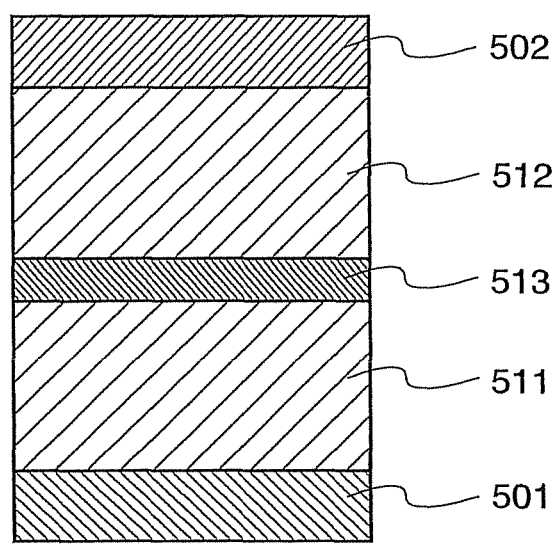
FIG. 9 illustrates a light-emitting element in which a plurality of light-emitting units in Embodiment Mode 3 is stacked.

This embodiment mode will describe a light-emitting element in which a plurality of light-emitting units in accordance with the invention is stacked, with reference to FIG. 9. The light-emitting element is a stacked-type light-emitting element which has a plurality of light-emitting units between a first electrode and a second electrode. A structure similar to that of the EL layer 203 shown in Embodiment Mode 1 or the EL layer 403 shown in Embodiment Mode 2 can be used for each light-emitting unit. In other words, the light-emitting element described in each of Embodiment Modes 1 and 2 is a light-emitting element having a single light-emitting unit. In this embodiment mode, a light-emitting element having a plurality of light-emitting units will be described.

In FIG. 9, a first light-emitting unit 511 and a second light-emitting unit 512 are stacked between a first electrode 501 and a second electrode 502. A charge generation layer 513 is provided between the first light-emitting unit 511 and the second light-emitting unit 512. An electrode similar to that shown in Embodiment Mode 1 can be applied to the first electrode 501 and the second electrode 502. The first light-emitting unit 511 and the second light-emitting unit 512 may have either the same structure or different structures, and a structure similar to those shown in Embodiment Modes 1 and 2 can be applied.

The charge generation layer 513 contains a composite material of an organic compound and metal oxide. The composite material of an organic compound and metal oxide is described in Embodiment Mode 1, and includes an organic compound and metal oxide such as vanadium oxide, molybdenum oxide, or tungsten oxide. As the organic compound, various compounds such as aromatic amine compounds, carbazole derivatives, aromatic hydrocarbons, and high molecular compounds (e.g., oligomer, dendrimer, or polymer) can be used. It is preferable to use an organic compound having a hole mobility of greater than or equal to 106 $cm^2$/Vs as the organic compound having a hole transporting property. However, other compounds than these compounds may also be used as long as the hole transporting properties thereof are higher than the electron transporting properties thereof. The composite material of an organic compound and metal oxide is superior in carrier injection property and carrier transporting property, and therefore, low-voltage driving and low-current driving can be realized.

Note that the charge generation layer 513 may be formed with a combination of a layer containing a composite material of an organic compound and metal oxide and other materials. For example, the charge generation layer 513 may be formed with a combination of a layer containing the composite material of an organic compound and metal oxide and a layer containing one compound selected from electron donating compounds and a compound having a high electron transporting property. Further, the charge generation layer 513 may be formed with a combination of a layer containing the composite material of an organic compound and metal oxide and a transparent conductive film.

In any case, the charge generation layer 513 sandwiched between the first light-emitting unit 511 and the second light-emitting unit 512 is acceptable as long as electrons are injected to one light-emitting unit and holes are injected to the other light-emitting unit when a voltage is applied between the first electrode 501 and the second electrode 502. For example, when a voltage is applied so that a potential of the first electrode is higher than a potential of the second electrode, any structure is acceptable for the charge generation layer 513 as long as the layer 513 injects electrons and holes into the first light-emitting unit 511 and the second light-emitting unit 512, respectively.

Although this embodiment mode illustrates the light-emitting element having two light-emitting units, the invention can be similarly applied to a light-emitting element in which three or more light-emitting units are stacked. By arranging a plurality of light-emitting units between a pair of electrodes in such a manner that the plurality of light-emitting units is partitioned with a charge generation layer, a light-emitting element having a long life and high luminance can be realized while maintaining a low current density. In addition, when the light-emitting element is applied to lighting, a voltage drop which would be caused by the resistance of the electrode materials can be suppressed. Thus, uniform light emission over a large area becomes possible. In other words, a light-emitting device capable of low-voltage driving and low-power consumption can be realized.

When the light-emitting units are formed to have different emission colors from each other, light emission of a desired color can be obtained as a whole from the light-emitting element. For example, in the light-emitting element having two light-emitting units, when the emission color of the first light-emitting unit and the emission color of the second light-emitting unit are complementary colors, a light-emitting element which emits white light as a whole can be obtained. Note that "complementary colors" refer to colors which can produce an achromatic color when mixed. That is, when light emitted from compounds which emit light of complementary colors are mixed, white emission can be obtained. The same can be said for a light-emitting element which has three light-emitting units. For example, white emission as a whole can be obtained from the light-emitting element when the emission color of the first light-emitting unit is red, the emission color of the second light-emitting unit is green, and the emission color of the third light-emitting unit is blue. Note that this embodiment mode can be combined with other embodiment modes as appropriate.

Embodiment Mode 4

Figure 10A:
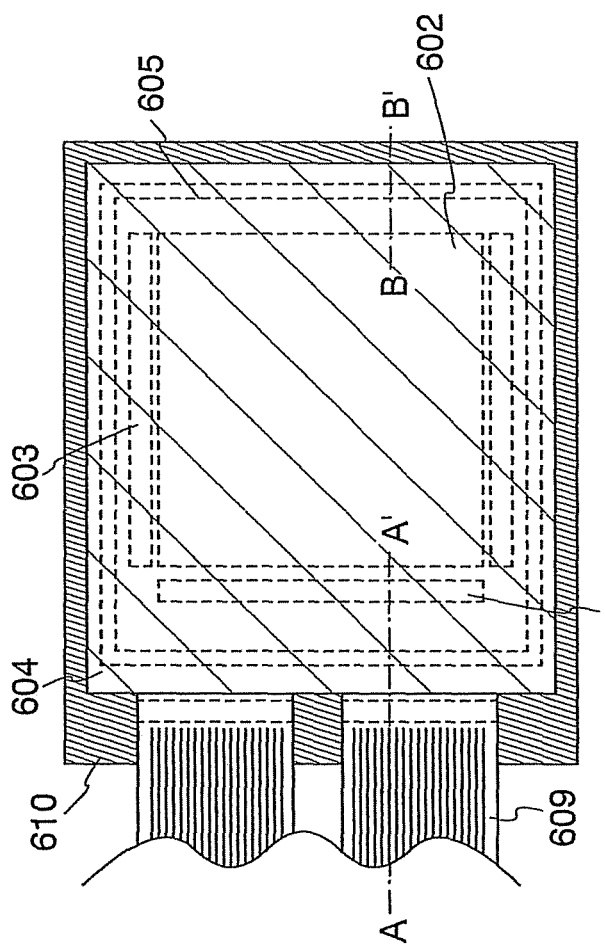
FIGS. 10A and 10B illustrate an active matrix light-emitting device of the invention shown in Embodiment Mode 4.
Figure 10B:
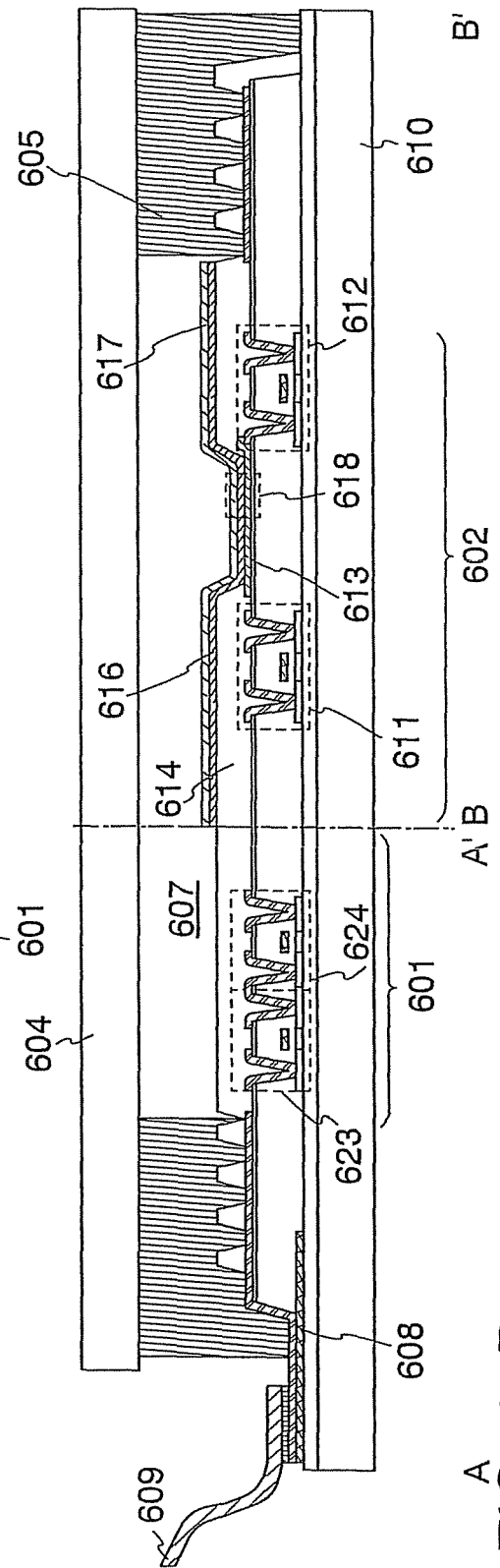

This embodiment mode will describe a light-emitting device having the light-emitting element of the invention. In this embodiment mode, a light-emitting device having a pixel portion which includes the light-emitting element of the invention will be described with reference to FIGS. 10A and 10B. FIG. 10A is a top view of a light-emitting device, and FIG. 10B is a cross-sectional view taken along lines A-A' and B-B' of FIG. 4A. Reference numerals 601, 602, and 603 denote a driver circuit portion (a source driver circuit), a pixel portion, and a driver circuit portion (a gate driver circuit), respectively, which are indicated by dotted lines. In addition, reference numerals 604 and 605 denote a sealing substrate and a sealing material, respectively, and a portion surrounded by the sealing material 605 corresponds to a space 607.

A lead wiring 608 is a wiring for transmitting signals to the source driver circuit 601 and the gate driver circuit 603, and this wiring 608 receives video signals, clock signals, start signals, reset signals, and the like from an FPC (Flexible Printed Circuit) 609 that is an external input terminal. Although only the FPC is shown here, the FPC may be provided with a printed wiring board (PWB). The light-emitting device in this specification includes not only a light-emitting device itself but also a light-emitting device with an FPC or a PWB attached thereto.

Next, a cross-sectional structure will be described with reference to FIG. 10B. The driver circuit portion and the pixel portion are formed over a substrate 610. Here, the source driver circuit 601, which is the driver circuit portion, and one pixel in the pixel portion 602 are shown. A CMOS circuit, which is a combination of an n-channel TFT 623 and a p-channel TFT 624, is formed as the source driver circuit 601. The driver circuit may be formed using various CMOS circuits, PMOS circuits, or NMOS circuits. Although a driver-integration type device, in which a driver circuit is formed over the same substrate as a pixel portion, is shown in this embodiment mode, a driver circuit is not necessarily formed over the same substrate as a pixel portion and can be formed outside the substrate.

The pixel portion 602 has a plurality of pixels, each of which includes a switching TFT 611, a current-controlling TFT 612, and a first electrode 613 which is electrically connected to a drain of the current-controlling TFT 612. Note that an insulator 614 is formed so as to cover an end portion of the first electrode 613. Here, a positive photosensitive acrylic resin film is used for the insulator 614.

The insulator 614 is formed so as to have a curved surface having curvature at an upper end portion or a lower end portion thereof in order to obtain favorable coverage. For example, in the case of using a positive photosensitive acrylic resin as a material for the insulator 614, the insulator 614 is preferably formed so as to have a curved surface with a curvature radius (0.2 to 3 μm) only at the upper end portion thereof. Either a negative photoresist which becomes insoluble in an etchant by light irradiation or a positive photoresist which becomes soluble in an etchant by light irradiation can be used for the insulator 614.

An EL layer 616 and a second electrode 617 are formed over the first electrode 613. Various metals, alloys, electrically conductive compounds, or mixture of them can be used for a material for forming the first electrode 613. When the first electrode 613 is used as an anode, it is particularly preferable to select a material with a high work function (a work function of 4.0 eV or higher) among such metals, alloys, electrically conductive compounds, and mixture of them.

For example, the first electrode 613 can be formed by using a single-layer film such as a film made of ITO containing silicon, a film made of indium zinc oxide (IZO), a titanium nitride film, chromium film, a tungsten film, a Zn film, or a Pt film; stacked layers of a titanium nitride film and a film containing aluminum as its main component; a three-layer structure of a titanium nitride film, a film containing aluminum as its main component, and a titanium nitride film; or the like. When the first electrode 613 has a stacked structure, the electrode 613 shows low resistance enough to serve as a wiring, giving a good ohmic contact. Further, the first electrode 613 can function as an anode.

In addition, the EL layer 616 is formed by various methods such as a vapor-deposition method using an evaporation mask, an ink-jet method, and a spin coating method. The EL layer 616 includes the layer for controlling the movement of carriers and the light-emitting layer that are described in Embodiment Modes 1 and 2. As other materials for forming the EL layer 616, low molecular compounds or high molecular compounds (e.g., oligomer or dendrimer) may also be used. In addition, not only organic compounds, but also inorganic compounds can be used for the material for forming the EL layer.

As a material for forming the second electrode 617, various metals, alloys, electrically conductive compounds, or mixture of them can be used. When the second electrode 617 is used as a cathode, it is particularly preferable to select a material with a low work function (a work function of 3.8 eV or lower) among such metals, alloys, electrically conductive compounds, and mixture of them. For example, elements belonging to Group 1 or 2 of the periodic table, i.e., alkali metals such a lithium (Li) and cesium (Cs) and alkaline earth metals such as magnesium (Mg), calcium (Ca), and strontium (Sr); alloys of them (e.g., MgAg and AlLi); and the like can be used.

In the case where light generated in the EL layer 616 is transmitted through the second electrode 617, the second electrode 617 may also be formed using stacked layers of a thin metal film and a transparent conductive film (e.g., indium tin oxide (ITO), ITO containing silicon or silicon oxide, indium zinc oxide (IZO), or indium oxide containing tungsten oxide and zinc oxide (IWZO)).

In the light-emitting device of this embodiment mode, the sealing substrate 604 is attached to the element substrate 610 with the sealing material 605, whereby a light-emitting element 618 is provided in the space 607 surrounded by the element substrate 610, the sealing substrate 604, and the sealing material 605. Note that the space 607 is filled with an inert gas (e.g., nitrogen or argon). There is also a case where the space 607 is filled with the sealing material 605.

Note that an epoxy resin is preferably used for the sealing material 605. Such material preferably allows as little moisture and oxygen as possible to penetrate. As a material for forming the sealing substrate 604, a glass substrate or a quartz substrate can be used as well as a plastic substrate made of FRP (Fiberglass-Reinforced Plastics), PVF (polyvinyl fluoride), polyester, acrylic, or the like.

By the above-described process, a light-emitting device having the light-emitting element of the invention can be obtained. The thusly obtained light-emitting device of the invention has a long-lifetime light-emitting element; therefore, the device itself also has a long lifetime. Further, since the light-emitting element of the invention is a light-emitting element with high luminous efficiency, high luminance can be achieved, and a light-emitting device with reduced power consumption can be obtained.

Figure 11A:
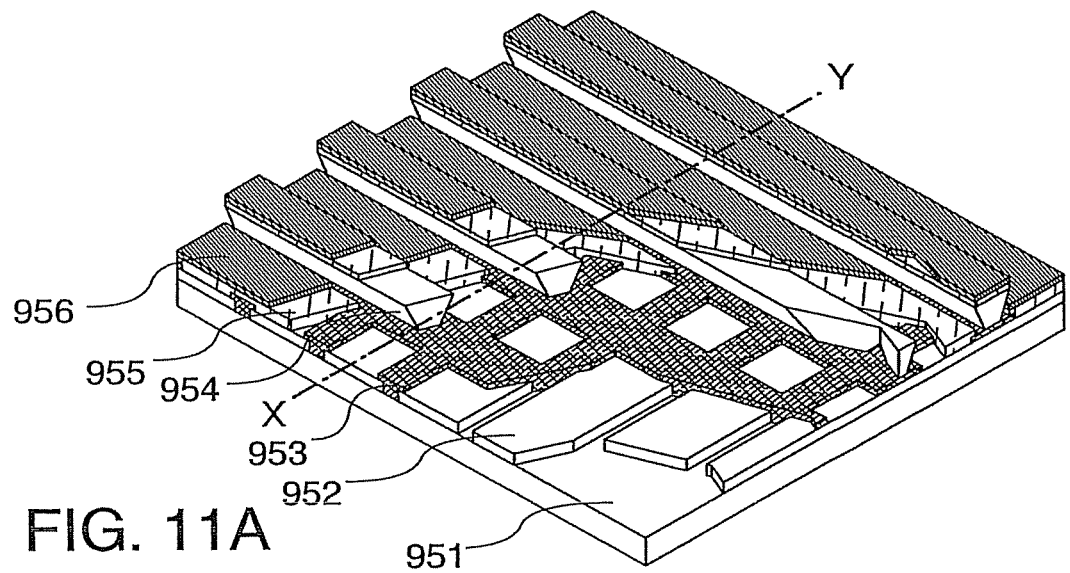
FIGS. 11A and 11B illustrate a passive matrix light-emitting device of the invention shown in Embodiment Mode 4.
Figure 11B:
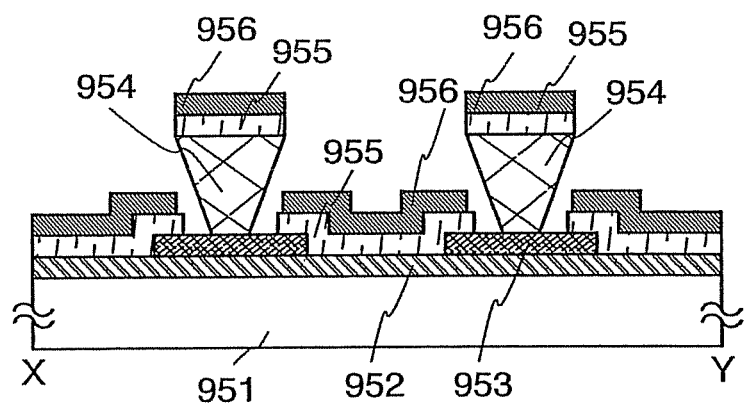

Although this embodiment mode illustrates an active matrix light-emitting device in which driving of a light-emitting element is controlled by a transistor, it is also possible to use a passive matrix light-emitting device in which a light-emitting element is driven without an element for driving the light-emitting element such as a transistor, like the structure shown in FIGS. 11A and 11B. FIGS. 11A and 11B show a perspective view and a cross-sectional view, respectively, of a passive matrix light-emitting device which is formed by applying the invention. FIG. 11A is a cross-sectional view of a light-emitting device, and FIG. 11B is a cross-sectional view taken along a line X-Y of FIG. 11A. In FIGS. 11A and 11B, an EL layer 955 is provided between an electrode 952 and an electrode 956 over a substrate 951. An edge of the electrode 952 is covered with an insulating layer 953.

A partition layer 954 is provided over the insulating layer 953. A side wall of the partition layer 954 slopes so that a distance between one side wall and the other side wall becomes narrow toward a substrate surface. In other words, a cross section of the partition layer 954 in the direction of a short side is trapezoidal, and a bottom base (a side expanding in the same direction as a plane direction of the insulating layer 953 and in contact with the insulating layer 953) is shorter than a top base (a side expanding in the same direction as the plane direction of the insulating layer 953 and not in contact with the insulating layer 953). The partition layer 954 provided in this manner can prevent the light-emitting element from being defective due to static electricity or the like. In addition, a passive matrix light-emitting device can also be formed as a long-lifetime light-emitting device by applying the long-lifetime light-emitting element of the invention. Further, by applying the light-emitting element of the invention which has high luminous efficiency, a light-emitting device with reduced power consumption can be obtained.

Embodiment Mode 5

This embodiment mode will describe an electronic device of the invention which includes the light-emitting device described in Embodiment Mode 4 as a component part. The electronic device of the invention includes the light-emitting elements described in any of Embodiment Modes 1 to 3, and thus has a display portion with a long lifetime. In addition, since the light-emitting elements with high luminous efficiency are used, a display portion with reduced power consumption can be obtained.

Typical examples of an electronic device which is formed using the light-emitting device of the invention include cameras such as video cameras and a digital cameras, goggle displays, navigation systems, audio reproducing devices (e.g., car audio component stereos and audio component stereos), computers, game machines, portable information terminals (e.g., mobile computers, mobile phones, portable game machines, and electronic books), and image reproducing devices provided with recording media (specifically, a device capable of reproducing the content of a recording medium such as a digital versatile disc (DVD) and provided with a display device that can display the reproduced image), and the like. Specific examples of these electronic devices are shown in FIGS. 12A to 12D.

Figure 12A:
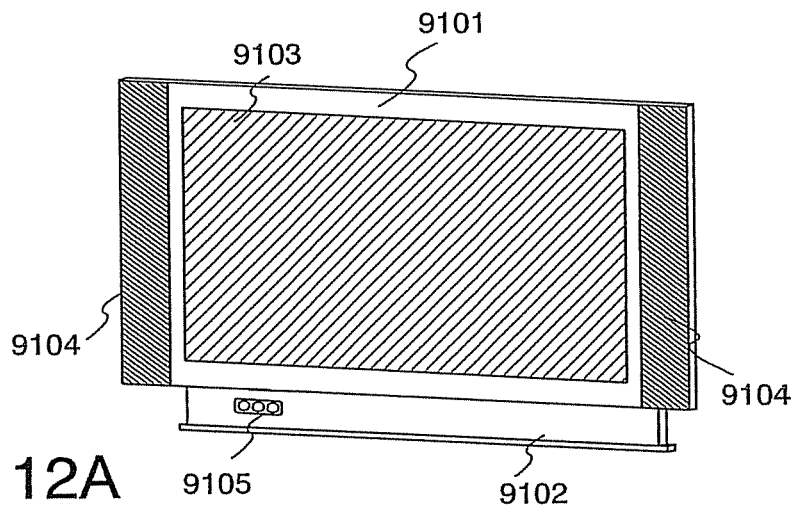
FIGS. 12A to 12D illustrate electronic devices of the invention.

FIG. 12A shows a television set in accordance with the invention, which includes a housing 9101, a supporting base 9102, a display portion 9103, speaker portions 9104, video input terminals 9105, and the like. In the television set, the display portion 9103 has a matrix arrangement of light-emitting elements similar to those shown in Embodiment Modes 1 to 3. The feature of the light-emitting elements is exemplified by the long lifetime. The display portion 9103 which includes the light-emitting elements has similar features. Therefore, this television set also has a feature of the long lifetime. That is, a television set which is durable for use over a long period of time can be provided. Further, since light-emitting elements with high luminous efficiency are used, a television set having a display portion with reduced power consumption can be obtained.

Figure 12B:
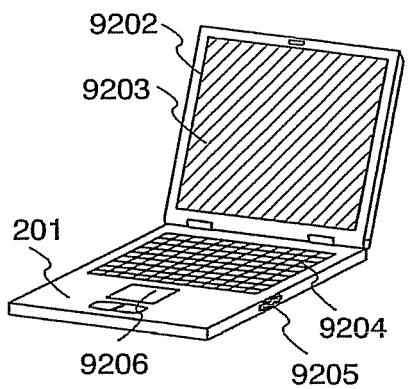

FIG. 12B shows a computer in accordance with the invention, which includes a main body 9201, a housing 9202, a display portion 9203, a keyboard 9204, an external connection port 9205, a pointing device 9206, and the like. In the computer, the display portion 9203 has a matrix arrangement of light-emitting elements similar to those shown in Embodiment Modes 1 to 3. The feature of the light-emitting elements is exemplified by the long lifetime. The display portion 9203 which includes the light-emitting elements has similar features. Therefore, this computer also has a feature of the long lifetime. That is, a computer which is durable for use over a long period of time can be provided. Further, since light-emitting elements with high luminous efficiency are used, a computer having a display portion with reduced power consumption can be obtained.

Figure 12C:
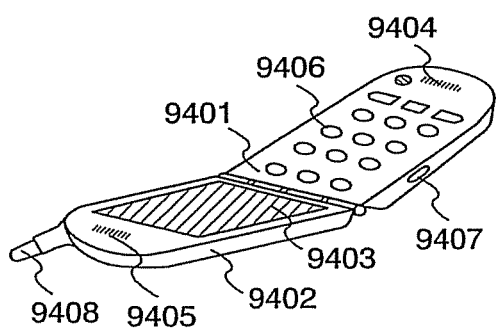

FIG. 12C shows a mobile phone in accordance with the invention, which includes a main body 9401, a housing 9402, a display portion 9403, an audio input portion 9404, an audio output portion 9405, operation keys 9406, an external connection port 9407, an antenna 9408, and the like. In the mobile phone, the display portion 9403 has a matrix arrangement of light-emitting elements similar to those shown in Embodiment Modes 1 to 3. The feature of the light-emitting elements is exemplified by the long lifetime. The display portion 9403 which includes the light-emitting elements has similar features. Therefore, this mobile phone also has a feature of the long lifetime. That is, a mobile phone which is durable for use over a long period of time can be provided. Further, since light-emitting elements with high luminous efficiency are used, a mobile phone having a display portion with reduced power consumption can be obtained.

Figure 12D:
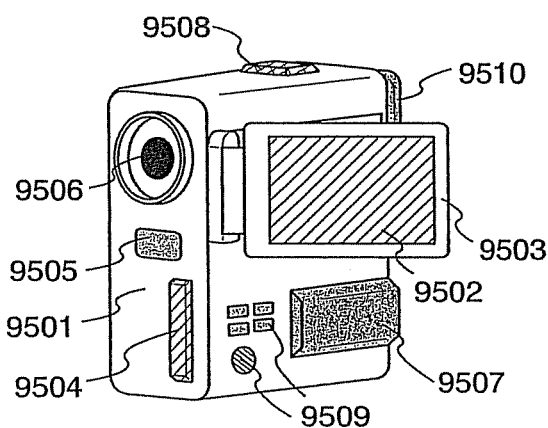

FIG. 12D shows a camera in accordance with the invention, which includes a main body 9501, a display portion 9502, a housing 9503, an external connection port 9504, a remote control receiving portion 9505, an image receiving portion 9506, a battery 9507, an audio input portion 9508, operation keys 9509, an eye piece portion 9510, and the like. In the camera, the display portion 9502 has a matrix arrangement of light-emitting elements similar to those shown in Embodiment Modes 1 to 3. The feature of the light-emitting elements is exemplified by the long lifetime. The display portion 9502 which includes the light-emitting elements has similar features. Therefore, this camera also has a feature of the long lifetime. That is, a camera which is durable for use over a long period of time can be provided. Further, since light-emitting elements with high luminous efficiency are used, a camera having a display portion with reduced power consumption can be obtained.

As described above, the applicable range of the light-emitting device of the invention is so wide that the light-emitting device can be applied to electronic devices in various fields. By using the light-emitting device of the invention, an electronic device having a long-lifetime display portion which is durable for use over a long period of time can be provided. In addition, an electronic device having a display portion with reduced power consumption can be obtained.

Figure 13:
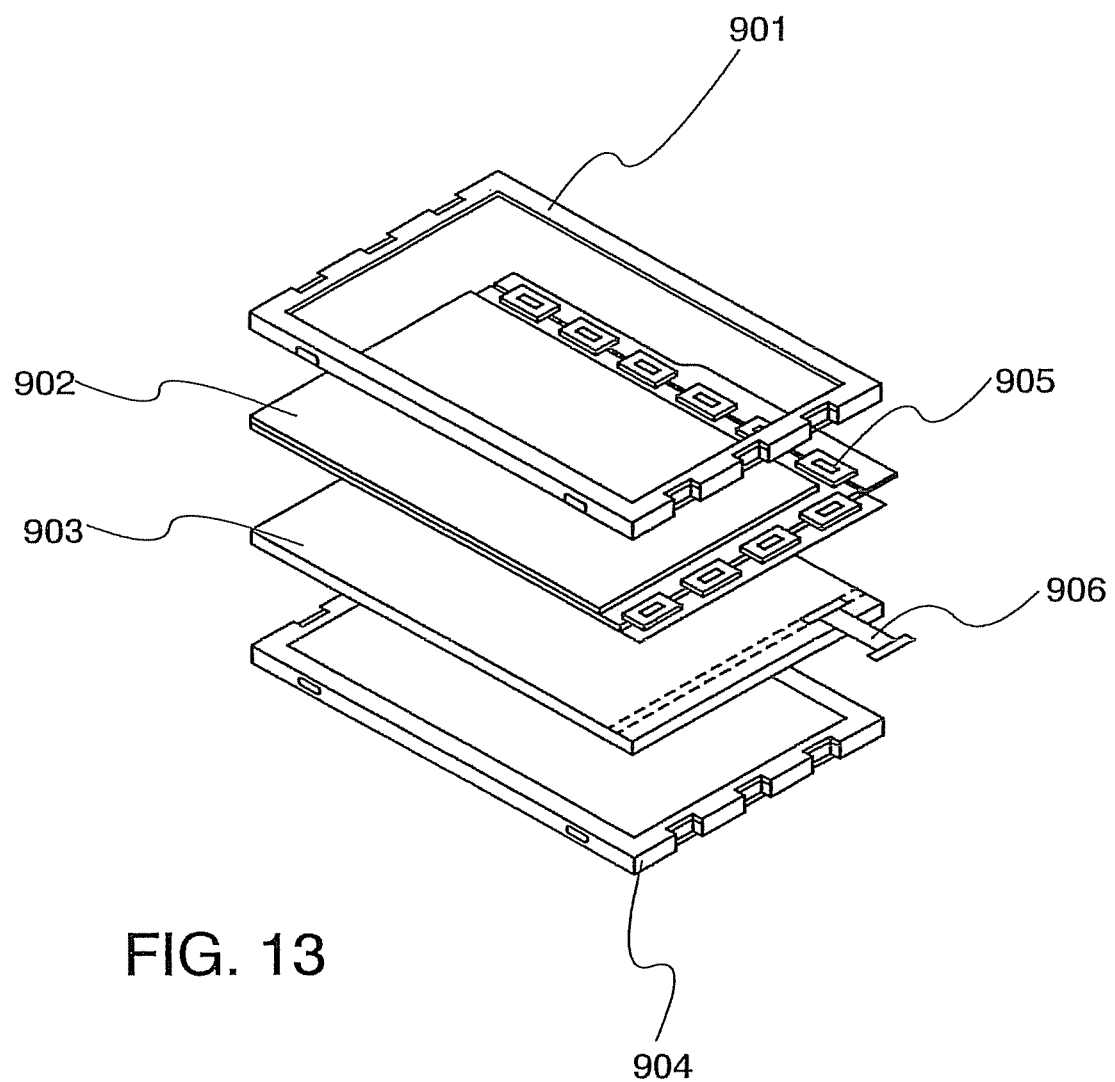
FIG. 13 illustrates an electronic device which uses the light-emitting device of the invention as a backlight.

The light-emitting device of the invention can also be used as a lighting device. An example of using the light-emitting element of the invention for a lighting device will be described with reference to FIG. 13. FIG. 13 shows an example of a liquid crystal display device which uses the light-emitting device of the invention as a backlight. The liquid crystal display device shown in FIG. 13 includes a housing 901, a liquid crystal layer 902, a backlight 903, and a housing 904, and the liquid crystal layer 902 is connected to a driver IC 905. The light-emitting device of the invention is used for the backlight 903, and current is supplied through a terminal 906.

By using the light-emitting device of the invention as the backlight of the liquid crystal display device, a backlight with a long lifetime can be obtained. The light-emitting device of the invention is a lighting device with plane light emission, and can have a large area. Therefore, the backlight can have a large area, and a liquid crystal display device having a large area can be obtained. Furthermore, the light-emitting device of the invention has a thin shape and has low power consumption; therefore, a thin shape and low power consumption of a display device can also be achieved. In addition, since light-emitting elements with high luminous efficiency are used, a light-emitting device with high luminance can be obtained. Furthermore, since the light-emitting device of the invention has a long lifetime, a liquid crystal display device having a long lifetime can be obtained.

Figure 14:
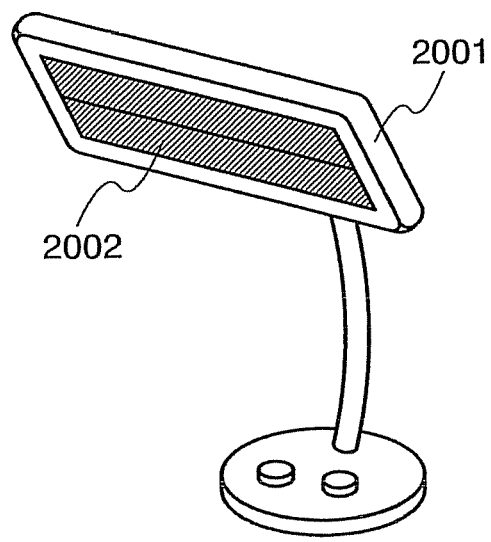
FIG. 14 illustrates a table lamp which uses the lighting device of the invention.
Figure 15:
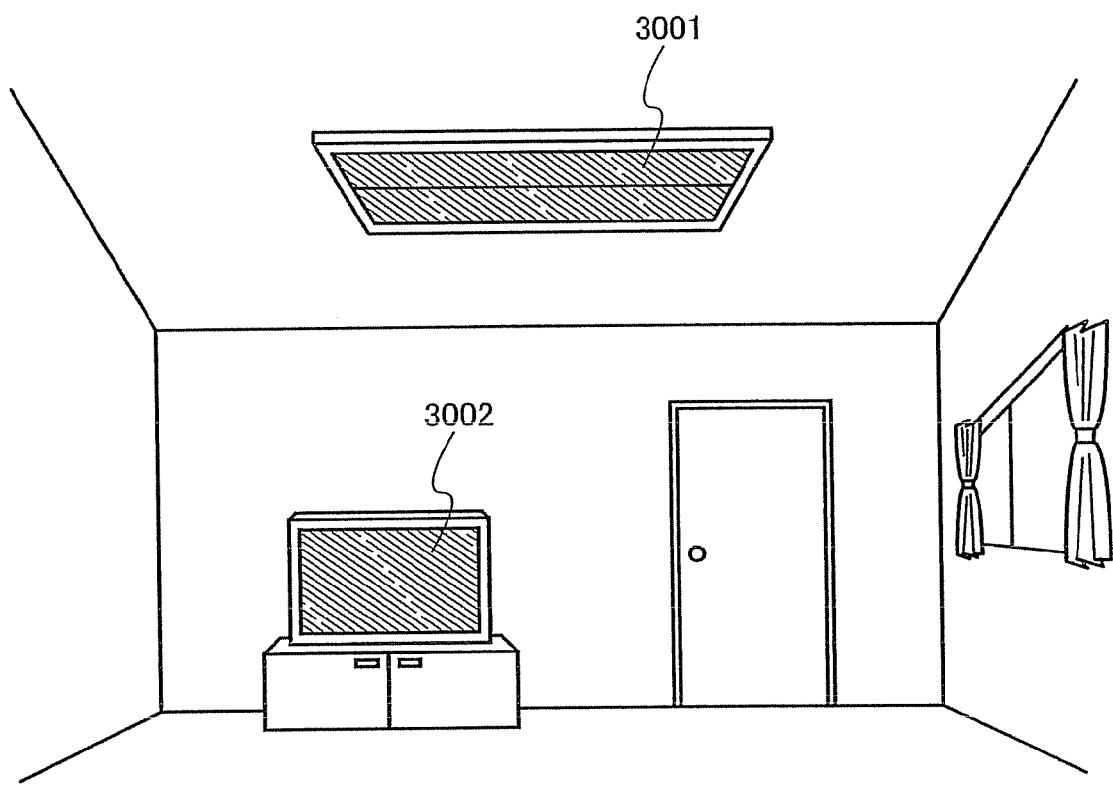
FIG. 15 illustrates an indoor lighting device which uses the lighting device of the invention.

FIG. 14 shows an example of using the light-emitting device of the invention for a table lamp which is a lighting device. A table lamp shown in FIG. 14 has a housing 2001 and a light source 2002, and the light-emitting device of the invention is used as the light source 2002. The light-emitting device of the invention has a long lifetime; therefore, a table lamp also has a long lifetime. FIG. 15 shows an example of using the light-emitting device of the invention for an indoor lighting device 3001. Since the light-emitting device of the invention can have a large area, the light-emitting device of the invention can be used as a lighting device having a large emission area. Furthermore, since the light-emitting device of the invention has a long lifetime, a lighting device having a long lifetime can be obtained.

When a television set 3002 in accordance with the invention like the one illustrated in FIG. 12A is placed in a room in which the light-emitting device of the invention is used as the indoor lighting device 3001, public broadcasting and movies can be watched. In such a case, since both of the devices have long lifetimes, frequency of replacement of the lighting device and the television set can be reduced, and damage on the environment can be reduced.

Embodiment 1

Figure 16:
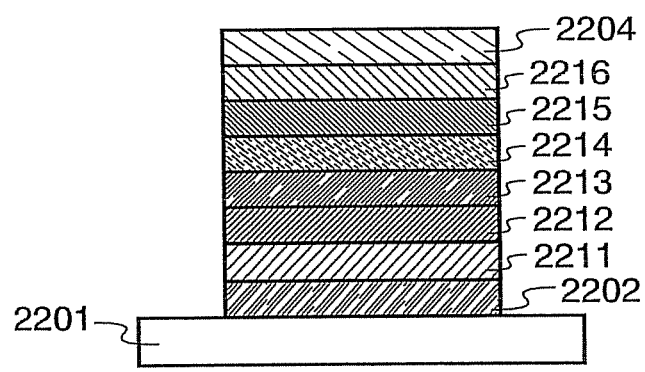
FIG. 16 illustrates a light-emitting element of an embodiment.

This embodiment will specifically describe a fabrication example of the light-emitting element of the invention and the characteristics of the fabricated light-emitting element, with reference to the stacked structure in FIG. 16. In addition, the characteristics will be specifically described with reference to graphs showing the measurement results. Structural formulae of organic compounds used in Embodiment 1 are shown below.

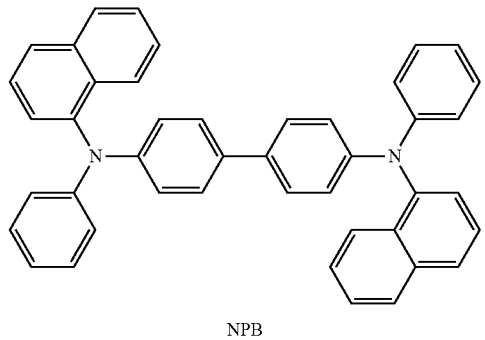

NPB

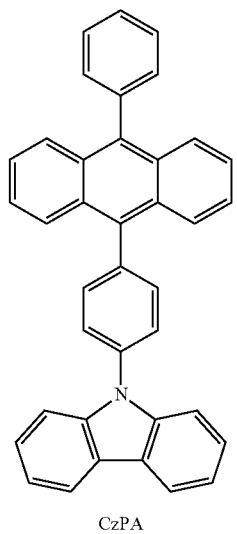

CzPA

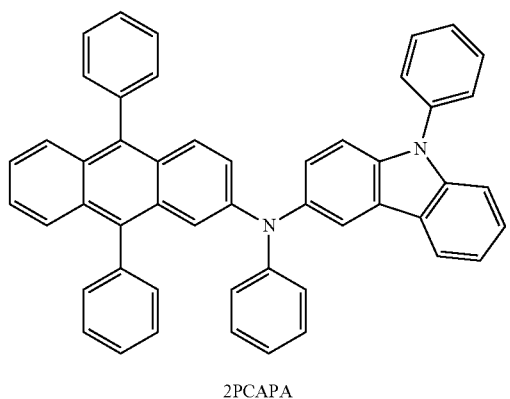

2PCAPA

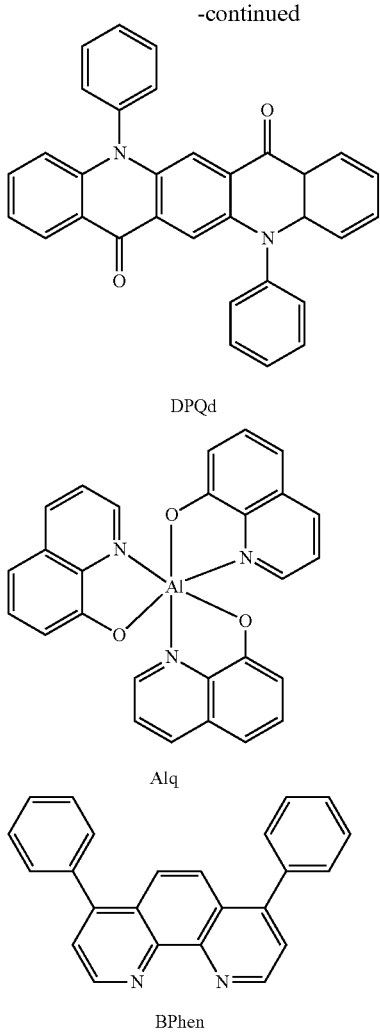

DPQd

Alq

BPhen (Fabrication of Light-Emitting Element 1)

First, ITO containing silicon oxide was deposited over a glass substrate 2201 by a sputtering method, whereby a first electrode 2202 was formed. Note that the thickness of the first electrode 2202 was 110 nm and the electrode area was 2 mm×2 mm. Next, the substrate having the first electrode 2202 was fixed to a substrate holder provided in a vacuum deposition apparatus in such a way that the surface of the first electrode faced downward, and then the pressure was reduced to about $10^{-4}$ Pa.

Next, 4,4'-bis[N-(1-naphthyl)-N-phenylamino]biphenyl (abbreviation: NPB) and molybdenum(VI) oxide were co-deposited on the first electrode 2202, whereby a layer 2211 containing a composite material was formed. The deposition rate was controlled so that the thickness of the layer 2211 could be 50 nm and the weight ratio of NPB to molybdenum (VI) oxide could be 4:1 (=NPB:molybdenum oxide). Note that the co-deposition method is a deposition method in which deposition is performed using a plurality of evaporation sources at the same time in one treatment chamber.

Next, a hole transporting layer 2212 was formed by depositing 4,4'-bis[N-(1-naphthyl)-N-phenylamino]biphenyl (abbreviation: NPB) to a thickness of 10 nm by a deposition method using resistance heating. After that, a light-emitting layer 2213 was formed over the hole transporting layer 2212. The light-emitting layer 2213 was formed by co-depositing 9-[4-(10-phenyl-9-anthryl)phenyl]-9H-carbazole (abbreviation: CzPA) and N-(9,10-diphenyl-2-anthryl)-N,9-diphenyl-9H-carbazol-3-amine (abbreviation: 2PCAPA) to a thickness of 30 nm. Here, the deposition rate was controlled so that the weight ratio of CzPA to 2PCAPA could be 1:0.05 (=CzPA: 2PCAPA).

Further, a layer 2214 for controlling the movement of carriers was formed by co-depositing tris(8-quinolinolato)aluminum(III) (abbreviation: Alq) and N,N'-diphenylquinacridon (abbreviation: DPQd) to a thickness of 10 nm over the light-emitting layer 2213. Here, the deposition rate was controlled so that the weight ratio of Alq to DPQd could be 1:0.003 (=Alq:DPQd).

Next, an electron transporting layer 2215 was formed by depositing tris(8-quinolinolato)aluminum(III) (abbreviation: Alq) to a thickness of 30 nm over the layer 2214 for controlling the movement of carriers by a deposition method using resistance heating. After that, an electron injection layer 2216 was formed by depositing lithium fluoride (LiF) to a thickness of 1 nm over the electron transporting layer 2215. Finally, a second electrode 2204 was formed by depositing aluminum to a thickness of 200 nm by a deposition method using resistance heating. Consequently, a light-emitting element 1 was formed.

Figure 17:
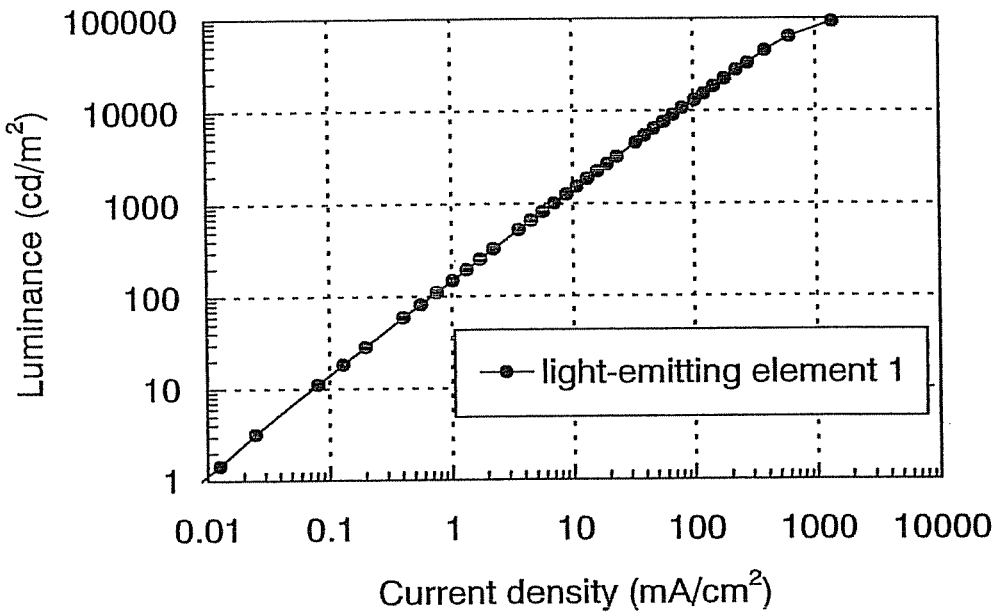
FIG. 17 shows the current density vs. luminance characteristics of a light-emitting element 1.
Figure 18:
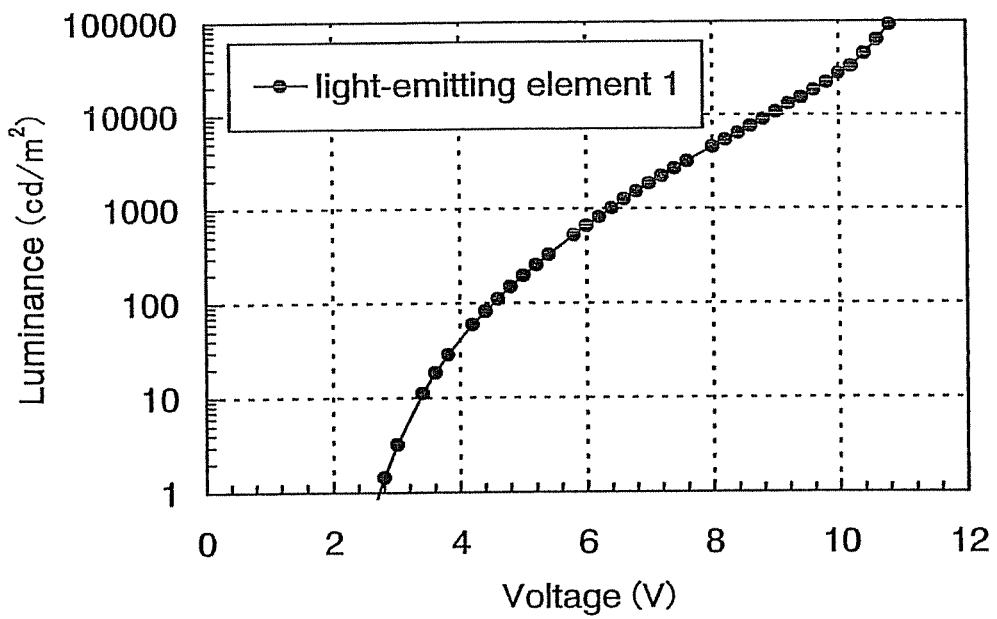
FIG. 18 shows the voltage vs. luminance characteristics of the light-emitting element 1.
Figure 19:
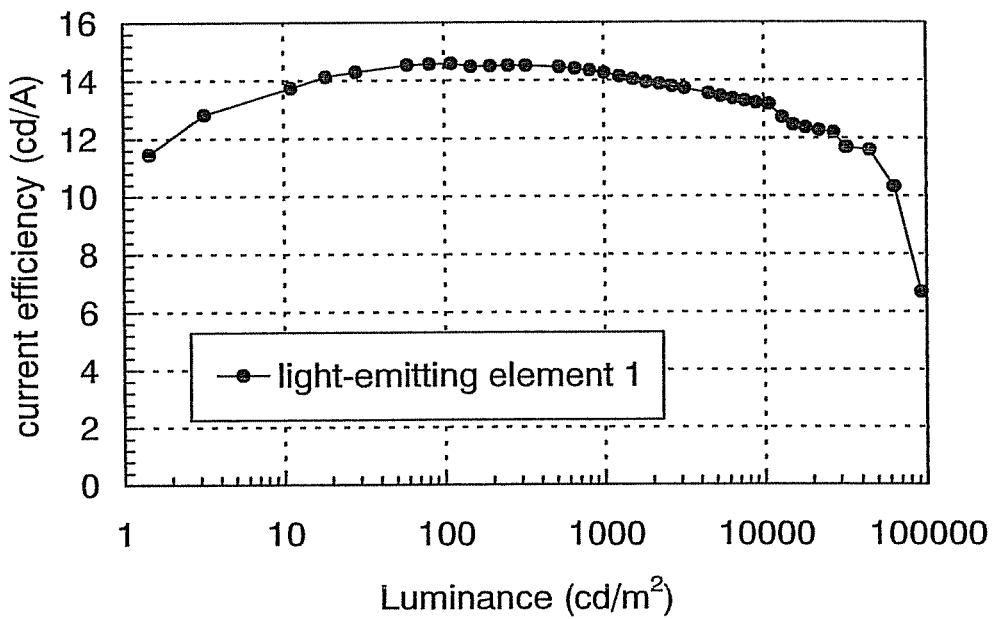
FIG. 19 shows the luminance vs. current efficiency characteristics of the light-emitting element 1.
Figure 20:
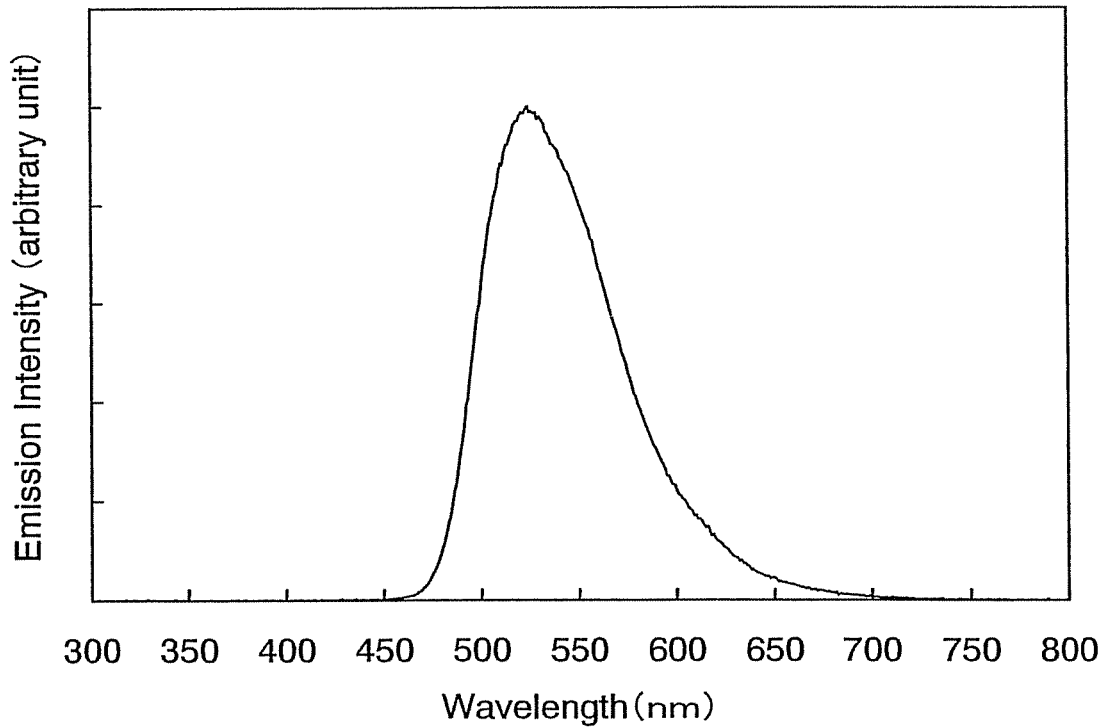
FIG. 20 shows the emission spectrum of the light-emitting element 1.

The light-emitting element 1 of the invention obtained through the above-described process was put into a glove box containing a nitrogen atmosphere so that the light-emitting element was sealed from atmospheric air. Then, the operating characteristics of the light-emitting element 1 were measured. Note that the measurement was conducted at room temperature (atmosphere kept at 25° C.). FIG. 17 shows the current density vs. luminance characteristics of the light-emitting element 1. FIG. 18 shows the voltage vs. luminance characteristics of the light-emitting element 1. FIG. 19 shows the luminance vs. current efficiency characteristics of the light-emitting element 1. FIG. 20 shows the emission spectrum of the light-emitting element 1 with a current supply of 1 mA.

Figure 21:
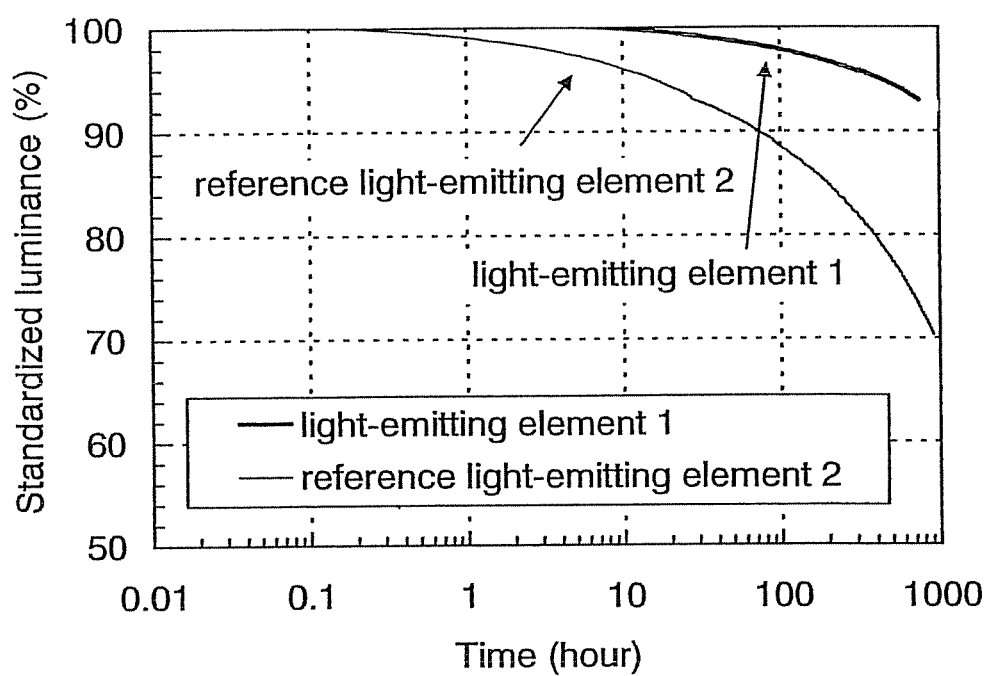
FIG. 21 shows the results of continuous lighting tests in which a light-emitting element 1 and a reference light-emitting element 2 were continuously lit by constant current driving.

FIG. 21 shows the result of a continuous lighting test in which the light-emitting element 1 was continuously lit by constant current driving with the initial luminance set at 5000 cd/m² (the vertical axis indicates the relative luminance on the assumption that 5000 cd/m² is 100%). The emission color of the light-emitting element 1 was located at the CIE chromaticity coordinates of (x=0.30, y=0.64) at the luminance of 5000 cd/m², and green emission which derives from 2PCAPA was obtained. In addition, the current efficiency and driving voltage of the light-emitting element 1 at the luminance of 5000 cd/m² were 14 cd/A and 8.1 V, respectively. Further, when a continuous lighting test was conducted in which the light-emitting element 1 was continuously lit by constant current driving with the initial luminance set at 5000 cd/m², 93% of the initial luminance was maintained even after 740 hours. Thus, it was proved that the light-emitting element 1 has a long lifetime.

(Fabrication of Reference Light-Emitting Element 2)

Next, for the sake of comparison, a reference light-emitting element 2 without the layer for controlling the movement of carriers that the above-described light-emitting element 1 has was formed. The fabrication method will be described below. First, ITO containing silicon oxide was deposited over a glass substrate by a sputtering method, whereby a first electrode was formed. Note that the thickness of the first electrode was 110 nm and the electrode area was 2 mm×2 mm.

Next, the substrate having the first electrode was fixed to a substrate holder provided in a vacuum deposition apparatus in such a way that the surface of the first electrode faced downward, and then the pressure was reduced to about $10^{-4}$ Pa. Then, 4,4'-bis[N-(1-naphthyl)-N-phenylamino]biphenyl (abbreviation: NPB) and molybdenum(VI) oxide were co-deposited on the first electrode, whereby a layer containing a composite material was formed. The deposition rate was controlled so that the thickness of the layer containing a composite material could be 50 nm and the weight ratio of NPB to molybdenum(VI) oxide could be 4:1 (=NPB:molybdenum oxide).

Next, a hole transporting layer was formed by depositing 4,4'-bis[N-(1-naphthyl)-N-phenylamino]biphenyl (abbreviation: NPB) to a thickness of 10 nm by a deposition method using resistance heating. After that, a light-emitting layer was formed over the hole transporting layer. The light-emitting layer was formed by co-depositing 9-[4-(10-phenyl-9-anthryl)phenyl]-9H-carbazole (abbreviation: CzPA) and N-(9,10-diphenyl-2-anthryl)-N,9-diphenyl-9H-carbazol-3-amine (abbreviation: 2PCAPA) to a thickness of 40 nm. Here, the deposition rate was controlled so that the weight ratio of CzPA to 2PCAPA could be 1:0.05 (=CzPA:2PCAPA).

Next, an electron transporting layer was formed by depositing tris(8-quinolinolato)aluminum(III) (abbreviation: Alq) to a thickness of 30 nm over the light-emitting layer by a deposition method using resistance heating. That is, unlike the light-emitting element 1, the electron transporting layer was formed over the light-emitting layer without providing the layer for controlling the movement of carriers therebetween. Then, an electron injection layer was formed by depositing lithium fluoride (LiF) to a thickness of 1 nm over the electron transporting layer. Finally, a second electrode was formed by depositing aluminum to a thickness of 200 nm by a deposition method using resistance heating. Consequently, the reference light-emitting element 2 was formed.

The reference light-emitting element 2 obtained through the above-described process was put into a glove box containing a nitrogen atmosphere so that the light-emitting element was sealed from atmospheric air. Then, the operating characteristics of the reference light-emitting element 2 were measured. Note that the measurement was conducted at room temperature (atmosphere kept at 25° C.). The emission color of the reference light-emitting element 2 was located at the CIE chromaticity coordinates of (x=0.29, y=0.62) at the luminance of 5000 cd/m$^2$; the current efficiency of the reference light-emitting element 2 was 13 cd/A; and it exhibited green emission which derives from 2PCAPA similarly to the light-emitting element 1.

However, when a continuous lighting test was conducted in which the reference light-emitting element 2 was continuously lit by constant current driving with the initial luminance set at 5000 cd/m$^2$, luminance has decreased to 73% of the initial luminance after 740 hours. Thus, it was found that the reference light-emitting element 2 has a shorter lifetime than the light-emitting element 1. Therefore, it was proved that a long-lifetime light-emitting element can be obtained by applying the invention.

Embodiment 2

This embodiment will specifically describe fabrication examples of the light-emitting element of the invention and the characteristics of the fabricated light-emitting element, with reference to the stacked structure in FIG. 16. In addition, the characteristics will be specifically described with reference to graphs showing the measurement results. Structural formulae of organic compounds used in Embodiment 2 are shown below. Note that the organic compounds that are already described in Embodiment 1 are omitted.

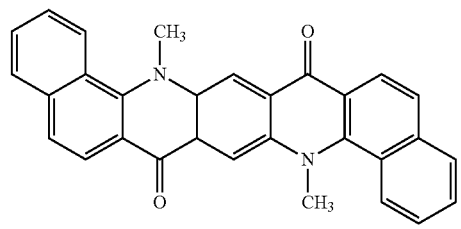

DMNQd-2

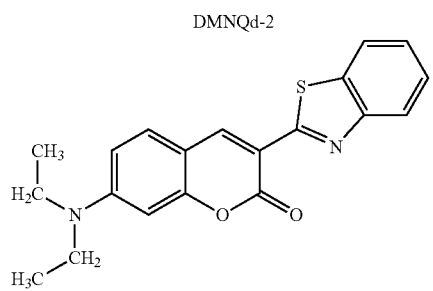

Coumarin6

(Fabrication of Light-Emitting Element 3)

First, ITO containing silicon oxide was deposited over a glass substrate 2201 by a sputtering method, whereby a first electrode 2202 was formed. Note that the thickness of the first electrode 2202 was 110 nm and the electrode area was 2 mm×2 mm. Next, the substrate having the first electrode 2202 was fixed to a substrate holder provided in a vacuum deposition apparatus in such a way that the surface of the first electrode 2202 faced downward, and then the pressure was reduced to about $10^{-4}$ Pa.

Next, 4,4'-bis[N-(1-naphthyl)-N-phenylamino]biphenyl (abbreviation: NPB) and molybdenum(VI) oxide were co-deposited on the first electrode 2202, whereby a layer 2211 containing a composite material was formed. The deposition rate was controlled so that the thickness of the layer 2211 could be 50 nm and the weight ratio of NPB to molybdenum (VI) oxide could be 4:1 (=NPB:molybdenum oxide). Then, a hole transporting layer 2212 was formed by depositing 4,4'-bis[N-(1-naphthyl)-N-phenylamino]biphenyl (abbreviation: NPB) to a thickness of nm by a deposition method using resistance heating.

Next, a light-emitting layer 2213 was formed over the hole transporting layer 2212. The light-emitting layer 2213 was formed by co-depositing 9-[4-(10-phenyl-9-anthryl)phenyl]-9H-carbazole (abbreviation: CzPA) and N-(9,10-diphenyl-2-anthryl)-N,9-diphenyl-9H-carbazol-3-amine (abbreviation: 2PCAPA) to a thickness of 30 nm. Here, the deposition rate was controlled so that the weight ratio of CzPA to 2PCAPA could be 1:0.05 (=CzPA:2PCAPA).

Further, a layer 2214 for controlling the movement of carriers was formed by co-depositing tris(8-quinolinolato)aluminum(II) (abbreviation: Alq) and N,N'-diphenylquinacridon (abbreviation: DPQd) to a thickness of 10 nm over the light-emitting layer 2213. Here, the deposition rate was controlled so that the weight ratio of Alq to DPQd could be 1:0.005 (=Alq:DPQd).

After that, an electron transporting layer 2215 was formed by depositing bathophenanthroline (abbreviation: BPhen) to a thickness of 30 nm over the layer 2214 for controlling the movement of carriers by a deposition method using resistance heating. Then, an electron injection layer 2216 was formed by depositing lithium fluoride (LiF) to a thickness of 1 nm over the electron transporting layer 2215. Finally, a second electrode 2204 was formed by depositing aluminum to a thickness of 200 nm by a deposition method using resistance heating. Consequently, a light-emitting element 3 was formed.

Figure 22:
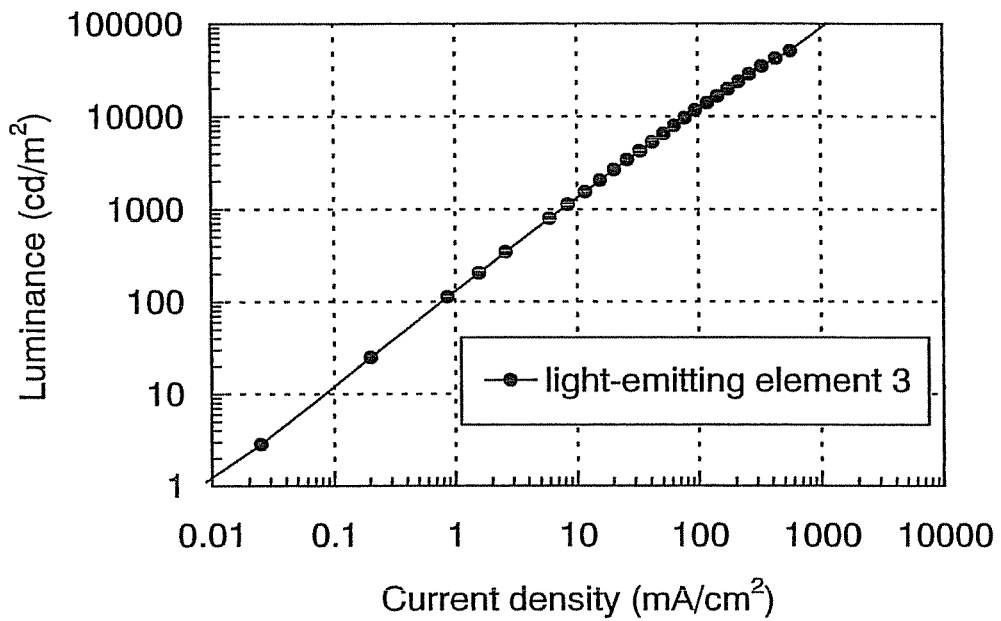
FIG. 22 shows the current density vs. luminance characteristics of a light-emitting element 3.
Figure 23:
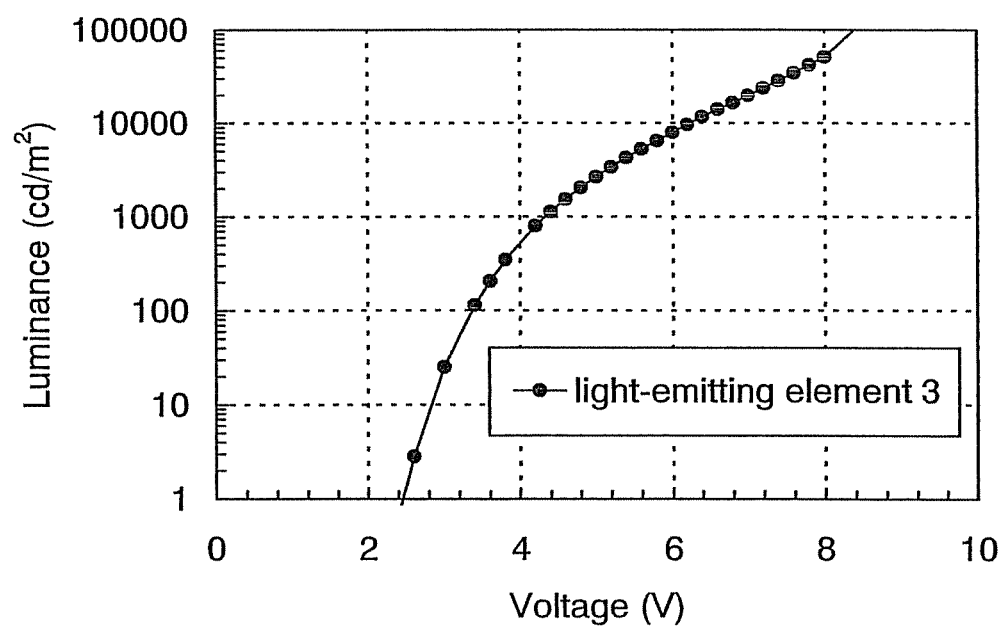
FIG. 23 shows the voltage vs. luminance characteristics of the light-emitting element 3.
Figure 24:
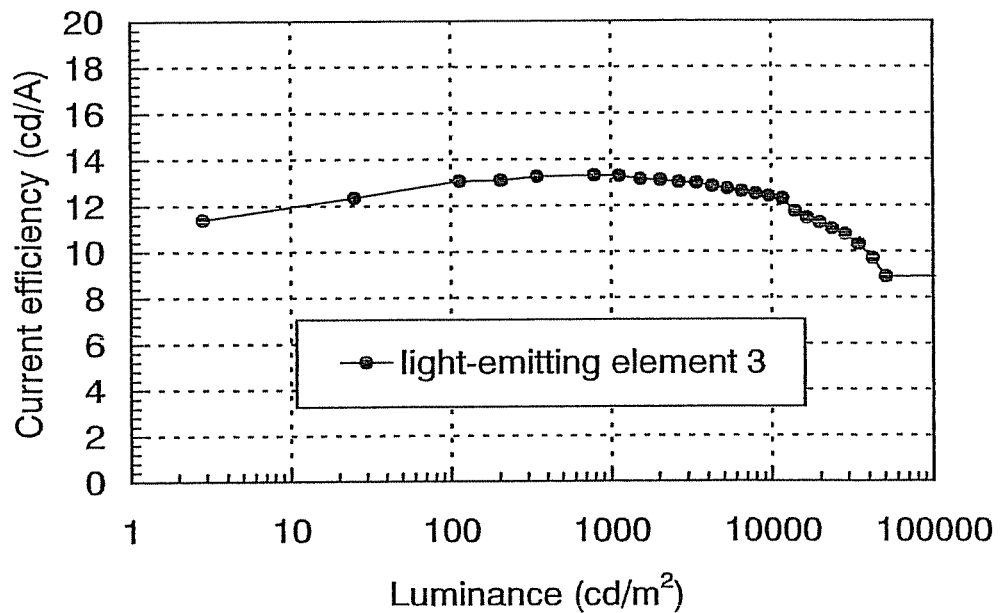
FIG. 24 shows the luminance vs. current efficiency characteristics of the light-emitting element 3.
Figure 25:
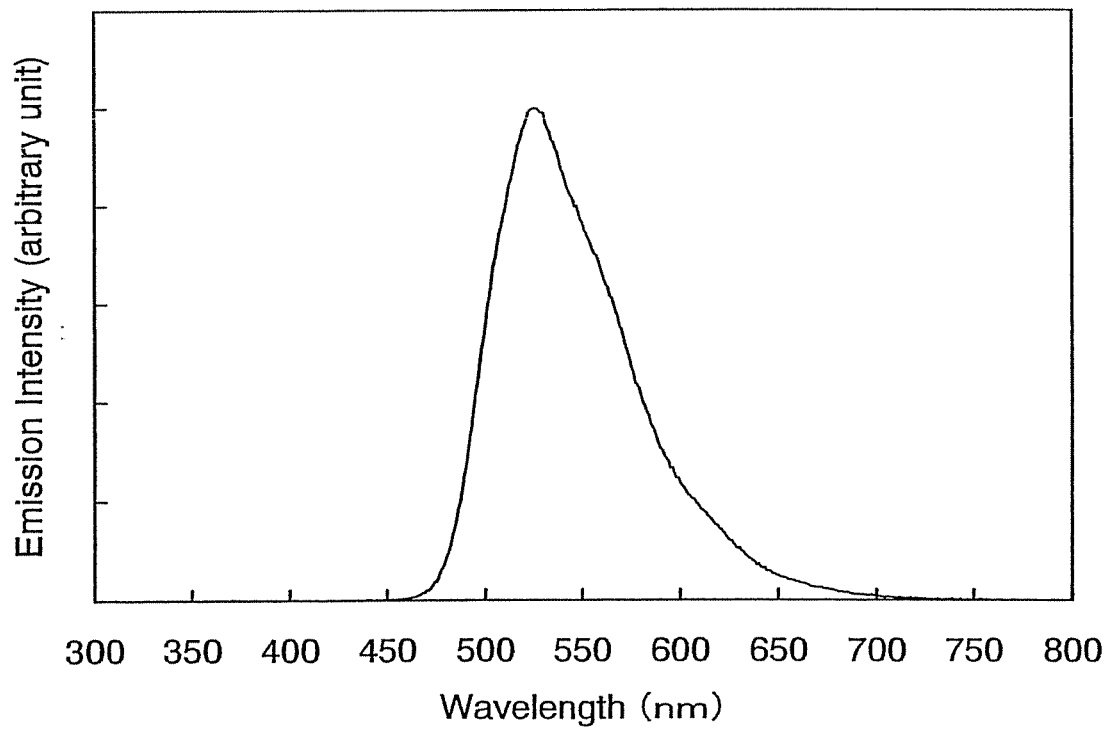
FIG. 25 shows the emission spectrum of the light-emitting element 3.

The light-emitting element 3 of the invention obtained through the above-described process was put into a glove box containing a nitrogen atmosphere so that the light-emitting element was sealed from atmospheric air. Then, the operating characteristics of the light-emitting element 3 were measured. Note that the measurement was conducted at room temperature (atmosphere kept at 25° C.). FIG. 22 shows the current density vs. luminance characteristics of the light-emitting element 3. FIG. 23 shows the voltage vs. luminance characteristics of the light-emitting element 3. FIG. 24 shows the luminance vs. current efficiency characteristics of the light-emitting element 3. FIG. 25 shows the emission spectrum of the light-emitting element 3 with a current supply of 1 mA.

FIG. 26 shows the result of a continuous lighting test in which the light-emitting element 3 was continuously lit by constant current driving with the initial luminance set at 5000 cd/m$^2$ (the vertical axis indicates the relative luminance on the assumption that 5000 cd/m$^2$ is 100%). The emission color of the light-emitting element 3 was located at the CIE chromaticity coordinates of (x=0.30, y=0.63) at the luminance of 5000 cd/m$^2$, and green emission which derives from 2PCAPA was obtained. In addition, the current efficiency and driving voltage of the light-emitting element 3 at the luminance of 5000 cd/m$^2$ were 13 cd/A and 5.5 V, respectively. Further, when a continuous lighting test was conducted in which the light-emitting element 3 was continuously lit by constant current driving with the initial luminance set at 5000 cd/m$^2$, 83% of the initial luminance was maintained even after 570 hours. Thus, it was proved that the light-emitting element 3 has a long lifetime.

(Fabrication of Light-Emitting Element 4)

First, ITO containing silicon oxide was deposited over a glass substrate 2201 by a sputtering method, whereby a first electrode 2202 was formed. Note that the thickness of the first electrode 2202 was 110 nm and the electrode area was 2 mm×2 mm. Next, the substrate having the first electrode 2202 was fixed to a substrate holder provided in a vacuum deposition apparatus in such a way that the surface of the first electrode 2202 faced downward, and then the pressure was reduced to about 10$^{-4}$ Pa.

Next, 4,4'-bis[N-(1-naphthyl)-N-phenylamino]biphenyl (abbreviation: NPB) and molybdenum(VI) oxide were co-deposited on the first electrode 2202, whereby a layer 2211 containing a composite material was formed. The deposition rate was controlled so that the thickness of the layer 2211 could be 50 nm and the weight ratio of NPB to molybdenum (VI) oxide could be 4:1 (=NPB:molybdenum oxide). Then, a hole transporting layer 2212 was formed by depositing 4,4'-bis[N-(1-naphthyl)-N-phenylamino]biphenyl (abbreviation: NPB) to a thickness of nm by a deposition method using resistance heating.

Next, a light-emitting layer 2213 was formed over the hole transporting layer 2212. The light-emitting layer 2213 was formed by co-depositing 9-[4-(10-phenyl-9-anthryl)phenyl]-9H-carbazole (abbreviation: CzPA) and N-(9,10-diphenyl-2-anthryl)-N,9-diphenyl-9H-carbazol-3-amine (abbreviation: 2PCAPA) to a thickness of 30 nm. Here, the deposition rate was controlled so that the weight ratio of CzPA to 2PCAPA could be 1:0.05 (=CzPA:2PCAPA).

Further, a layer 2214 for controlling the movement of carriers was formed by co-depositing tris(8-quinolinolato)aluminum(III) (abbreviation: Alq) and 9,18-dihydro-9,18-dimethyl-benzo[h]benzo[7,8]quino[2,3-b]acridine-7,16-dione (abbreviation: DMNQd-2) to a thickness of 10 nm over the light-emitting layer 2213. Here, the deposition rate was controlled so that the weight ratio of Alq to DMNQd-2 could be 1:0.005 (=Alq:DMNQd-2).

After that, an electron transporting layer 2215 was formed by depositing bathophenanthroline (abbreviation: BPhen) to a thickness of 30 nm over the layer 2214 for controlling the movement of carriers by a deposition method using resistance heating. Then, an electron injection layer 2216 was formed by depositing lithium fluoride (LiF) to a thickness of 1 nm over the electron transporting layer 2215. Finally, a second electrode 2204 was formed by depositing aluminum to a thickness of 200 nm by a deposition method using resistance heating. Consequently, a light-emitting element 4 was formed.

The light-emitting element 4 of the invention obtained through the above-described process was put into a glove box containing a nitrogen atmosphere so that the light-emitting element was sealed from atmospheric air. Then, the operating characteristics of the light-emitting element 4 were measured. Note that the measurement was conducted at room temperature (atmosphere kept at 25° C.). FIG. 27 shows the current density vs. luminance characteristics of the light-emitting element 4. FIG. 28 shows the voltage vs. luminance characteristics of the light-emitting element 4. FIG. 29 shows the luminance vs. current efficiency characteristics of the light-emitting element 4. FIG. 30 shows the emission spectrum of the light-emitting element 4 with a current supply of 1 mA.

FIG. 26 shows the result of a continuous lighting test in which the light-emitting element 4 was continuously lit by constant current driving with the initial luminance set at 5000 cd/m$^2$ (the vertical axis indicates the relative luminance on the assumption that 5000 cd/m$^2$ is 100%). The emission color of the light-emitting element 4 was located at the CIE chromaticity coordinates of (x=0.30, y=0.64) at the luminance of 5000 cd/m$^2$, and green emission which derives from 2PCAPA was obtained. In addition, the current efficiency and driving voltage of the light-emitting element 4 at the luminance of 5000 cd/m$^2$ were 17 cd/A and 4.2 V, respectively. Further, when a continuous lighting test was conducted in which the light-emitting element 4 was continuously lit by constant current driving with the initial luminance set at 5000 cd/m$^2$, 87% of the initial luminance was maintained even after 570 hours. Thus, it was proved that the light-emitting element 4 has a long lifetime.

(Fabrication of Light-Emitting Element 5)

First, ITO containing silicon oxide was deposited over a glass substrate 2201 by a sputtering method, whereby a first electrode 2202 was formed. Note that the thickness of the first electrode 2202 was 110 nm and the electrode area was 2 mm×2 mm. Next, the substrate having the first electrode 2202 was fixed to a substrate holder provided in a vacuum deposition apparatus in such a way that the surface of the first electrode 2202 faced downward, and then the pressure was reduced to about 10$^{-4}$ Pa.

Next, 4,4'-bis[N-(1-naphthyl)-N-phenylamino]biphenyl (abbreviation: NPB) and molybdenum(VI) oxide were co-deposited on the first electrode 2202, whereby a layer 2211 containing a composite material was formed. The deposition rate was controlled so that the thickness of the layer 2211 could be 50 nm and the weight ratio of NPB to molybdenum (VI) oxide could be 4:1 (=NPB:molybdenum oxide). Then, a hole transporting layer 2212 was formed by depositing 4,4'-bis[N-(1-naphthyl)-N-phenylamino]biphenyl (abbreviation: NPB) to a thickness of nm by a deposition method using resistance heating.

Next, a light-emitting layer 2213 was formed over the hole transporting layer 2212. The light-emitting layer 2213 was formed by co-depositing 9-[4-(10-phenyl-9-anthryl)phenyl]-9H-carbazole (abbreviation: CzPA) and N-(9,10-diphenyl-2-anthryl)-N,9-diphenyl-9H-carbazol-3-amine (abbreviation: 2PCAPA) to a thickness of 30 nm. Here, the deposition rate was controlled so that the weight ratio of CzPA to 2PCAPA could be 1:0.05 (=CzPA:2PCAPA).

Further, a layer 2214 for controlling the movement of carriers was formed by co-depositing tris(8-quinolinolato)aluminum(III) (abbreviation: Alq) and Coumarin 6 to a thickness of 10 nm over the light-emitting layer 2213. Here, the deposition rate was controlled so that the weight ratio of Alq to Coumarin 6 could be 1:0.01 (=Alq:Coumarin 6).

After that, an electron transporting layer 2215 was formed by depositing bathophenanthroline (abbreviation: BPhen) to a thickness of 30 nm over the layer 2214 for controlling the movement of carriers by a deposition method using resistance heating. Then, an electron injection layer 2216 was formed by depositing lithium fluoride (LiF) to a thickness of 1 nm over the electron transporting layer 2215. Finally, a second electrode 2204 was formed by depositing aluminum to a thickness of 200 nm by a deposition method using resistance heating. Consequently, a light-emitting element 5 was formed.

The light-emitting element 5 of the invention obtained through the above-described process was put into a glove box containing a nitrogen atmosphere so that the light-emitting element was sealed from atmospheric air. Then, the operating characteristics of the light-emitting element 5 were measured. Note that the measurement was conducted at room temperature (atmosphere kept at 25° C.). FIG. 31 shows the current density vs. luminance characteristics of the light-emitting element 5. FIG. 32 shows the voltage vs. luminance characteristics of the light-emitting element 5. FIG. 33 shows the luminance vs. current efficiency characteristics of the light-emitting element 5. FIG. 34 shows the emission spectrum of the light-emitting element 5 with a current supply of 1 mA.

FIG. 26 shows the result of a continuous lighting test in which the light-emitting element 5 was continuously lit by constant current driving with the initial luminance set at 5000 cd/m$^2$ (the vertical axis indicates the relative luminance on the assumption that 5000 cd/m$^2$ is 100%). The emission color of the light-emitting element 5 was located at the CIE chromaticity coordinates of (x=0.30, y=0.63) at the luminance of 5000 cd/m$^2$, and green emission which derives from 2PCAPA was obtained. In addition, the current efficiency and driving voltage of the light-emitting element 5 at the luminance of 5000 cd/m$^2$ were 16 cd/A and 4.5 V, respectively. Further, when a continuous lighting test was conducted in which the light-emitting element 5 was continuously lit by constant current driving with the initial luminance set at 5000 cd/m$^2$, 93% of the initial luminance was maintained even after 150 hours. Thus, it was proved that the light-emitting element 5 has a long lifetime.

(Fabrication of Reference Light-Emitting Element 6)

Next, for the sake of comparison, a reference light-emitting element 6 was formed, which differs from the above-described light-emitting elements 3 to 5 only in that the layer 2214 for controlling the movement of carriers is formed without using an organic compound having an electron trapping property (i.e., the layer 2214 was formed using only Alq). Thus, the reference light-emitting element 6 was formed in a similar manner to the light-emitting elements 3 to 5 except that point. The fabrication method will be described below. First, ITO containing silicon oxide was deposited over a glass substrate by a sputtering method, whereby a first electrode was formed. Note that the thickness of the first electrode was 110 nm and the electrode area was 2 mm×2 mm.

Next, the substrate having the first electrode was fixed to a substrate holder provided in a vacuum deposition apparatus in such a way that the surface of the first electrode faced downward, and then the pressure was reduced to about 10$^{-4}$ Pa. Then, 4,4'-bis[N-(1-naphthyl)-N-phenylamino]biphenyl (abbreviation: NPB) and molybdenum(VI) oxide were co-deposited on the first electrode, whereby a layer containing a composite material was formed. The deposition rate was controlled so that the thickness of the layer containing a composite material could be 50 nm and the weight ratio of NPB to molybdenum(VI) oxide could be 4:1 (=NPB:molybdenum oxide).

Next, a hole transporting layer was formed by depositing 4,4'-bis[N-(1-naphthyl)-N-phenylamino]biphenyl (abbreviation: NPB) to a thickness of nm by a deposition method using resistance heating. Then, a light-emitting layer was formed over the hole transporting layer. The light-emitting layer was formed by co-depositing 9-[4-(10-phenyl-9-anthryl)phenyl]-9H-carbazole (abbreviation: CzPA) and N-(9,10-diphenyl-2-anthryl)-N,9-diphenyl-9H-carbazol-3-amine (abbreviation: 2PCAPA) to a thickness of 30 nm. Here, the deposition rate was controlled so that the weight ratio of CzPA to 2PCAPA could be 1:0.05 (=CzPA:2PCAPA).

Next, tris(8-quinolinolato)aluminum(III) (abbreviation: Alq) was formed to a thickness of 10 nm over the light-emitting layer. That is, a layer made of only Alq was formed unlike the light-emitting elements 3 to 5. After that, an electron transporting layer was formed by depositing bathophenanthroline (abbreviation: BPhen) to a thickness of 30 nm over the layer made of only Alq by a deposition method using resistance heating. Further, an electron injection layer was formed by depositing lithium fluoride (LiF) to a thickness of 1 nm over the electron transporting layer.

Finally, a second electrode was formed by depositing aluminum to a thickness of 200 nm by a deposition method using resistance heating. Consequently, the reference light-emitting element 6 was formed. The reference light-emitting element 6 obtained through the above-described process was put into a glove box containing a nitrogen atmosphere so that the light-emitting element was sealed from atmospheric air. Then, the operating characteristics of the reference light-emitting element 6 were measured. Note that the measurement was conducted at room temperature (atmosphere kept at 25° C.).

The emission color of the reference light-emitting element 6 was located at the CIE chromaticity coordinates of (x=0.28, y=0.64) at the luminance of 5000 cd/m; the current efficiency of the reference light-emitting element 6 was 18 cd/A; and it exhibited green emission which derives from 2PCAPA similarly to the light-emitting elements 3 to 5. However, when a continuous lighting test was conducted in which the reference light-emitting element 6 was continuously lit by constant current driving with the initial luminance set at 5000 cd/m$^2$, luminance has decreased to 75% of the initial luminance after 260 hours. Thus, it was found that the reference light-emitting element 6 has a shorter lifetime than the light-emitting elements 3 to 5. Therefore, it was proved that a long-lifetime light-emitting element can be obtained by applying the invention.

Embodiment 3

In this embodiment, reduction reaction characteristics of tris(8-quinolinolato)aluminum(III) (abbreviation: Alq), N,N'-diphenylquinacridon (abbreviation: DPQd), and Coumarin 6, which are used for the layer for controlling the movement of carriers in the light-emitting elements 1, 3, and 5 fabricated in Embodiments 1 and 2, were observed by cyclic voltammetry (CV) measurement. Further, the LUMO levels of Alq, DPQd, and Coumarin 6 were determined from the measurement results. Note that an electrochemical analyzer (ALS model 600A or 600C, product of BAS Inc.) was used for the measurement.

As for a solution used in the CV measurement, dehydrated dimethylformamide (DMF, product of Sigma-Aldrich Inc., 99.8%, catalog No. 22705-6) was used for a solvent, and Tetra-n-butylammonium perchlorate (n-Bu$_4$NClO$_4$, product of Tokyo Chemical Industry Co., Ltd., catalog No. T0836), which is a supporting electrolyte, was dissolved in the solvent such that the concentration of tetra-n-butylammonium perchlorate was 100 mmol/L. Further, the object to be measured was also dissolved in the solvent such that the concentration thereof was 1 mmol/L. In addition, a platinum electrode (a PTE platinum electrode, product of BAS Inc.) was used as a working electrode; a platinum electrode (a VC-3 Pt counter electrode (5 cm), product of BAS Inc.) was used as an auxiliary electrode; and an Ag/Ag$^+$ electrode (an RE5 nonaqueous solvent reference electrode, product of BAS Inc.) was used as a reference electrode. Note that the measurement was conducted at room temperature (20 to 25° C.).

[Calculation of the Potential Energy of the Reference Electrode with Respect to the Vacuum Level]

First, potential energy (eV) of the reference electrode (Ag/Ag$^+$ electrode) used in Embodiment 3 with respect to the vacuum level was calculated. That is, the Fermi level of the Ag/Ag$^+$ electrode was calculated. It is known that the oxidation-reduction potential of ferrocene in methanol is +0.610 V [vs. SHE] with respect to a standard hydrogen electrode (Reference: Christian R. Goldsmith et al., J. Am. Chem. Soc., Vol. 124, No. 1, pp. 83-96, 2002). On the other hand, when the oxidation-reduction potential of ferrocene in methanol was calculated using the reference electrode used in Embodiment 3, the result was +0.20 V [vs. Ag/Ag$^+$].

Therefore, it was found that the potential energy of the reference electrode used in Embodiment 3 was lower than that of the standard hydrogen electrode by 0.41 [eV]. Here, it is also known that the potential energy of the standard hydrogen electrode with respect to the vacuum level is −4.44 eV (Reference: Toshihiro Ohnishi and Tamami Koyama, High molecular EL material, Kyoritsu shuppan, pp. 64-67). Accordingly, the potential energy of the reference electrode used in Embodiment 3 with respect to the vacuum level could be determined to be −4.44−0.41=−4.85 [eV].

Measurement Example 1

Alq

In Measurement Example 1, the reduction reaction characteristics of Alq were observed by cyclic voltammetry (CV) measurement. The scan rate was set at 0.1 V/sec. FIG. 35 shows the measurement result. Note that the measurement of the reduction reaction characteristics was conducted by the steps of: scanning the potential of the working electrode with respect to the reference electrode in ranges of (1) −0.69 V to −2.40 V, and then (2) −2.40 V to −0.69 V.

As shown in FIG. 35, it can be seen that a reduction peak potential $E_{pc}$ is −2.20 V and an oxidation peak potential $E_{pa}$ is −2.12 V. Therefore, a half-wave potential (an intermediate potential between $E_{pc}$ and $E_{pa}$) can be determined to be −2.16 V. This shows that Alq can be reduced by an electrical energy of −2.16 V [vs. Ag/Ag$^+$], and this energy corresponds to the LUMO level. Here, the potential energy of the reference electrode used in Embodiment 3 with respect to the vacuum level is −4.85 [eV] as described above. Therefore, the LUMO level of Alq can be determined to be −4.85−(−2.16)=−2.69 [eV].

Measurement Example 2

DPQd

In Measurement Example 2, the reduction reaction characteristics of DPQd were observed by cyclic voltammetry (CV) measurement. The scan rate was set at 0.1 V/sec. FIG. 36 shows the measurement result. Note that the measurement of the reduction reaction characteristics was conducted by the steps of: scanning the potential of the working electrode with respect to the reference electrode in ranges of (1) −0.40 V to −2.10 V, and then (2) −2.10 V to −0.40 V. In addition, since DPQd which has low solubility could not be completely dissolved in a solvent even when the solution was adjusted to contain DPQd at a concentration of 1 mmol/L, the measurement was conducted by taking a supernatant liquid while an undissolved portion is precipitated at the bottom.

As shown in FIG. 36, it can be seen that a reduction peak potential $E_{pc}$ is −1.69 V and an oxidation peak potential $E_{pa}$ is −1.63 V. Therefore, a half-wave potential (an intermediate potential between $E_{pc}$ and $E_{pa}$) can be determined to be −1.66 V. This shows that DPQd can be reduced by an electrical energy of −1.16 V [vs. Ag/Ag$^+$], and this energy corresponds to the LUMO level. Here, the potential energy of the reference electrode used in Embodiment 3 with respect to the vacuum level is −4.85 [eV] as described above. Therefore, the LUMO level of DPQd can be determined to be −4.85−(−1.16)=−3.19 [eV].

Note that when the LUMO levels of Alq and DPQd which were calculated in the above-described manner are compared, it can be found that the LUMO level of DPQd is lower than that of Alq by as much as 0.50 [eV]. This means that DPQd can function as electron traps when added into Alq. Therefore, for the light-emitting element of the invention, it is quite advantageous to use the element structure shown in Embodiments 1 and 2 in which DPQd is used as the second organic compound of the second layer and Alq is used as the first organic compound thereof.

Note that 9,18-dihydro-9,18-dimethyl-benzo[h]benzo[7,8]quino[2,3-b]acridine-7,16-dione (abbreviation: DMNQd-2) used for the light-emitting element 4 has extremely low solubility, and thus it could not be measured by CV. DMNQd-2 is a quinacridone derivative like DPQd. Therefore, it has a carbonyl group in its molecular skeleton and thus has a strong electron trapping property. Therefore, DMNQd-2 can be considered to have similar physical properties to DPQd.

Measurement Example 3

Coumarin 6

In Measurement Example 3, the reduction reaction characteristics of Coumarin 6 were observed by cyclic voltammetry (CV) measurement. The scan rate was set at 0.1 V/sec. FIG. 37 shows the measurement result. Note that the measurement of the reduction reaction characteristics was conducted by the steps of: scanning the potential of the working electrode with respect to the reference electrode in ranges of (1) −0.31 V to −2.00 V, and then (2) −2.00 V to −0.31 V.

As shown in FIG. 37 it can be seen that a reduction peak potential $E_{pc}$ is −1.85 V and an oxidation peak potential $E_{pa}$ is −1.77 V. Therefore, a half-wave potential (an intermediate potential between $E_{pc}$ and $E_{pa}$) can be determined to be −1.81 V. This shows that Coumarin 6 can be reduced by an electrical energy of −1.81 V [vs. Ag/Ag$^+$], and this energy corresponds to the LUMO level. Here, the potential energy of the reference electrode used in Embodiment 3 with respect to the vacuum level is −4.85 [eV] as described above. Therefore, the LUMO level of Coumarin 6 can be determined to be −4.85−(−1.81)= −3.04 [eV].

Note that when the LUMO levels of Alq and Coumarin 6 which were calculated in the above-described manner are compared, it can be found that the LUMO level of Coumarin 6 is lower than that of Alq by as much as 0.35 [eV]. This means that Coumarin 6 can function as electron traps when added into Alq. Therefore, for the light-emitting element of the invention, it is quite advantageous to use the element structure shown in Embodiment 2 in which Coumarin 6 is used as the second organic compound of the layer for controlling the movement of carriers and Alq is used as the first organic compound thereof.

Embodiment 4

This embodiment will specifically describe a fabrication example of the light-emitting element of the invention and the characteristics of the fabricated light-emitting element, with reference to the stacked structure in FIG. 16. In addition, the characteristics will be specifically described with reference to graphs showing the measurement results.
(Fabrication of Light-Emitting Element 7)

First, ITO containing silicon oxide was deposited over a glass substrate 2201 by a sputtering method, whereby a first electrode 2202 was formed. Note that the thickness of the first electrode 2202 was 110 nm and the electrode area was 2 mm×2 mm.

Next, the substrate having the first electrode 2202 was fixed to a substrate holder provided in a vacuum deposition apparatus in such a way that the surface of the first electrode 2202 faced downward, and then the pressure was reduced to about 10$^{-4}$ Pa. Then, 4,4'-bis[N-(1-naphthyl)-N-phenylamino]biphenyl (abbreviation: NPB) and molybdenum(VI) oxide were co-deposited on the first electrode 2202, whereby a layer 2211 containing a composite material was formed. The deposition rate was controlled so that the thickness of the layer 2211 could be 50 nm and the weight ratio of NPB to molybdenum(VI) oxide could be 4:1 (=NPB:molybdenum oxide). Note that the co-deposition method is a deposition method in which deposition is performed using a plurality of evaporation sources at the same time in one treatment chamber.

Next, a hole transporting layer 2212 was formed by depositing 4,4'-bis[N-(1-naphthyl)-N-phenylamino]biphenyl (abbreviation: NPB) to a thickness of nm by a deposition method using resistance heating. Then, a light-emitting layer 2213 was formed over the hole transporting layer 2212. The light-emitting layer 2213 was formed by co-depositing 9-[4-(10-phenyl-9-anthryl)phenyl]-9H-carbazole (abbreviation: CzPA) and N-(9,10-diphenyl-2-anthryl)-N,9-diphenyl-9H-carbazol-3-amine (abbreviation: 2PCAPA) to a thickness of 30 nm. Here, the deposition rate was controlled so that the weight ratio of CzPA to 2PCAPA could be 1:0.05 (=CzPA: 2PCAPA).

Further, a layer 2214 for controlling the movement of carriers was formed by co-depositing tris(8-quinolinolato)aluminum(III) (abbreviation: Alq) and N,N'-diphenylquinacridon (abbreviation: DPQd) to a thickness of 10 nm over the light-emitting layer 2213. Here, the deposition rate was controlled so that the weight ratio of Alq to DPQd could be 1:0.002 (=Alq:DPQd).

After that, an electron transporting layer 2215 was formed by depositing tris(8-quinolinolato)aluminum(III) (abbreviation: Alq) to a thickness of 30 nm over the layer 2214 for controlling the movement of carriers by a deposition method using resistance heating. Then, an electron injection layer 2216 was formed by depositing lithium fluoride (LiF) to a thickness of 1 nm over the electron transporting layer 2215.

Finally, a second electrode 2204 was formed by depositing aluminum to a thickness of 200 nm by a deposition method using resistance heating. Consequently, a light-emitting element 7 was formed. The light-emitting element 7 of the invention obtained through the above-described process was put into a glove box containing a nitrogen atmosphere so that the light-emitting element was sealed from atmospheric air. Then, the operating characteristics of the light-emitting element 7 were measured. Note that the measurement was conducted at room temperature (atmosphere kept at 25° C.). FIG. 38 shows the current density vs. luminance characteristics of the light-emitting element 7. FIG. 39 shows the voltage vs. luminance characteristics of the light-emitting element 7. FIG. 40 shows the luminance vs. current efficiency characteristics of the light-emitting element 7. FIG. 41 shows the emission spectrum of the light-emitting element 7 with a current supply of 1 mA.

FIG. 42 shows the result of a continuous lighting test in which the light-emitting element 7 was continuously lit by constant current driving at 80° C. with the initial luminance set at 1000 cd/m$^2$ (the vertical axis indicates the relative luminance on the assumption that 1000 cd/m$^2$ is 100%). The emission color of the light-emitting element 7 was located at the CIE chromaticity coordinates of (x=0.28, y=0.65) at the luminance of 1040 cd/m$^2$, and green emission which derives from 2PCAPA was obtained. In addition, the current efficiency, driving voltage, and power efficiency of the light-emitting element 7 at the luminance of 1040 cd/m$^2$ were 16 cd/A, 5.4 V, and 9.11 m/W, respectively.

Further, when a continuous lighting test was conducted in which the light-emitting element 7 was continuously lit by constant current driving at 80° C. with the initial luminance set at 1000 cd/m$^2$, 96% of the initial luminance was maintained even after 1000 hours, and yet 94% of the initial luminance was maintained even after 1700 hours. Thus, a light-emitting element having a very long lifetime even in the high-temperature environment of 80° C. could be obtained. Therefore, it was proved that a long-lifetime light-emitting element can be obtained by applying the invention.

Embodiment 5

This embodiment will specifically describe a fabrication example of the light-emitting element of the invention which differs from that shown in Embodiment 4, and the characteristics of the fabricated light-emitting element, with reference to the stacked structure in FIG. 16. In addition, the characteristics will be specifically described with reference to graphs showing the measurement results.
(Fabrication of Light-Emitting Element 8)

First, ITO containing silicon oxide was deposited over a glass substrate 2201 by a sputtering method, whereby a first electrode 2202 was formed. Note that the thickness of the first electrode 2202 was 110 nm and the electrode area was 2 mm×2 mm.

Next, the substrate having the first electrode 2202 was fixed to a substrate holder provided in a vacuum deposition apparatus in such a way that the surface of the first electrode 2202 faced downward, and then the pressure was reduced to about $10^{-4}$ Pa. Then, 4,4'-bis[N-(1-naphthyl)-N-phenylamino]biphenyl (abbreviation: NPB) and molybdenum(VI) oxide were co-deposited on the first electrode 2202, whereby a layer 2211 containing a composite material was formed. The deposition rate was controlled so that the thickness of the layer 2211 could be 50 nm and the weight ratio of NPB to molybdenum(VI) oxide could be 4:1 (=NPB:molybdenum oxide).

Next, a hole transporting layer 2212 was formed by depositing 4,4'-bis[N-(1-naphthyl)-N-phenylamino]biphenyl (abbreviation: NPB) to a thickness of 10 nm by a deposition method using resistance heating. Further, a light-emitting layer 2213 was formed over the hole transporting layer 2212. The light-emitting layer 2213 was formed by co-depositing 9-[4-(10-phenyl-9-anthryl)phenyl]-9H-carbazole (abbreviation: CzPA) and N-(9,10-diphenyl-2-anthryl)-N,9-diphenyl-9H-carbazol-3-amine (abbreviation: 2PCAPA) to a thickness of 30 nm. Here, the deposition rate was controlled so that the weight ratio of CzPA to 2PCAPA could be 1:0.05 (=CzPA:2PCAPA).

Further, a layer 2214 for controlling the movement of carriers was formed by co-depositing tris(8-quinolinolato)aluminum(III) (abbreviation: Alq) and N,N'-diphenylquinacridon (abbreviation: DPQd) to a thickness of 10 nm over the light-emitting layer 2213. Here, the deposition rate was controlled so that the weight ratio of Alq to DPQd could be 1:0.002 (=Alq:DPQd).

After that, an electron transporting layer 2215 was formed by depositing bathophenanthroline (abbreviation: BPhen) to a thickness of 30 nm over the layer 2214 for controlling the movement of carriers by a deposition method using resistance heating. Then, an electron injection layer 2216 was formed by depositing lithium fluoride (LiF) to a thickness of 1 nm over the electron transporting layer 2215. Finally, a second electrode 2204 was formed by depositing aluminum to a thickness of 200 nm by a deposition method using resistance heating. Consequently, a light-emitting element 8 was formed.

The light-emitting element 8 of the invention obtained through the above-described process was put into a glove box containing a nitrogen atmosphere so that the light-emitting element was sealed from atmospheric air. Then, the operating characteristics of the light-emitting element 8 were measured. Note that the measurement was conducted at room temperature (atmosphere kept at 25° C.). FIG. 43 shows the current density and luminance of the light-emitting element 8. FIG. 44 shows the voltage vs. luminance characteristics of the light-emitting element 8. FIG. 45 shows the luminance vs. current efficiency characteristics of the light-emitting element 8. FIG. 46 shows the emission spectrum of the light-emitting element 8 with a current supply of 1 mA.

In addition, FIG. 47 shows the result of a continuous lighting test in which the light-emitting element 8 was continuously lit by constant current driving with the initial luminance set at 1000 cd/m$^2$ (the vertical axis indicates the relative luminance on the assumption that 1000 cd/m$^2$ is 100%). The emission color of the light-emitting element 8 was located at the CIE chromaticity coordinates of (x=0.27, y=0.65) at the luminance of 1440 cd/m$^2$, and green emission which derives from 2PCAPA was obtained. In addition, the current efficiency, driving voltage, and power efficiency of the light-emitting element 8 at the luminance of 1440 cd/m$^2$ were 17 cd/A, 3.8 V, and 141 m/W, respectively.

Further, when a continuous lighting test was conducted in which the light-emitting element 8 was continuously lit by constant current driving with the initial luminance set at 1000 cd/m$^2$, 99% of the initial luminance was maintained even after 3300 hours. Thus, the light-emitting element 8 was found to have a long lifetime. Therefore, it was proved that a long-lifetime light-emitting element can be obtained by applying the invention.

Embodiment 6

This embodiment will specifically describe fabrication examples of the light-emitting element of the invention which differs from those shown in Embodiments 4 and 5, and the characteristics of the fabricated light-emitting element, with reference to the stacked structure in FIG. 48. In addition, the characteristics will be specifically described with reference to graphs showing the measurement results. Structural formulae of organic compounds used in Embodiment 6 are shown below. Note that the organic compounds that are already described in the preceding embodiments are omitted.

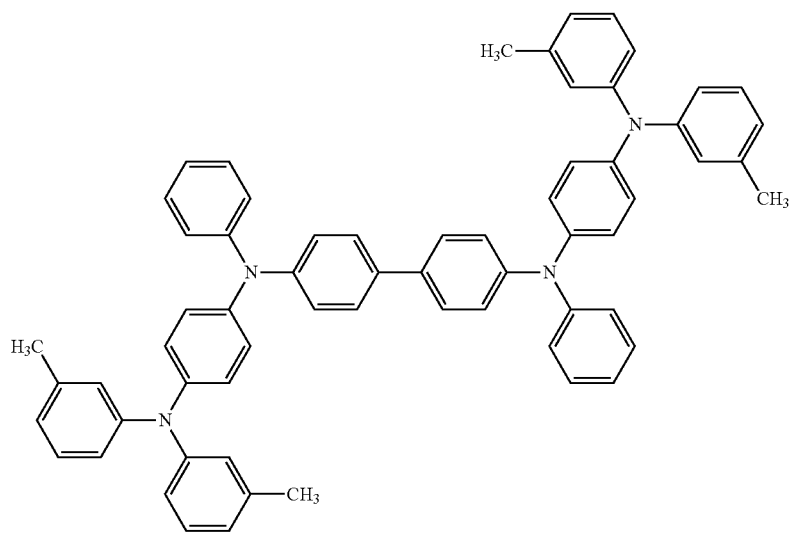

DNTPD

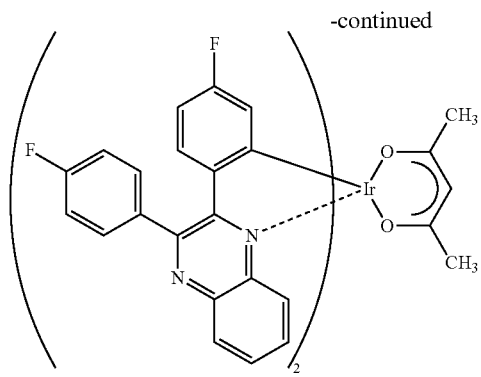

Ir(Fdpq)₂(acac)

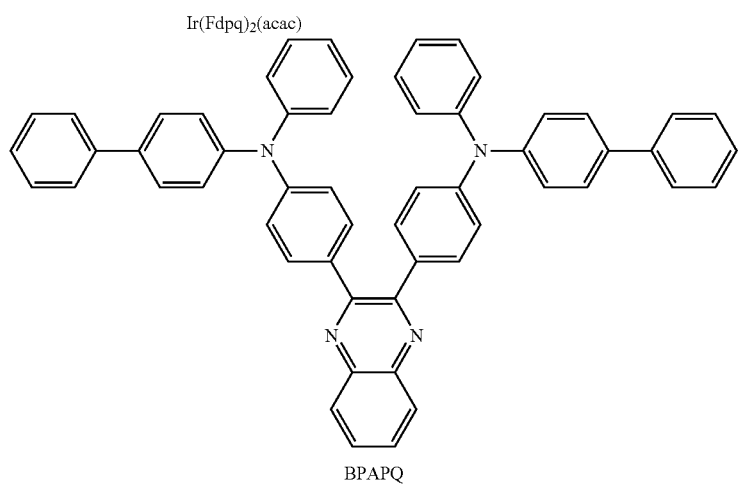

BPAPQ (Fabrication of Light-Emitting Element 9)

First, ITO containing silicon oxide was deposited over a glass substrate 2401 by a sputtering method, whereby a first electrode 2402 was formed. Note that the thickness of the first electrode 2402 was 110 nm and the electrode area was 2 mm×2 mm. Next, the substrate having the first electrode 2402 was fixed to a substrate holder provided in a vacuum deposition apparatus in such a way that the surface of the first electrode 2402 faced downward, and then the pressure was reduced to about $10^{-4}$ Pa.

Then, 4,4'-bis[N-(1-naphthyl)-N-phenylamino]biphenyl (abbreviation: NPB) and molybdenum(VI) oxide were co-deposited on the first electrode 2402, whereby a layer 2411 containing a composite material was formed. The deposition rate was controlled so that the thickness of the layer 2411 could be 50 nm and the weight ratio of NPB to molybdenum (VI) oxide could be 4:1 (=NPB:molybdenum oxide).

Next, a hole transporting layer 2412 was formed by depositing 4,4'-bis[N-(1-naphthyl)-N-phenylamino]biphenyl (abbreviation: NPB) to a thickness of nm by a deposition method using resistance heating. Further, a layer 2413 for controlling the movement of carriers was formed by co-depositing 2,3-bis{4-[N-(4-biphenylyl)-N-phenylamino] phenyl}quinoxaline (abbreviation: BPAPQ) and 4,4'-bis(N-{4-[N'-(3-methylphenyl)-N'-phenylamino]phenyl}-N-phenylamino)biphenyl (abbreviation: DNTPD) to a thickness of 10 nm over the hole transporting layer 2412. Here, the deposition rate was controlled so that the weight ratio of BPAPQ to DNTPD could be 1:0.1 (=BPAPQ:DNTPD).

Then, a light-emitting layer 2414 was formed over the layer 2413 for controlling the movement of carriers. The light-emitting layer 2414 was formed by co-depositing 2,3-bis{4-[N-(4-biphenylyl)-N-phenylamino]phenyl}quinoxaline (abbreviation: BPAPQ) and (acetylacetonato)bis[2,3-bis(4-fluorophenyl)quinoxalinato]iridium(III) (abbreviation: Ir(Fdpq)₂(acac)) to a thickness of 20 nm. Here, the deposition rate was controlled so that the weight ratio of BPAPQ to Ir(Fdpq)₂(acac) could be 1:0.07 (=BPAPQ:Ir(Fdpq)₂(acac)).

After that, an electron transporting layer 2415 was formed by depositing tris(8-quinolinolato)aluminum(III) (abbreviation: Alq) to a thickness of 10 nm over the light-emitting layer 2414. Then, an electron injection layer 2416 was formed by co-depositing tris(8-quinolinolato)aluminum(III) (abbreviation: Alq) and lithium (Li) to a thickness of 50 nm over the electron transporting layer 2415. Here, the deposition rate was controlled so that the weight ratio of Alq to Li could be 1:0.01 (=Alq:Li).

Finally, a second electrode 2404 was formed by depositing aluminum to a thickness of 200 nm by a deposition method using resistance heating. Consequently, a light-emitting element 9 was formed. The light-emitting element 9 of the invention obtained through the above-described process was put into a glove box containing a nitrogen atmosphere so that the light-emitting element was sealed from atmospheric air. Then, the operating characteristics of the light-emitting element 9 were measured. Note that the measurement was conducted at room temperature (atmosphere kept at 25° C.).

FIG. 49 shows the current density vs. luminance characteristics of the light-emitting element 9. FIG. 50 shows the voltage vs. luminance characteristics of the light-emitting element 9. FIG. 51 shows the luminance vs. current efficiency characteristics of the light-emitting element 9. FIG. 52 shows the emission spectrum of the light-emitting element 9 with a current supply of 1 mA. In addition, FIG. 53 shows the result of a continuous lighting test in which the light-emitting element 9 was continuously lit by constant current driving with the initial luminance set at 1000 cd/m$^2$ (the vertical axis indicates the relative luminance on the assumption that 1000 cd/m$^2$ is 100%).

The emission color of the light-emitting element 9 was located at the CIE chromaticity coordinates of (x=0.70, y=0.30) at the luminance of 1060 cd/m$^2$, and red emission which derives from Ir(Fdpq)$_2$(acac) was obtained. In addition, the current efficiency, driving voltage, and power efficiency of the light-emitting element 9 at the luminance of 1060 cd/m$^2$ were 4.7 cd/A, 6.2 V, and 2.41 m/W, respectively. Further, when a continuous lighting test was conducted in which the light-emitting element 9 was continuously lit by constant current driving with the initial luminance set at 1000 cd/m$^2$, 74% of the initial luminance was maintained even after 2400 hours. Thus, it was proved that the light-emitting element 9 has a long lifetime.

(Fabrication of Light-Emitting Element 10)

A light-emitting element 10 was formed by using 2,3-bis{4-[N-(4-biphenylyl)-N-phenylamino]phenyl}quinoxaline (abbreviation: BPAPQ) and 4,4'4''-tris[N-(1-naphthyl)-N-phenylamino]triphenylamine (abbreviation: 1-TNATA) for the layer 2413 for controlling the movement of carriers of the light-emitting element 9.

That is, the layer 2413 for controlling the movement of carriers was formed by co-depositing 2,3-bis{4-[N-(4-biphenylyl)-N-phenylamino]phenyl}quinoxaline (abbreviation: BPAPQ) and 4,4'4''-tris[N-(1-naphthyl)-N-phenylamino]triphenylamine (abbreviation: 1-TNATA) to a thickness of 10 nm over the hole transporting layer 2412. Here, the deposition rate was controlled so that the weight ratio of BPAPQ to 1-TNATA could be 1:0.1 (=BPAPQ:1-TNATA). Note that layers other than the layer 2413 for controlling the movement of carriers were formed in a similar manner to those of the light-emitting element 9.

The light-emitting element 10 of the invention obtained through the above-described process was put into a glove box containing a nitrogen atmosphere so that the light-emitting element was sealed from atmospheric air. Then, the operating characteristics of the light-emitting element 10 were measured. Note that the measurement was conducted at room temperature (atmosphere kept at 25° C.). FIG. 54 shows the current density vs. luminance characteristics of the light-emitting element 10. FIG. 55 shows the voltage vs. luminance characteristics of the light-emitting element 10. FIG. 56 shows the luminance vs. current efficiency characteristics of the light-emitting element 10. FIG. 57 shows the emission spectrum of the light-emitting element 10 with a current supply of 1 mA. In addition, FIG. 58 shows the result of a continuous lighting test in which the light-emitting element 10 was continuously lit by constant current driving with the initial luminance set at 1000 cd/m$^2$ (the vertical axis indicates the relative luminance on the assumption that 1000 cd/m$^2$ is 100%).

The emission color of the light-emitting element 10 was located at the CIE chromaticity coordinates of (x=0.70, y=0.30) at the luminance of 960 cd/m$^2$, and red emission which derives from Ir(Fdpq)$_2$(acac) was obtained. In addition, the current efficiency, driving voltage, and power efficiency of the light-emitting element 10 at the luminance of 960 cd/m$^2$ were 5.1 cd/A, 7.0 V, and 2.31 m/W, respectively. Further, when a continuous lighting test was conducted in which the light-emitting element 10 was continuously lit by constant current driving with the initial luminance set at 1000 cd/m$^2$, 84% of the initial luminance was maintained even after 1100 hours. Thus, it was proved that the light-emitting element 10 has a long lifetime.

(Fabrication of Reference Light-Emitting Element 11)

Next, for the sake of comparison, a reference light-emitting element 11 was formed, which does not include the layer 2413 for controlling the movement of carriers unlike the above-described light-emitting elements 9 and 10. First, ITO containing silicon oxide was deposited over a glass substrate by a sputtering method, whereby a first electrode was formed. Note that the thickness of the first electrode was 110 nm and the electrode area was 2 mm×2 mm.

Next, the substrate having the first electrode was fixed to a substrate holder provided in a vacuum deposition apparatus in such a way that the surface of the first electrode faced downward, and then the pressure was reduced to about 10$^{-4}$ Pa. Then, 4,4'-bis[N-(1-naphthyl)-N-phenylamino]biphenyl (abbreviation: NPB) and molybdenum(VI) oxide were co-deposited on the first electrode, whereby a layer containing a composite material was formed. The deposition rate was controlled so that the thickness of the layer containing a composite material could be 50 nm and the weight ratio of NPB to molybdenum(VI) oxide could be 4:1 (=NPB:molybdenum oxide). After that, a hole transporting layer was formed by depositing 4,4'-bis[N-(1-naphthyl)-N-phenylamino]biphenyl (abbreviation: NPB) to a thickness of 10 nm by a deposition method using resistance heating.

Next, a light-emitting layer was formed over the hole transporting layer. The light-emitting layer was formed by co-depositing 2,3-bis{4-[N-(4-biphenylyl)-N-phenylamino]phenyl}quinoxaline (abbreviation: BPAPQ) and (acetylacetonato)bis[2,3-bis(4-fluorophenyl)quinoxalinato]iridium(III) (abbreviation: Ir(Fdpq)$_2$(acac)) to a thickness of 30 nm. Here, the deposition rate was controlled so that the weight ratio of BPAPQ to Ir(Fdpq)$_2$(acac) could be 1:0.07 (=BPAPQ:Ir(Fdpq)$_2$(acac)). That is, unlike the light-emitting elements 9 and 10, the light-emitting layer was formed over the hole transporting layer without providing the layer for controlling the movement of carriers therebetween.

After that, an electron transporting layer was formed by depositing tris(8-quinolinolato)aluminum(III) (abbreviation: Alq) to a thickness of 10 nm over the light-emitting layer by a deposition method using resistance heating. Then, an electron injection layer was formed by co-depositing tris(8-quinolinolato)aluminum(III) (abbreviation: Alq) and lithium (Li) to a thickness of 50 nm over the electron transporting layer. Here, the deposition rate was controlled so that the weight ratio of Alq to Li could be 1:0.01 (=Alq:Li).

Finally, a second electrode was formed by depositing aluminum to a thickness of 200 nm by a deposition method using resistance heating. Consequently, the reference light-emitting element 11 was formed. The reference light-emitting element 11 obtained through the above-described process was put into a glove box containing a nitrogen atmosphere so that the light-emitting element was sealed from atmospheric air. Then, the operating characteristics of the light-emitting element 11 were measured. Note that the measurement was conducted at room temperature (atmosphere kept at 25° C.).

FIG. 59 shows the current density vs. luminance characteristics of the light-emitting element 11. FIG. 60 shows the voltage vs. luminance characteristics of the light-emitting element 11. FIG. 61 shows the luminance vs. current efficiency characteristics of the light-emitting element 11. FIG. 62 shows the emission spectrum of the light-emitting element 11 with a current supply of 1 mA. In addition, FIG. 63 shows the result of a continuous lighting test in which the light-emitting element 11 was continuously lit by constant current driving with the initial luminance set at 1000 cd/m² (the vertical axis indicates the relative luminance on the assumption that 1000 cd/m² is 100%).

The emission color of the reference light-emitting element 11 was located at the CIE chromaticity coordinates of (x=0.65, y=0.34) at the luminance of 1140 cd/m², and red emission which derives from Ir(Fdpq)$_2$(acac) was obtained. However, as is apparent from FIG. 62, emission of Alq which is in contact with the light-emitting layer is also seen, which means the color purity of the reference light-emitting element 11 is lower than those of the light-emitting elements 9 and 10. That is, it can be said that the reference light-emitting element 11 has a worse carrier balance than the light-emitting elements 9 and 10.

In addition, the current efficiency, driving voltage, and power efficiency of the reference light-emitting element 11 at the luminance of 1140 cd/m² were 2.9 cd/A, 4.8 V, and 1.91 m/W, respectively. Further, when a continuous lighting test was conducted in which the reference light-emitting element 11 was continuously lit by constant current driving with the initial luminance set at 1000 cd/m², luminance has decreased to 73% of the initial luminance after 1300 hours. Thus, it was found that the reference light-emitting element 11 has a shorter lifetime than the light-emitting elements 9 and 10. Therefore, it was proved that a long-lifetime light-emitting element can be obtained by applying the invention.

Embodiment 7

In this embodiment, oxidation reaction characteristics of 2,3-bis{4-[N-(4-biphenylyl)-N-phenylamino]phenyl}quinoxaline (abbreviation: BPAPQ) and (abbreviation: DNTPD), which are used for the layer for controlling the movement of carriers in the light-emitting element 9 formed in Embodiment 6, were observed by cyclic voltammetry (CV) measurement. Further, the HOMO levels of BPAPQ and DNTPD were determined from the measurement results. Note that an electrochemical analyzer (ALS model 600A or 600C, product of BAS Inc.) was used for the measurement.

The CV measurement was conducted in a similar manner to Embodiment 4. As for a solution used in the CV measurement, dehydrated dimethylformamide (DMF, product of Sigma-Aldrich Co., 99.8%, catalog No. 22705-6) was used for a solvent, and Tetra-n-butylammonium perchlorate (n-Bu$_4$NClO$_4$, product of Tokyo Chemical Industry Co., Ltd., catalog No. T0836), which is a supporting electrolyte, was dissolved in the solvent such that the concentration of tetra-n-butylammonium perchlorate was 100 mmol/L. Further, the object to be measured was also dissolved in the solvent such that the concentration thereof was 1 mmol/L. In addition, a platinum electrode (a PTE platinum electrode, product of BAS Inc.) was used as a working electrode; a platinum electrode (a VC-3 Pt counter electrode (5 cm), product of BAS Inc.) was used as an auxiliary electrode; and an Ag/Ag$^+$ electrode (an RE5 nonaqueous solvent reference electrode, product of BAS Inc.) was used as a reference electrode. Note that the measurement was conducted at room temperature (20 to 25° C.).

[Calculation of the Potential Energy of the Reference Electrode with Respect to the Vacuum Level]

First, potential energy (eV) of the reference electrode (Ag/Ag$^+$ electrode) used in Embodiment 7 with respect to the vacuum level was calculated by the method described in Embodiment 3. As a result, the potential energy of the reference electrode used in Embodiment 7 with respect to the vacuum level could be determined to be −4.44−0.41=−4.85 [eV]

Measurement Example 4

BPAPQ

In Measurement Example 4, the oxidation reaction characteristics of BPAPQ were observed by cyclic voltammetry (CV) measurement. The scan rate was set at 0.1 V/sec. FIG. 64 shows the measurement result. Note that the measurement of the oxidation reaction characteristics was conducted by the steps of: scanning the potential of the working electrode with respect to the reference electrode in ranges of (1) −0.16 V to 1.00 V, and then (2) 1.00 V to −0.16 V.

As shown in FIG. 64, it can be seen that an oxidation peak potential $E_{pa}$ is 0.78 V and a reduction peak potential $E_{pc}$ is 0.60 V. Therefore, a half-wave potential (an intermediate potential between $E_{pc}$ and $E_{pa}$) can be determined to be 0.69 V. This shows that BPAPQ can be oxidized by an electrical energy of 0.69 V [vs. Ag/Ag$^+$], and this energy corresponds to the HOMO level. Here, the potential energy of the reference electrode used in Embodiment 7 with respect to the vacuum level is −4.85 [eV] as described above. Therefore, the HOMO level of BPAPQ can be determined to be −4.85−0.69=−5.54 [eV].

Measurement Example 5

DNTPD

In Measurement Example 5, the oxidation reaction characteristics of DNTPD were observed by cyclic voltammetry (CV) measurement. The scan rate was set at 0.1 V/sec. FIG. 65 shows the measurement result. Note that the measurement of the oxidation reaction characteristics was conducted by the steps of: scanning the potential of the working electrode with respect to the reference electrode in ranges of (1) −0.05 V to 1.20 V, and then (2) 1.20 V to −0.05 V.

As shown in FIG. 65, it can be seen that an oxidation peak potential $E_{pa}$ is 0.16 V and a reduction peak potential $E_{pc}$ is 0.26 V. Therefore, a half-wave potential (an intermediate potential between $E_{pc}$ and $E_{pa}$) can be determined to be 0.21 V. This shows that DPQd can be oxidized by an electrical energy of 0.21 V [vs. Ag/Ag$^+$], and this energy corresponds to the HOMO level. Here, the potential energy of the reference electrode used in Embodiment 7 with respect to the vacuum level is −4.85 [eV] as described above. Therefore, the HOMO level of DPQd can be determined to be −4.85−0.21=−5.06 [eV].

Note that when the HOMO levels of BPAPQ and DNTPD which were calculated in the above-described manner are compared, it can be found that the HOMO level of DNTPD was lower than that of BPAPQ by as much as 0.48 [eV]. This means that DNTPD can function as hole traps when added into BPAPQ. Therefore, for the light-emitting element of the invention, it is quite advantageous to use the element structure shown in Embodiment 6 in which DNTPD is used as the second organic compound of the second layer and BPAPQ is used as the first organic compound thereof.

The present application is based on Japanese Priority applications No. 2006-184653 filed on Jul. 4, 2006; No. 2006-327610 filed on Dec. 4, 2006; and No. 2007-073089 filed on Mar. 20, 2007 with the Japanese Patent Office, the entire contents of which are hereby incorporated by reference.

What is claimed is:

1. A light-emitting device comprising:
a first electrode;
a second electrode;
a light-emitting layer formed between the first electrode and the second electrode; and
a layer formed between the light-emitting layer and the second electrode, the layer controlling a movement of carriers,
wherein the layer contains a first organic compound and a second organic compound,
wherein the first organic compound comprises an electron transporting property,
wherein the second organic compound comprises an electron trapping property,
wherein a weight percent of the first organic compound is higher than a weight percent of the second organic compound in the layer,
wherein the light-emitting layer comprises a phosphorescent material, and
wherein the light-emitting layer emits light when a voltage is applied such that a potential of the first electrode is higher than a potential of the second electrode.

2. The light-emitting device according to claim 1, wherein the second organic compound comprises a phosphorescent material.

3. The light-emitting device according to claim 1, wherein a lowest unoccupied molecular orbital level of the second organic compound is lower than a lowest unoccupied molecular orbital level of the first organic compound by 0.3 eV or more.

4. The light-emitting device according to claim 1, wherein a thickness of the layer is 5 nm to 20 nm.

5. The light-emitting device according to claim 1, wherein a concentration of the second organic compound is in a range of 0.1 wt % to 5 wt % or in a range of 0.1 mol % to 5 mol %.

6. A light-emitting device comprising:
an anode;
a cathode;
a light-emitting layer formed between the anode and the cathode; and
a layer formed between the light-emitting layer and the cathode, the layer controlling a movement of carriers,
wherein the layer contains a first organic compound and a second organic compound,
wherein the first organic compound comprises an electron transporting property;
wherein the second organic compound comprises an electron trapping property,
wherein a weight percent of the first organic compound is higher than a weight percent of the second organic compound in the layer, and
wherein the light-emitting layer comprises a phosphorescent material.

7. The light-emitting device according to claim 6, wherein the second organic compound comprises a phosphorescent material.

8. The light-emitting device according to claim 6, wherein a lowest unoccupied molecular orbital level of the second organic compound is lower than a lowest unoccupied molecular orbital level of the first organic compound by 0.3 eV or more.

9. The light-emitting device according to claim 6, wherein a thickness of the layer is 5 nm to 20 mm.

10. The light-emitting device according to claim 6, wherein a concentration of the second organic compound is in a range of 0.1 wt % to 5 wt % or in a range of 0.1 mol % to 5 mol %.

11. A lighting device comprising:
a first electrode;
a second electrode;
a light-emitting layer formed between the first electrode and the second electrode; and
a layer formed between the light-emitting layer and the second electrode, the layer controlling a movement of carriers,
wherein the layer contains a first organic compound and a second organic compound,
wherein the first organic compound comprises an electron transporting property,
wherein the second organic compound comprises an electron trapping property,
wherein a weight percent of the first organic compound is higher than a weight percent of the second organic compound in the layer,
wherein the light-emitting layer comprises a phosphorescent material, and
wherein the light-emitting layer emits light when a voltage is applied such that a potential of the first electrode is higher than a potential of the second electrode.

12. The lighting device according to claim 11, wherein the second organic compound comprises a phosphorescent material.

13. The lighting device according to claim 11, wherein a lowest unoccupied molecular orbital level of the second organic compound is lower than a lowest unoccupied molecular orbital level of the first organic compound by 0.3 eV or more.

14. The lighting device according to claim 11, wherein a thickness of the layer is 5 nm to 20 nm.

15. The lighting device according to claim 11, wherein a concentration of the second organic compound is in a range of 0.1 wt % to 5 wt % or in a range of 0.1 mol % to 5 mol %.

16. A lighting device comprising:
an anode;
a cathode;
a light-emitting layer formed between the anode and the cathode; and
a layer formed between the light-emitting layer and the cathode, the layer controlling a movement of carriers,
wherein the layer contains a first organic compound and a second organic compound,
wherein the first organic compound comprises an electron transporting property;
wherein the second organic compound comprises an electron trapping property,
wherein a weight percent of the first organic compound is higher than a weight percent of the second organic compound in the layer, and
wherein the light-emitting layer comprises a phosphorescent material.

17. The lighting device according to claim 16, wherein the second organic compound comprises a phosphorescent material.

18. The lighting device according to claim 16, wherein a lowest unoccupied molecular orbital level of the second organic compound is lower than a lowest unoccupied molecular orbital level of the first organic compound by 0.3 eV or more.

19. The lighting device according to claim 16, wherein a thickness of the layer is 5 nm to 20 nm.

20. The lighting device according to claim 16, wherein a concentration of the second organic compound is in a range of 0.1 wt % to 5 wt % or in a range of 0.1 mol % to 5 mol %.

* * * * *

UNITED STATES PATENT AND TRADEMARK OFFICE
CERTIFICATE OF CORRECTION

PATENT NO. : 8,471,465 B2
APPLICATION NO. : 13/438517
DATED : June 25, 2013
INVENTOR(S) : Suzuki et al.

It is certified that error appears in the above-identified patent and that said Letters Patent is hereby corrected as shown below:

In the Specification:

Column 4, line 32; Change "BRIEF DESCRIPTION OF ME DRAWINGS" to --BRIEF DESCRIPTION OF THE DRAWINGS--.
Column 6, line 65; Change "or bow many" to --or how many--.
Column 14, line 15; Change "iridium(II)" to --iridium(III)--.
Column 26, line 60; Change "iridium(I)" to --iridium(III)--.
Column 42, line 44; Change "of nm by" to --of 10 nm by--.
Column 42, lines 55-56; Change "aluminum(II)" to --aluminum(III)--.
Column 43, line 54; Change "of nm by" to --of 10 nm by--.
Column 44, line 66; Change "of nm by" to --of 10 nm by--.
Column 46, line 17; Change "of nm by" to --of 10 nm by--.
Column 46, line 49; Change "5000 cd/m; the" to --5000 cd/m$^2$; the--.
Column 49, line 54; Change "of nm by" to --of 10 nm by--.
Column 53, line 56; Change "of nm by" to --of 10 nm by--.
Column 57, lines 32-33; Change "and (abbreviation:" to --and 4,4'-bis(N-{4-[N'-(3-methylphenyl)-N'-phenylamino]phenyl}-N-phenylamino)biphenyl (abbreviation:--.

In the Claims:

Column 59, line 64, Claim 9; Change "to 20 mm." to --to 20 nm.--.

Signed and Sealed this
Twenty-fourth Day of September, 2013

Teresa Stanek Rea
*Deputy Director of the United States Patent and Trademark Office*